United States Patent [19]

Nakagawa et al.

[11] Patent Number: 5,446,767
[45] Date of Patent: Aug. 29, 1995

[54] FREQUENCY SYNTHESIZER

[75] Inventors: Jun'ichi Nakagawa, Tokorozawa; Masaru Kokubo, Hachioji; Michiaki Kurosawa, Nakaminato, all of Japan

[73] Assignee: Hitachi, Ltd., Tokyo, Japan

[21] Appl. No.: 49,424

[22] Filed: Apr. 20, 1993

[30] Foreign Application Priority Data

| Apr. 23, 1992 | [JP] | Japan | 4-104786 |
| Aug. 25, 1992 | [JP] | Japan | 4-225618 |
| Sep. 21, 1992 | [JP] | Japan | 4-250907 |

[51] Int. Cl.$^6$ .......... H03D 3/24; H03K 5/13; H03L 7/00
[52] U.S. Cl. .......... 375/376; 455/165.1; 455/183.1; 455/260; 331/17; 331/18; 331/23; 331/25
[58] Field of Search .......... 375/120; 455/183.1, 455/260, 165.1; 328/14, 155; 331/17, 18, 23, 25

[56] References Cited

U.S. PATENT DOCUMENTS

| 3,909,743 | 9/1975 | Margala et al. | 331/25 |
| 3,973,209 | 8/1976 | Nossen et al. | 328/14 |
| 4,145,667 | 3/1979 | Messerschmitt | 331/16 |
| 4,184,068 | 1/1980 | Washburn | 235/92 |
| 4,352,204 | 9/1982 | Ohgishi et al. | 455/183.1 |
| 4,458,214 | 7/1984 | Lakomy | 331/1 A |
| 4,463,321 | 7/1984 | Horner | 331/25 |
| 4,466,127 | 8/1984 | Ohgishi et al. | 455/183.1 |
| 4,636,736 | 1/1987 | Woodworth et al. | 455/260 |
| 4,841,255 | 6/1989 | Ohba et al. | 331/25 |
| 5,038,120 | 8/1991 | Wheatley et al. | 331/25 |
| 5,079,521 | 1/1992 | Gaskell et al. | 331/25 |
| 5,302,908 | 4/1994 | Tarusawa et al. | 328/155 |

FOREIGN PATENT DOCUMENTS

0414392A2 2/1991 European Pat. Off.

OTHER PUBLICATIONS

"A New PLL Synthesizer For Fast FH Spread Spectrum Communication" Globecom, 1989.
IEEE Journal of Solid-State Circuits, vol. 24, No. 4, Aug. 1989.
IEEE Transaction of Acoustics, Speech, and Signal Processing, vol. 36, No. 12, Dec. 1988.
"Enhanced Digital Frequency Synthesizer and Its Analysis", H. Kikawa, et al, Dept. of Electrical Engineering, University of South Florida, pp. 628-631.

*Primary Examiner*—Edward L. Coles, Sr.
*Assistant Examiner*—Kimberly A. Williams
*Attorney, Agent, or Firm*—Antonelli, Terry, Stout & Kraus

[57] ABSTRACT

A frequency synthesizer which comprises a voltage controlled oscillator; a unit for outputting a value corresponding to a differential phase of a reference signal at a predetermined frequency as a first differential phase; a unit for sampling an oscillating signal corresponding to an output of the voltage controlled oscillator K times per period of a repeating frequency $f_r$ ($f_r$ is an arbitrary frequency) and for repetitively generating phase information of the oscillating signal in the form of saw-tooth-like wave; a unit for calculating the difference between adjacent phase information in phase information of the oscillating signal outputted as a saw-tooth-like wave, and for outputting this difference as a second differential phase; a comparator for calculating the difference between the first and second differential phases; a signal processing unit for integrating an output of the comparator; and a unit for converting an output of the signal processing unit to a voltage to control the voltage controlled oscillator.

97 Claims, 26 Drawing Sheets

FIG. 1 PRIOR ART
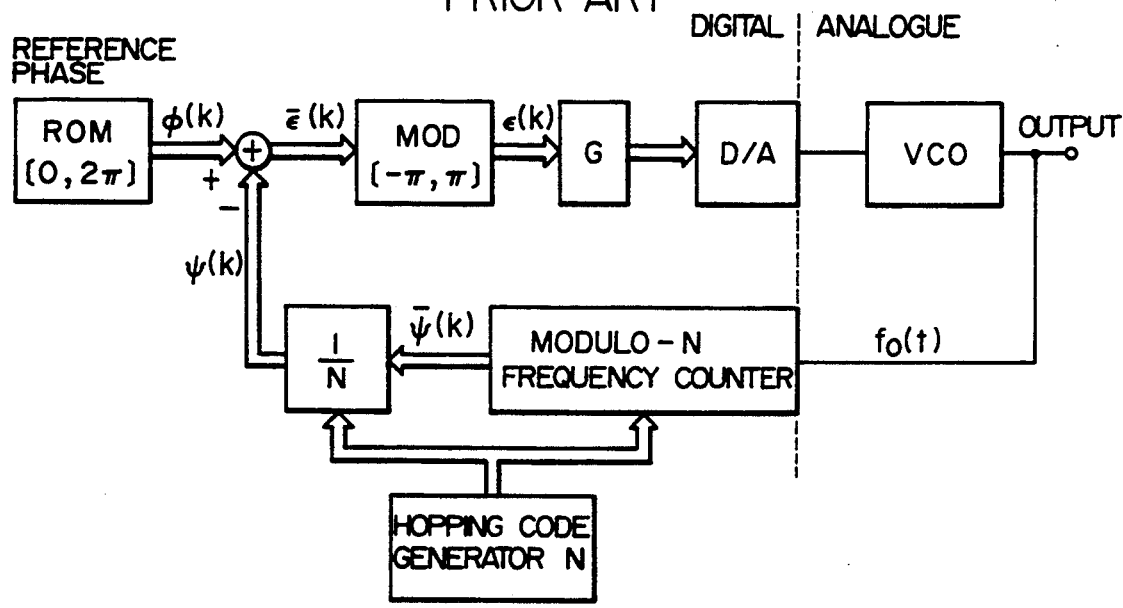
FIG. 2 PRIOR ART
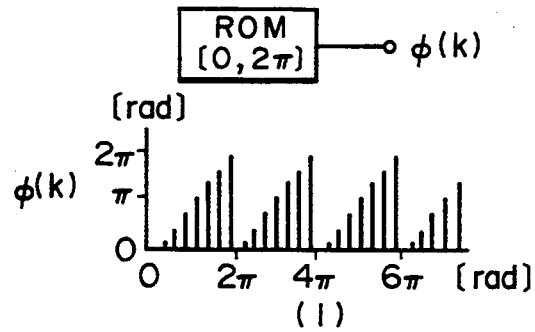
FIG. 3A PRIOR ART
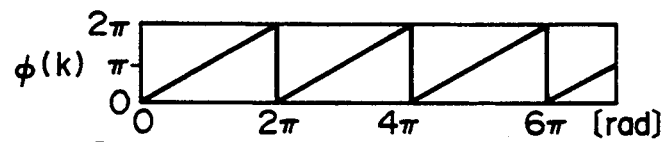
FIG. 3B PRIOR ART
FIG. 3C PRIOR ART
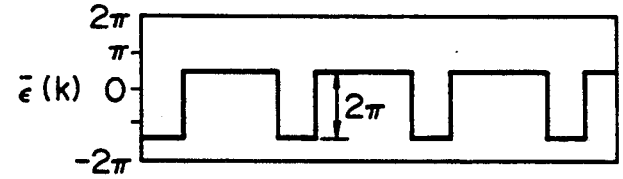
FIG. 3D PRIOR ART
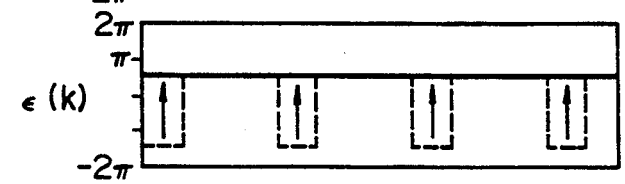

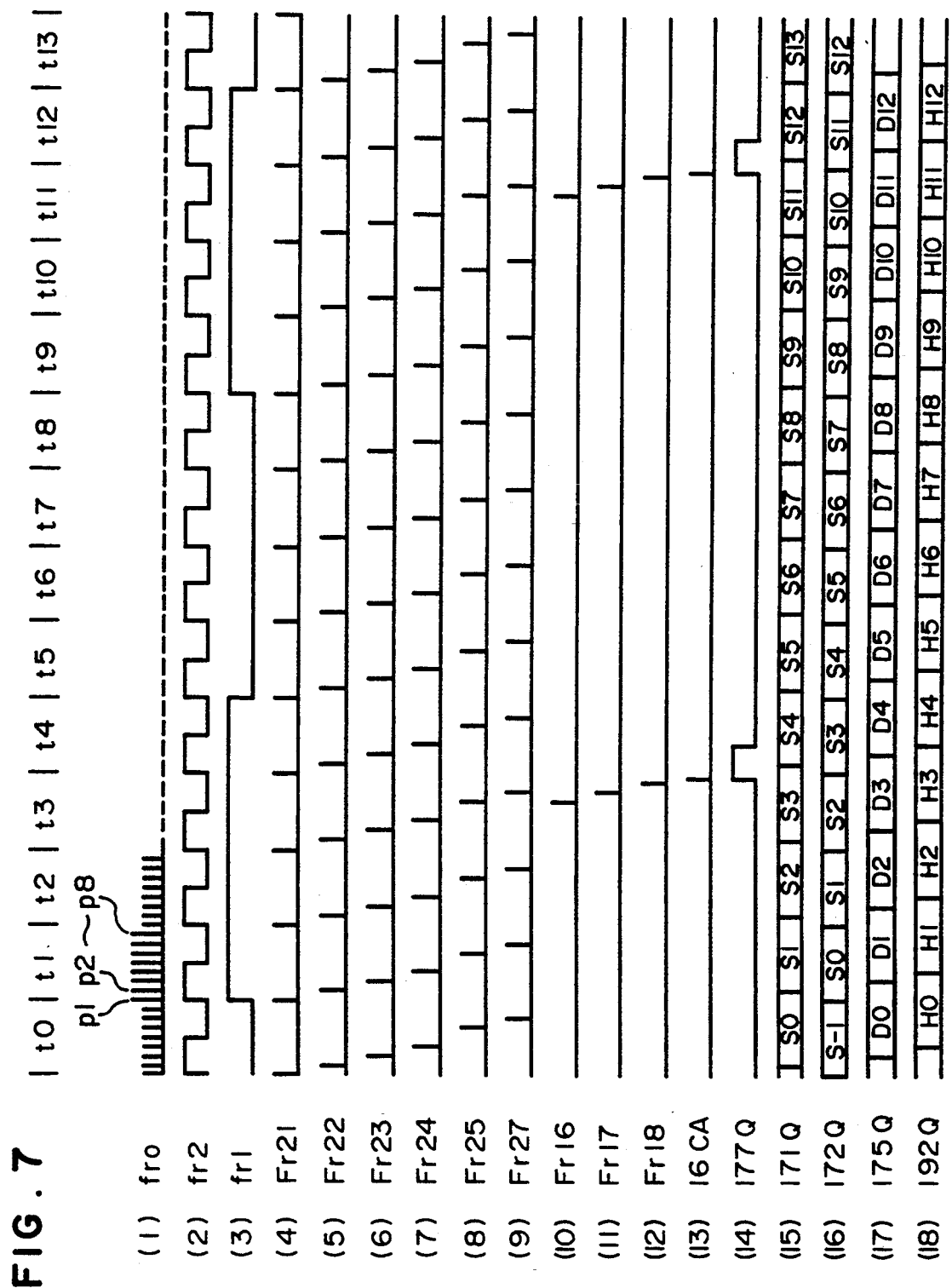

FIG. 16

| 19 | 18 | 17 | 16 | 15 | 14 | 13 | 12 | SELECTED FACTOR |
|----|----|----|----|----|----|----|----|-----------------|
| 0 | 0 | 0 | 0 | 1 | 1 | 1 | 1 |   |
| 0 | 0 | 0 | 0 | 1 | 1 | 1 | 0 |   |
| 0 | 0 | 0 | 0 | 1 | 1 | 0 | 1 | a |
| 0 | 0 | 0 | 0 | 1 | 1 | 0 | 0 |   |
| 0 | 0 | 0 | 0 | 1 | 0 | 1 | 1 |   |
| 0 | 0 | 0 | 0 | 1 | 0 | 1 | 0 |   |
| 0 | 0 | 0 | 0 | 1 | 0 | 0 | 1 |   |
| 0 | 0 | 0 | 0 | 1 | 0 | 0 | 0 | b |
| 0 | 0 | 0 | 0 | 0 | 1 | 1 | 1 |   |
| 0 | 0 | 0 | 0 | 0 | 1 | 1 | 0 |   |
| 0 | 0 | 0 | 0 | 0 | 1 | 0 | 1 |   |
| 0 | 0 | 0 | 0 | 0 | 1 | 0 | 0 |   |
| 0 | 0 | 0 | 0 | 0 | 0 | 1 | 1 |   |
| 0 | 0 | 0 | 0 | 0 | 0 | 1 | 0 |   |
| 0 | 0 | 0 | 0 | 0 | 0 | 0 | 1 |   |
| 0 | 0 | 0 | 0 | 0 | 0 | 0 | 0 |   |
| 1 | 1 | 1 | 1 | 1 | 1 | 1 | 1 | c |
| 1 | 1 | 1 | 1 | 1 | 1 | 1 | 0 |   |
| 1 | 1 | 1 | 1 | 1 | 1 | 0 | 1 |   |
| 1 | 1 | 1 | 1 | 1 | 1 | 0 | 0 |   |
| 1 | 1 | 1 | 1 | 1 | 0 | 1 | 1 |   |
| 1 | 1 | 1 | 1 | 1 | 0 | 1 | 0 |   |
| 1 | 1 | 1 | 1 | 1 | 0 | 0 | 1 |   |
| 1 | 1 | 1 | 1 | 1 | 0 | 0 | 0 |   |
| 1 | 1 | 1 | 1 | 0 | 1 | 1 | 1 |   |
| 1 | 1 | 1 | 1 | 0 | 1 | 1 | 0 | b |
| 1 | 1 | 1 | 1 | 0 | 1 | 0 | 1 |   |
| 1 | 1 | 1 | 1 | 0 | 1 | 0 | 0 |   |
| 1 | 1 | 1 | 1 | 0 | 0 | 1 | 1 |   |
| 1 | 1 | 1 | 1 | 0 | 0 | 1 | 0 | a |
| 1 | 1 | 1 | 1 | 0 | 0 | 0 | 1 |   |
| 1 | 1 | 1 | 1 | 0 | 0 | 0 | 0 |   |

INPUT TO COMPARATOR (UPPER 8 BITS)

FREQUENCY SYNTHESIZER

BACKGROUND OF THE INVENTION

This invention relates to a frequency synthesizer employing a phase locked loop and an apparatus using the same. Particularly, the invention relates to the configuration of a frequency synthesizer suitable for use in mobile communication equipment which requires high speed switching of communication frequencies.

A variety of frequency synthesizers have been known (refer to V. Manassewitch, "Frequency Synthesizers Theory and Design", pp. 1-39, John Wiley & Sons, New York, 1976), and a configuration employing a phase locked loop has particularly been used with the development of integrated circuits. In mobile communication equipment having a number of communication channels, a voltage controlled oscillator (hereinafter called the "VCO"), a variable dividing counter and a crystal oscillator are used to configure a phase looked loop for selecting a dividing number of the variable dividing counter to generate a necessary communication channel frequency. A signal produced by dividing an output signal from the VCO by the selected dividing number of the variable dividing counter is compared with a reference signal produced by an output signal of the crystal oscillator in phase by a phase comparator, and the comparison result represented by an analog value is integrated by a filter and then applied to a frequency control terminal of the VCO. Since this result of the phase comparator includes harmonic components and, the integration time constant of the filter must be large in order to remove such components. As a result, the capacitance value of a capacitor constituting the filter becomes relatively large. For this reason, if the dividing number of the variable dividing counter is to be changed to switch the communication channel frequency, recharging and discharging of the capacitor requires a long period of time, which incurs a problem that rapid switching of the frequency is hindered.

Considering the fact that the above-stated problem occurs when the phase comparator output is generated in analog form, a configuration of a frequency synthesizer for solving this problem is proposed in "A New PLL Synthesizer for Fast FH Spread Spectrum Communications", by Akihiro and Nakagawa, Globecom, 1989. FIG. 1 shows the circuit configuration, and FIGS. 2A, 3A–3D show the operation principle.

A frequency synthesizer configured as proposed in the above document is called the "numerical phase-comparating and continuous leveling frequency synthesizer system" for convenience. This prior art performs a phase comparison itself by numerical operations and removes harmonic components included in the comparison result by a simple operation to render a filter unnecessary, thus reducing the time necessary to switch the frequency. This frequency synthesizer increases phase information on a reference signal having a period T by $2\pi/K$ every period given by T/K (K is an integer) as shown in FIG. 2, and supplies a phase comparator with this phase information as a saw-tooth like waveform (FIG. 3A) for resetting the phase comparator every period T. An output signal from the VCO in turn is divided by a modulo N counter having an integer dividing number N, the contents of which are normalized by $2\pi/N$ and then supplied to the phase comparator as phase information every period T/K (FIG. 3B). The two phase information signals supplied to the phase comparator are numerically subtracted and output from the phase comparator. In this event, even with the frequencies of two signals input to the phase comparator being coincident with each other, if the initial phases of both the phase information signals are not coincident, a phase jump of $2\pi$ occurs in the output of the phase comparator (FIG. 3C). In a phase compensator, one side of the phase jump is shifted by $2\pi$ to make the phase comparison value constant (FIG. 3D). In this continuous leveling processing, the output E of the phase comparator is subjected to the following mathematical operation to derive a continuous level phase error E':

$$E' = mod\{(E+3\pi), 2\pi\} - \pi$$

where mod{A, B} represents a remainder when A is divided by B. This continuous level phase comparison value is converted to an analog value by a digital-to-analog (D/A) convertor and thereafter applied to a frequency control terminal of the VCO. In this event, assuming that a reference signal frequency is at $f_r1$, an oscillating frequency $f_v$ of the VCO is expressed by the following Equation 1:

$$f_v = (N/K) \cdot (K \cdot f_r1) \qquad \text{Equation 1}$$

It will be understood from the foregoing that since the phase comparison value is made constant, the filter is not necessary, which enables fast frequency switching. Also, as K becomes larger, i.e., as the sampling frequency $K \cdot f_r1$ is higher, higher frequency switching is possible.

The existing numerical phase-comparating and continuous leveling frequency synthesizer as described above has a first problem that a large circuit scale is required for the phase compensator which renders constant the output of the phase comparator as shown in FIG. 3D.

Also, in Equation 1 expressing the oscillating frequency of the numerical phase-comparating and continuous leveling frequency synthesizer, with N/K which is not an integer, if the contents of a modulo N counter is sampled at every period T/K, a phase error may be caused by truncating a fraction of N/K. This results in a second problem that a generated frequency does not completely coincide with a predetermined frequency. Assume, for example, that K is equal to eight; and N to 1002, where a constant A is employed instead of $2\pi$ and A is equal to 1000 for facilitating digital processing. In this case, a sampled value Ci (i=1–8) of the modulo N counter, a normalized phase value Vi derived by multiplying the sampled value Ci by a constant A/N for normalization, a reference phase value Ri and a phase error Hi are calculated as shown in Table 1.

TABLE 1

| | | 2π:1000, K = 8, N = 1002 | | | | | | | |
|---|---|---|---|---|---|---|---|---|---|
| | | Sampling Step | | | | | | | |
| Signals | | 1 | 2 | 3 | 4 | 5 | 6 | 7 | 8 |
| Counter output | Ci | 125 | 250 | 375 | 501 | 626 | 751 | 876 | 1002 |

TABLE 1-continued

| Signals | | \multicolumn{8}{c}{$2\pi$:1000, K = 8, N = 1002} |
|---|---|---|---|---|---|---|---|---|---|
| | | \multicolumn{8}{c}{Sampling Step} |
| | | 1 | 2 | 3 | 4 | 5 | 6 | 7 | 8 |
| Normalized Phase Value | Vi | 124.75 | 249.50 | 374.25 | 500.00 | 624.75 | 749.50 | 874.25 | 1000.0 |
| Ref. Phase Value | Ri | 125 | 250 | 375 | 500 | 625 | 750 | 875 | 1000 |
| Phase Error | Hi | −0.25 | −0.50 | −0.75 | 0.0 | −0.25 | −0.50 | −0.75 | 0.0 |

Here, a state arises, wherein the phase error Hi between the reference phase value Ri and the normalized phase value Vi does not become zero for each sampling, and an average phase error over one period of the phase error Hi does not either become zero. While in Table 1, the normalized phase value Vi and the phase error Hi are shown only up to the third decimal place for simplifying the table, the above state also arises even if these values are expressed in infinite word length. Thus, this type of frequency synthesizer has a problem that an accurate frequency cannot be generated unless N/K is an integer.

When a high frequency signal, which is an output of the VCO, is divided, a prescaler with a dividing number P may be inserted in front of a variable divider in order to decrease the frequency. However, since P is not generally equal to K in this case, the same problem as above arises in terms of the occurrence of a fraction.

Also, the existing numerical phase-comparator and continuous leveling frequency synthesizer employ a constant A instead of the phase $2\pi$ of one cycle for facilitating the digital processing and normalize the contents of the modulo N counter with A/N. On the other hand, N is changed to modify the frequency generated by the synthesizer. Therefore, A/N is generally not an integer. Even with the constant A set at a considerably large value, under the condition that N is changed one by one, a majority of the A/N values are not integers. This causes an error in normalized phase information of the counter, thereby incurring a third problem that an accurate frequency cannot be generated.

SUMMARY OF THE INVENTION

It is a first object of the present invention to provide a frequency synthesizer which does not require a phase compensator for continuously leveling a phase jump of $2\pi$, which would appear in the output of the phase comparator, and accordingly is capable of reducing the circuit scale thereof.

It is a second object of the present invention to provide a frequency synthesizer which is capable of generating an accurate frequency, even if N/K (K>1) is not an integer, and enabling fast frequency switching.

It is a third object of the present invention to provide a frequency synthesizer which is capable of removing normalization processing for phase information to prevent an error accompanied with the normalization as well as rapidly and accurately reaching stability.

It is another object of the present invention to enable fast frequency switching in a frequency synthesizer employing a variable divider which includes a prescaler, particularly a two-modulus prescaler.

It is a further object of the present invention to provide a frequency synthesizer, a majority or all of which can be implemented by a semiconductor integrated circuit.

It is a further object of the present invention to provide a frequency synthesizer which is capable of realizing a frequency switching time of 1 msec or less in mobile communication equipment even if its channel interval is about 10 kHz.

FIG. 4 shows the principle of the present invention.

The present invention employs, for example, a modulo N counter with a variable dividing number N as a means of generating a saw-tooth like signal having a saw-tooth waveform from an output signal of a VCO. As shown in FIG. 4, the present invention samples the contents of the modulo N counter which divides the output signal of the VCO at every period T/K, and uses the difference $\Delta\phi V$ between adjacent sampled values multiplied by K as differential phase information $\Delta Vi$ on a signal on the VCO side. Here, the difference $\Delta\phi V$ between sampled values is assumed to be a substantial difference including a carry when the modulo N counter generates it. On the other hand, assuming a numerical control oscillator with a period T and an accumulating number which is increased by the dividing number N at every period T/K, the phase of this oscillator is used as phase information $\phi r$ of a reference signal. Therefore, reference differential phase information $\Delta Ri$ is a constant value, i.e., the dividing number N. The frequency of the VCO is controlled by phase error information derived by infinitely integrating the difference $\Delta Hi$ between the reference differential phase $\Delta Ri$ and the differential phase $\Delta Vi$ on the VCO side. In this manner, the present invention compares differential phase information of two signals, so that it is called the "differential phase-comparating frequency synthesizer" for convenience.

The objects of the present invention may also be achieved, when employing a prescaler, by a solving means similar to that described above, which will be shown by embodiments later referred to.

As is well known, although phase information has periodicity, differential phase information derived by differentiating the same, i.e., frequency information, does not present such periodicity. Therefore, in a method of calculating the difference between the reference differential phase and the differential phase on the VCO side as the present invention, a phase error jump (FIG. 3C) will not occur, as may occur in the conventional numerical phase-comparing and continuous leveling frequency synthesizer. It will be understood that a phase error continuous leveling circuit is not required, and accordingly the circuit scale of the frequency synthesizer according to the present invention is smaller than the conventional numerical phase-comparing and continuous leveling frequency synthesizer. The first problem is thus solved.

Integration of the differential phase difference represents a phase error which occurs in a phase locked loop, where a phase error over one period presents a constant value when the frequency on the reference signal side is equal to that on the VCO side. Synchronization of the phase locked loop with a phase error being fixed in this manner is a feature of a rapidly settleable first-order phase locked loop. Therefore, when the dividing number N is changed to switch the frequency to a new value, it is not necessary to reduce the initial phase difference to zero, so that a new phase synchronized state is rapidly established.

Since the variable dividing number N is employed as reference differential phase information, normalization processing is not necessary, whereby the foregoing third problem will not arise.

An action against the second problem will be explained next. Since N/K is not an integer, if truncation occurs in a first sampled difference value ($\Delta\phi V$) which is the differential phase on the VCO side, an error caused by the truncation is distributed to second and subsequent sampled difference values as a raising error, whereby no error is present in an average of the sampled difference values over the whole period T. In other words, if a positive error occurs in the difference between the reference differential phase N and the first sampled difference value, a negative error occurs in the difference between the reference differential phase N and the second and subsequent sampled difference values. If these errors are integrated over one period, the result is zero. Stated another way, zero phase error over one period means that the frequency on the reference signal side is equal to that on the VCO side, which leads to allowing an accurate frequency to be generated. The foregoing will be explained with specific numerical examples. Assuming that $K=8$ and $N=1002$, a counter sampled value $C_i$ ($i=1-8$), an increase $D_i$ of the sampled value, a differential phase value $\Delta V_i$ derived by multiplying the increase by a factor of K, and a reference differential phase value $\Delta R_i$ are calculated as shown in Table 2. For a phase error occurring when integrating the differential phase error $\Delta H_i$ representing the difference between both the differential phase values for an arbitrary one period, eight different kinds of integration sections may be defined. However, Table 2 shows only four examples of the integration sections. As will be understood from the table, each phase difference becomes zero at least once in each period.

BRIEF DESCRIPTION OF THE DRAWINGS

FIG. 1 is a block diagram showing the configuration of a conventional frequency synthesizer;

FIGS. 2 and 3A-3D show operation waveforms at respective locations in FIG. 1;

FIG. 7 shows operation waveforms at respective locations in FIGS. 6A and 6B;

FIG. 16 is a truth table of a comparator shown in FIG. 15;

TABLE 2

| | | \multicolumn{8}{c}{$2\pi$:1000, K = 8, N = 1002} |
|---|---|---|---|---|---|---|---|---|---|
| | | \multicolumn{8}{c}{Sampling Step} |
| Signals | | 1 | 2 | 3 | 4 | 5 | 6 | 7 | 8 |
| Counter Output | $C_i$ | 125 | 250 | 375 | 501 | 626 | 751 | 876 | 1002 |
| Increase of Sampling | $D_i$ | 125 | 125 | 125 | 126 | 125 | 125 | 125 | 125 |
| Differential Phase Value | $\Delta V_i$ | 1000 | 1000 | 1000 | 1008 | 1000 | 1000 | 1000 | 1008 |
| Ref. Differential Phase | $\Delta R_i$ | 1002 | 1002 | 1002 | 1002 | 1002 | 1002 | 1002 | 1002 |
| Differential Phase Error | $\Delta H_i$ | −2 | −2 | −2 | +6 | −2 | −2 | −2 | +6 |
| Phase Error | $H_{i1}$ | 0 | −2 | −4 | +2 | 0 | −2 | −4 | +2 |
| Phase Error | $H_{i2}$ | +2 | 0 | −2 | +4 | +2 | 0 | −2 | +4 |
| Phase Error | $H_{i3}$ | +4 | +2 | 0 | +6 | +4 | +2 | 0 | +6 |
| Phase Error | $H_{i4}$ | −2 | −4 | −6 | 0 | −2 | −4 | −6 | 0 |

According to the phase locked loop configuring method of the present invention which compares differential phases of two signals, a phase jump of $2\pi$ is eliminated, which would otherwise occur in a phase error signal when directly comparing the phases of the two signals, thus reducing the circuit scale. Also, a quantization error caused by asynchronous sampling is not accumulated by employing the differential phase, and accordingly an average value of a phase error over one period becomes zero, thereby making it possible to realize a frequency synthesizer which generates an accurate and stable frequency.

Figure 12:
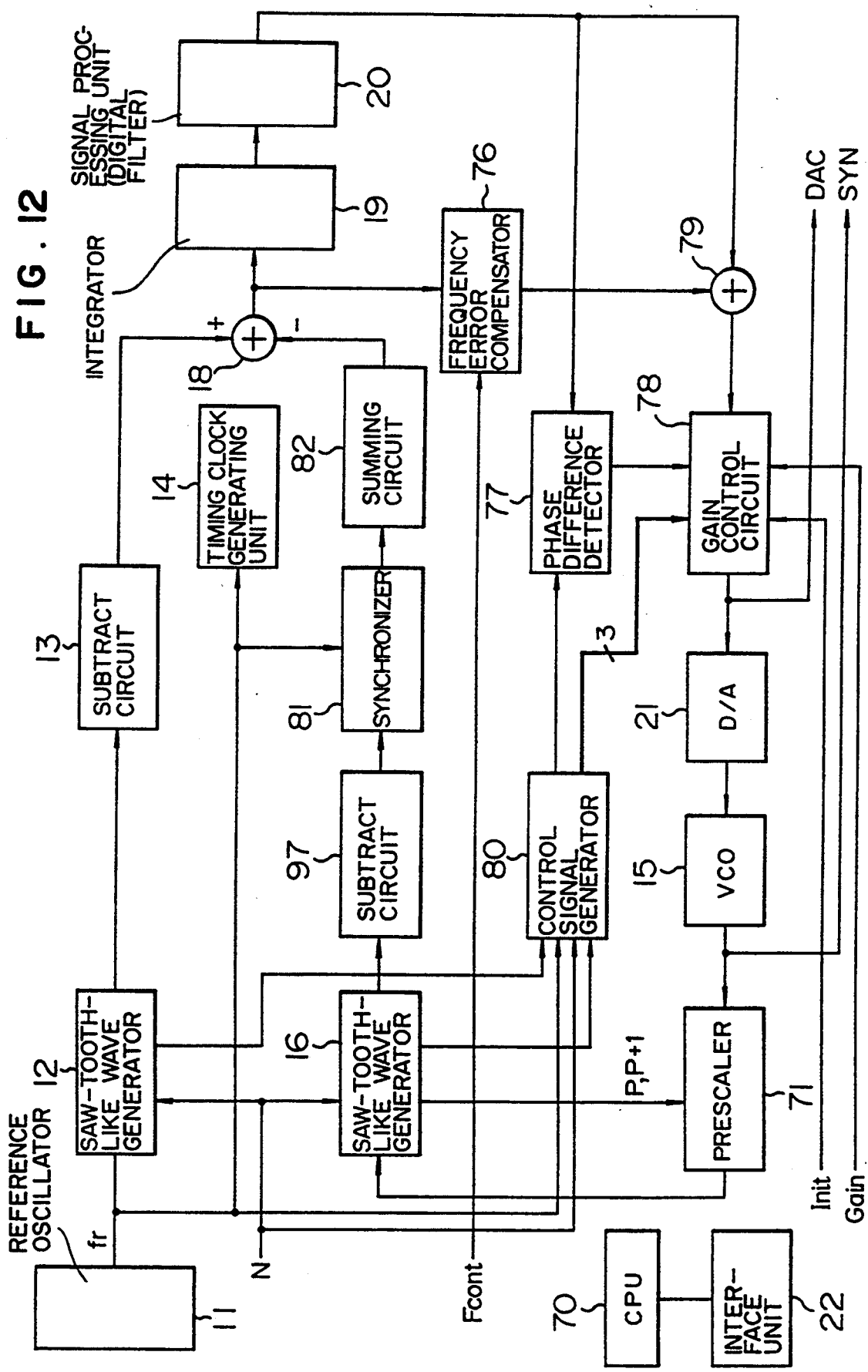
FIG. 12 is a block diagram showing a further embodiment of the present invention.
Figure 18:
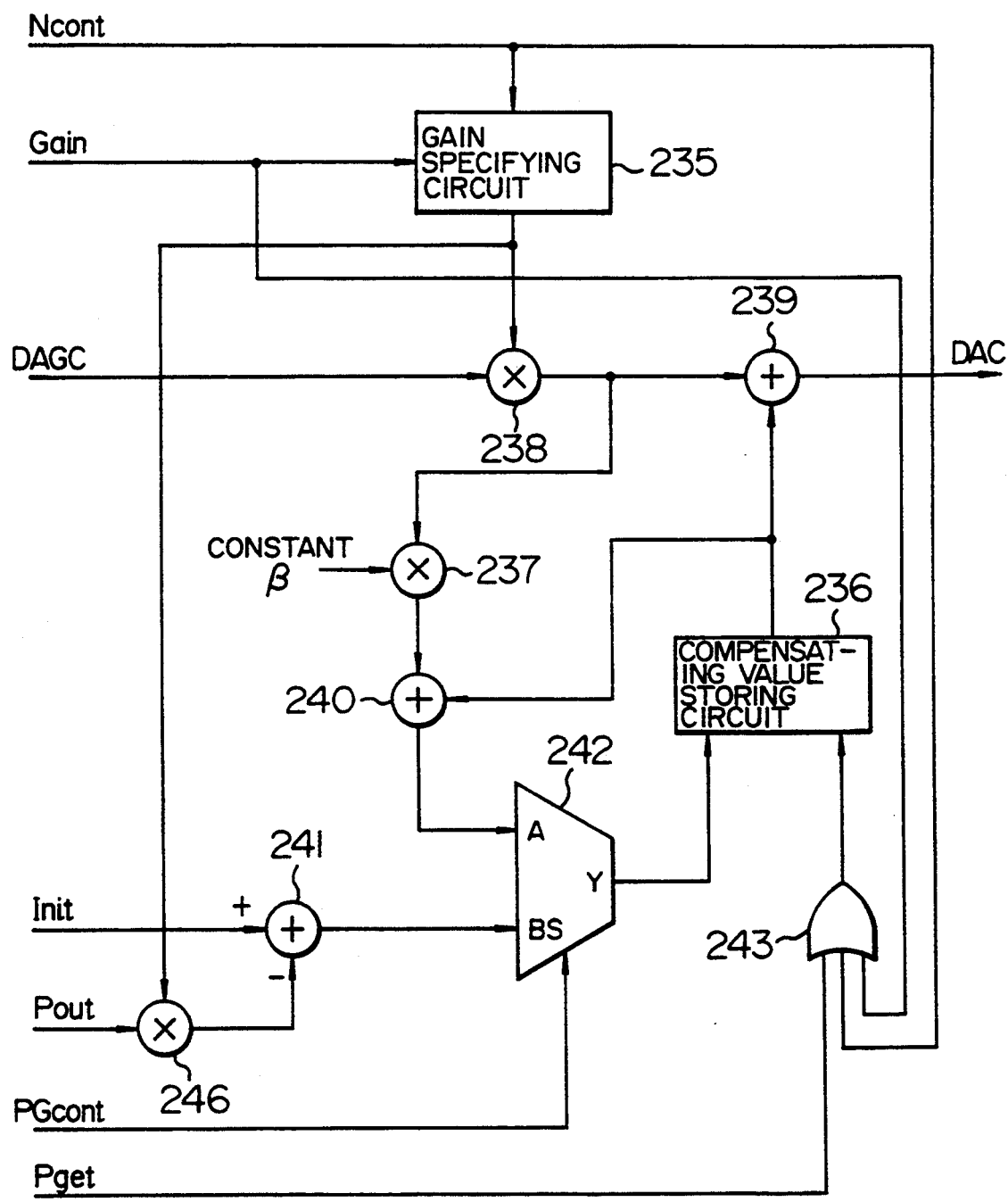
Figure 19:
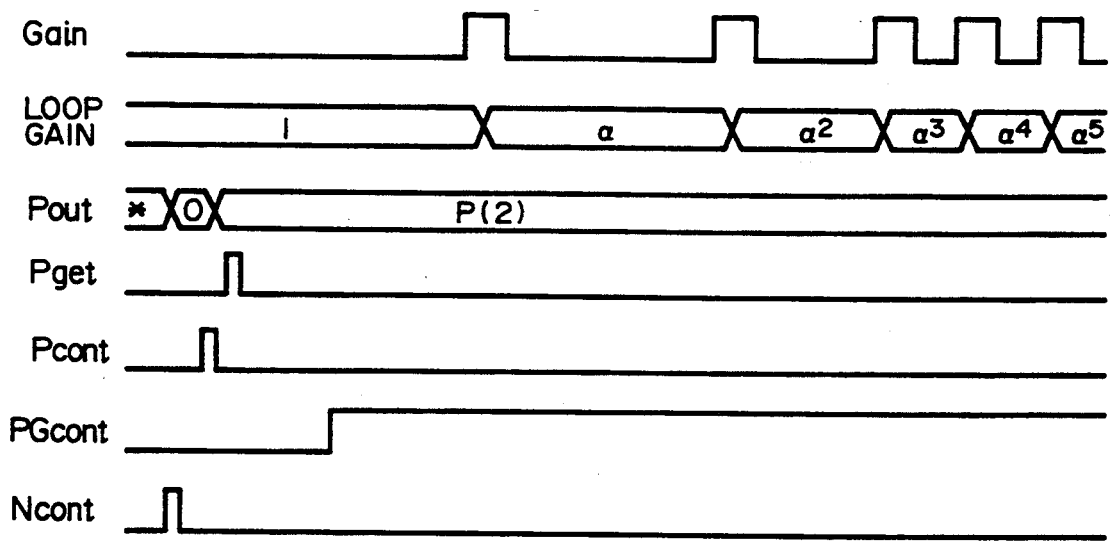
Figure 20:
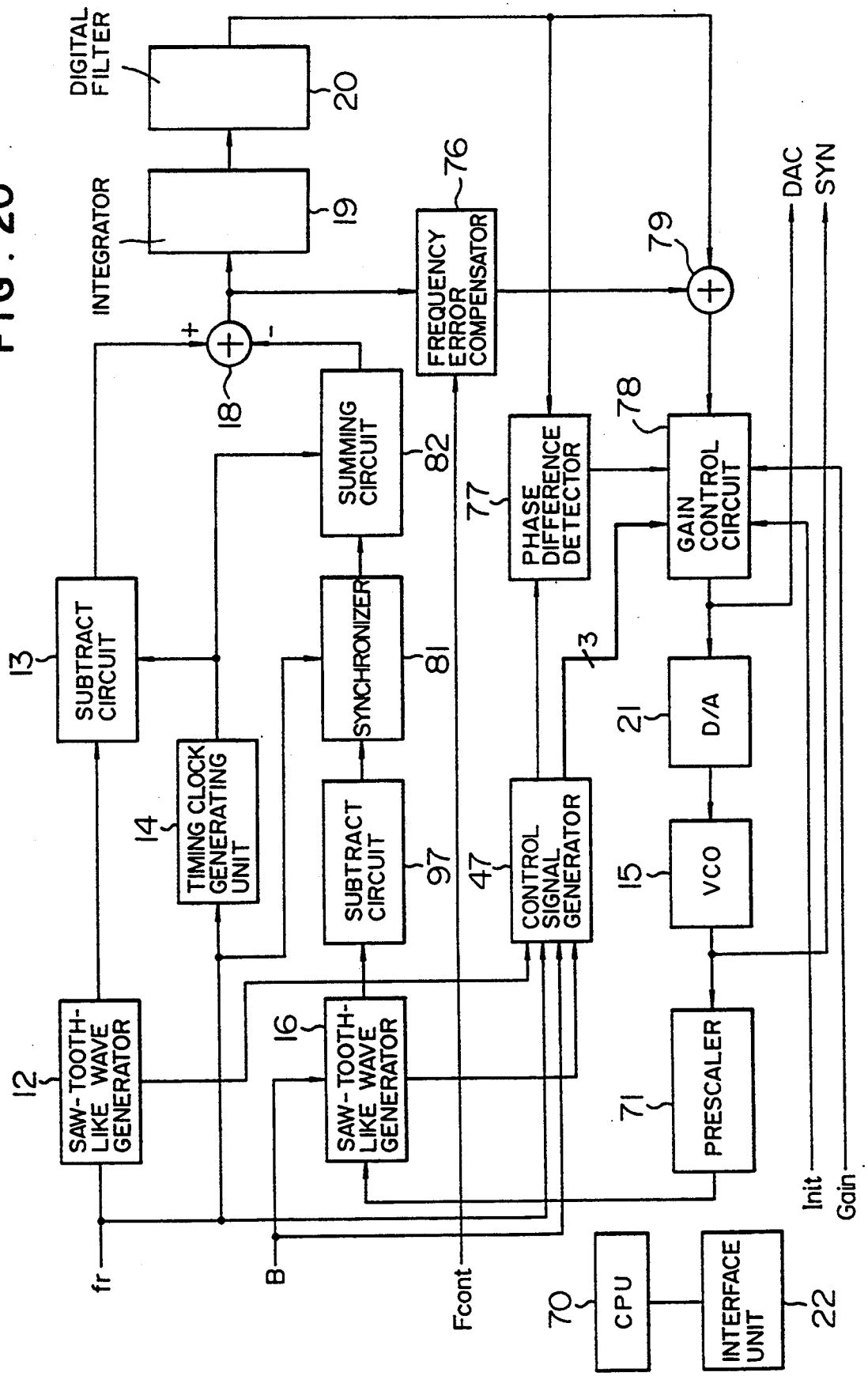
Figure 21:
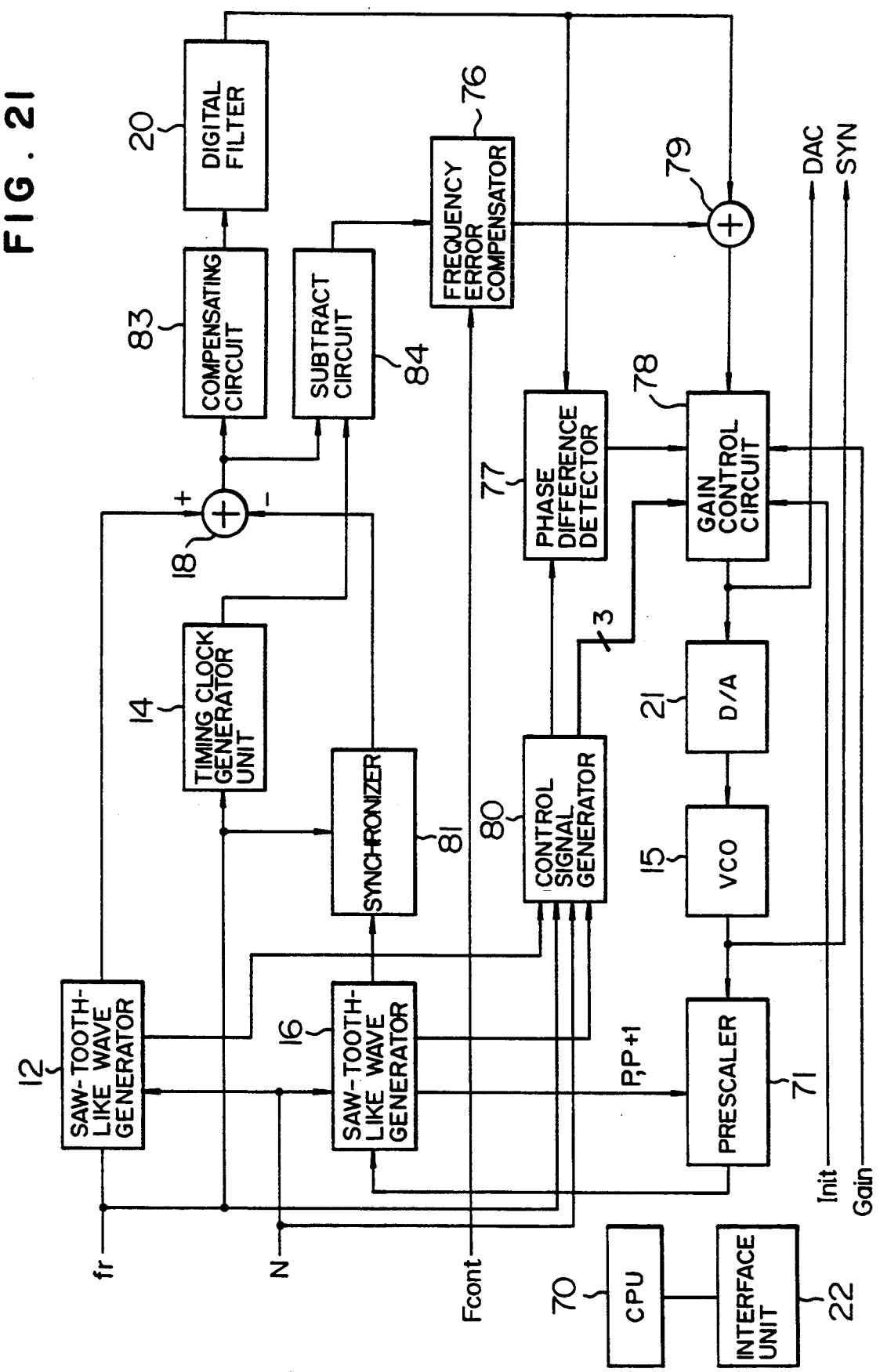
Figure 22:
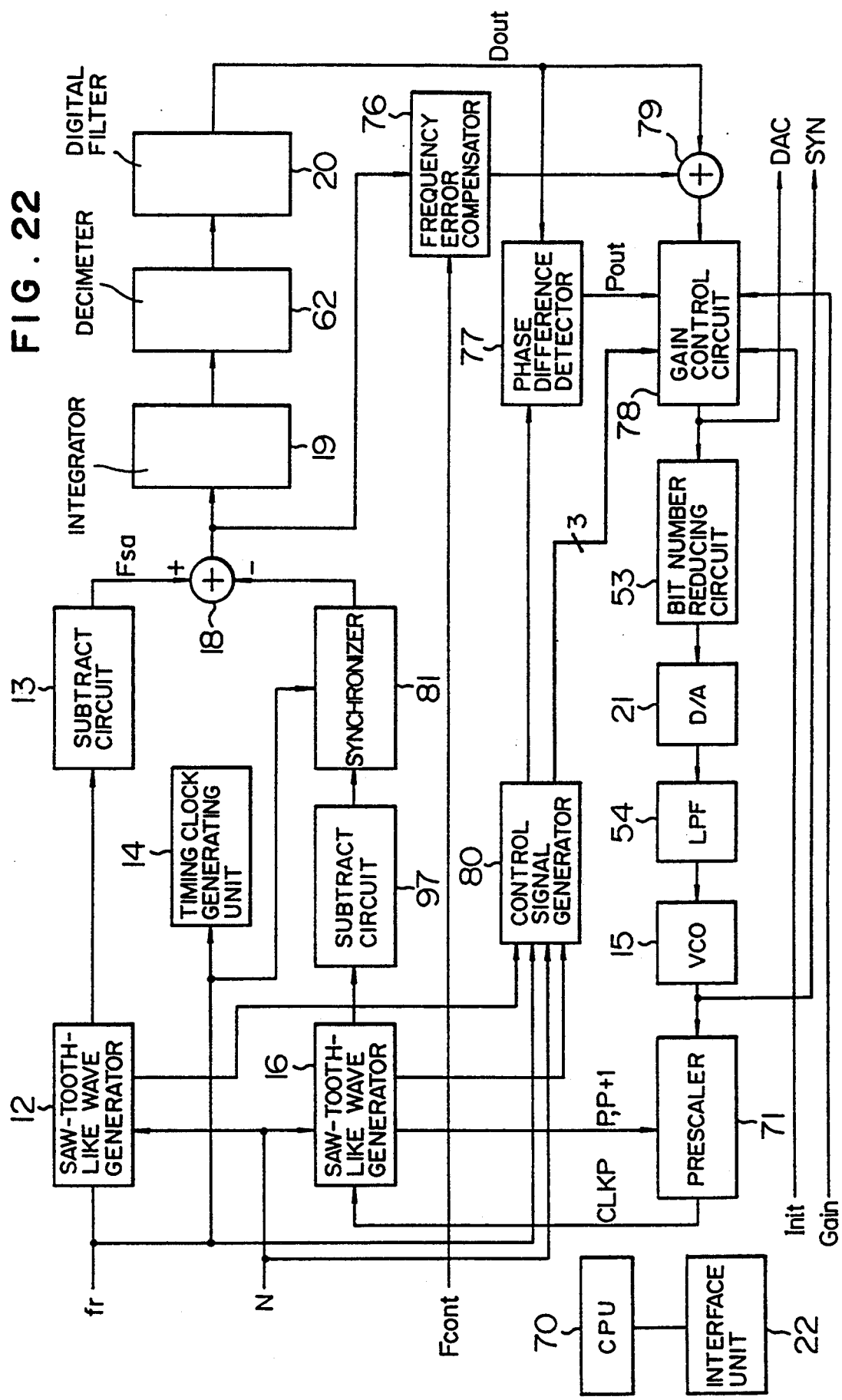
Figure 23:
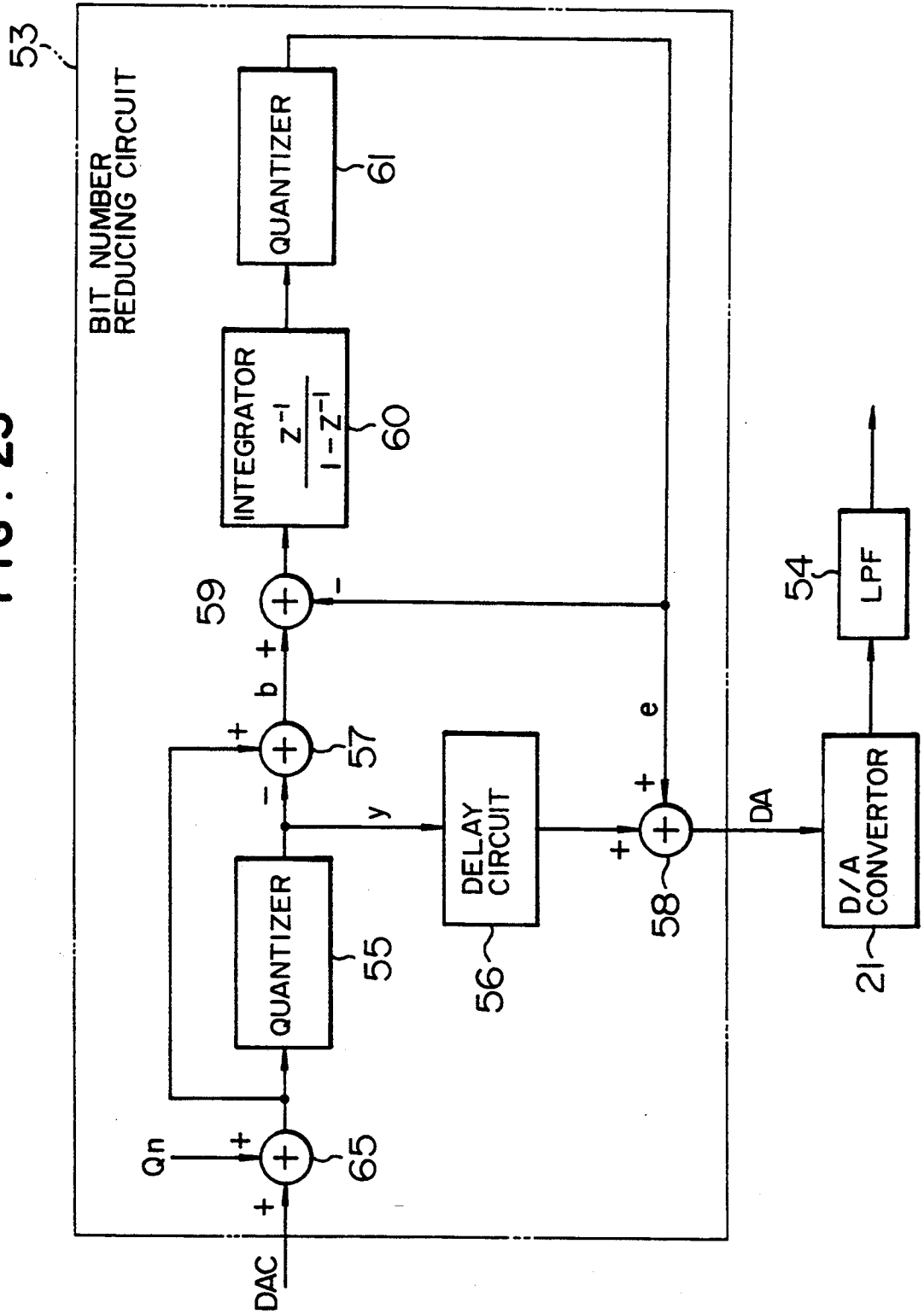
Figure 24:
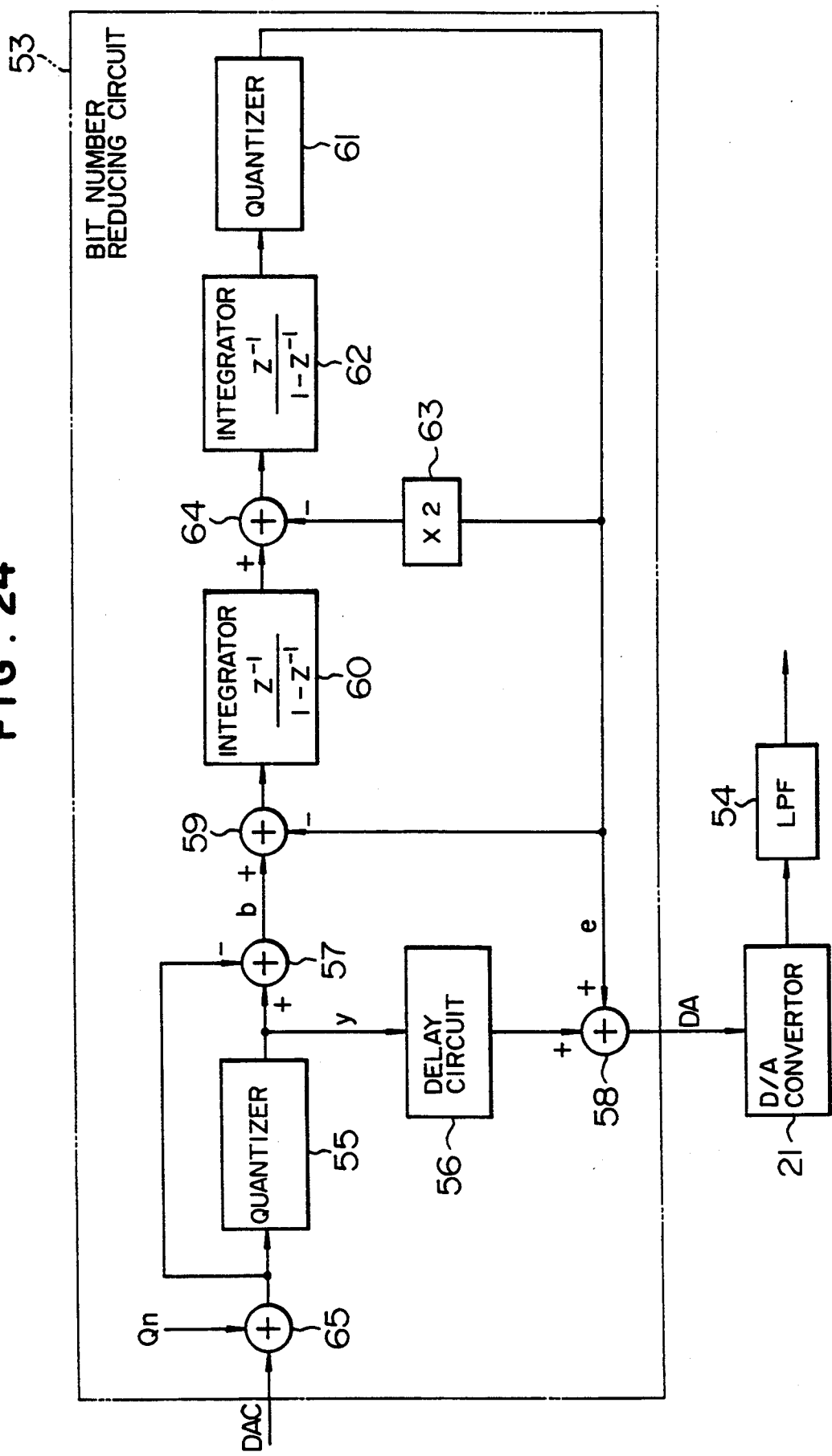
Figure 25:
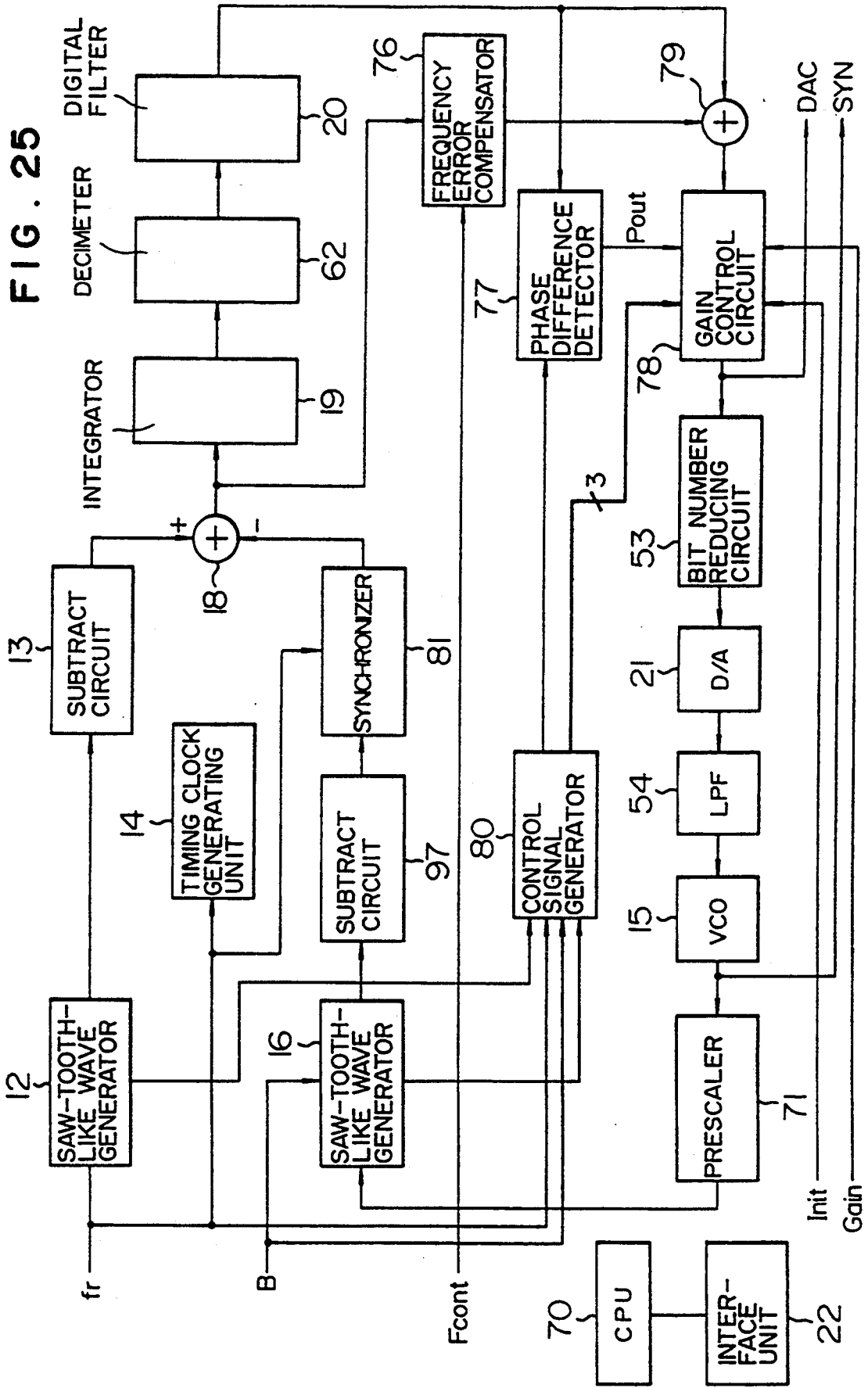
Figure 26:
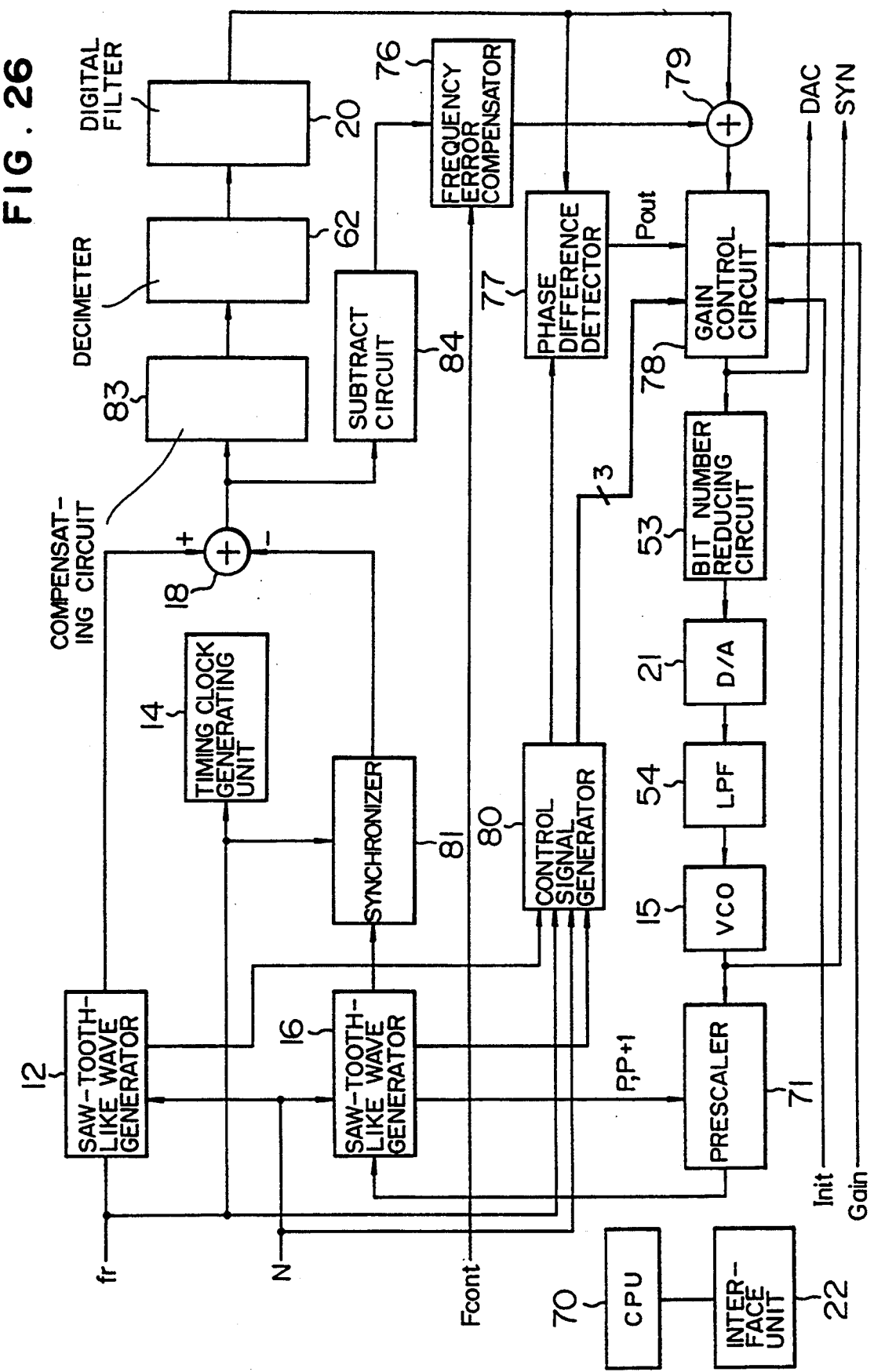
Figure 27:
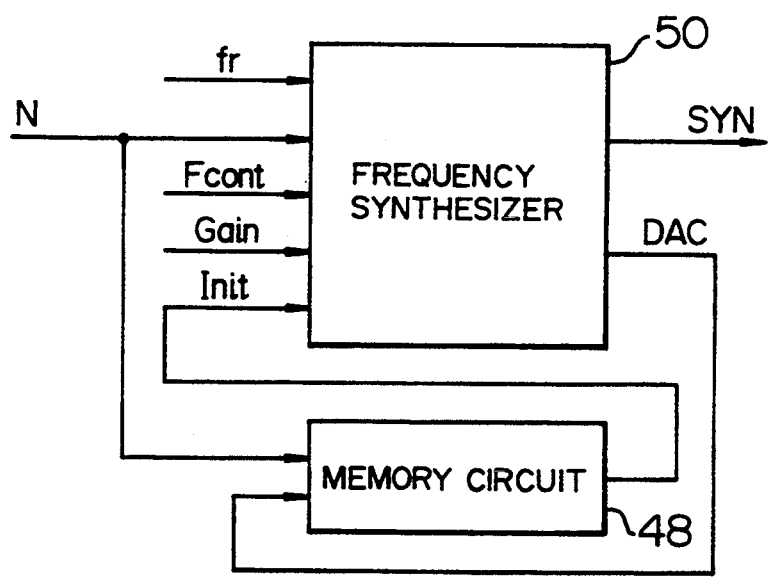
Figure 28:
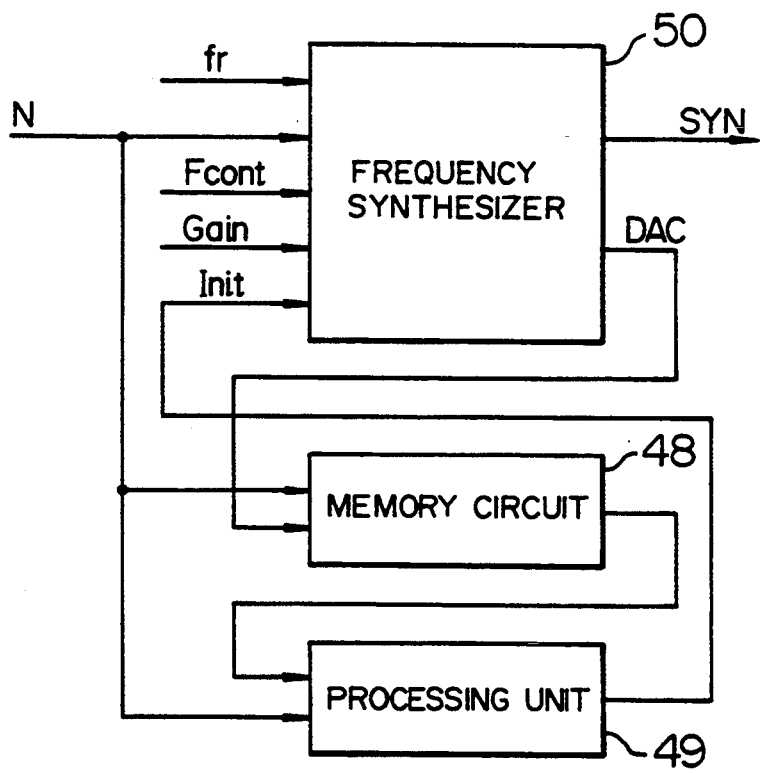

FIG. 18 is a block diagram showing a gain controller of FIG. 12;

FIG. 19 shows operation timing of signals on respective signal lines of the circuit shown in FIG. 18;

FIG. 20 is a block diagram showing an embodiment of the present invention which employs a prescaler having a constant dividing number;

FIG. 21 is a block diagram showing an embodiment in which the present invention is applied to a conventional frequency synthesizer;

FIG. 22 is a block diagram showing an embodiment of the present invention which employs a bit length reducing circuit;

FIG. 23 is a block diagram showing an embodiment of the bit length reducing circuit shown in FIG. 22;

FIG. 24 is a block diagram showing another embodiment of the bit length reducing circuit shown in FIG. 22;

FIG. 25 is a block diagram showing another embodiment of the present invention which employs a bit length reducing circuit;

FIG. 26 is a block diagram showing an embodiment in which a bit length reducing circuit is applied to a conventional frequency divider; and FIGS. 27 and 28 are block diagrams respectively showing an embodiment of an initial value setting type frequency synthesizer according to the present invention.

DESCRIPTION OF THE PREFERRED EMBODIMENTS

Figure 5:
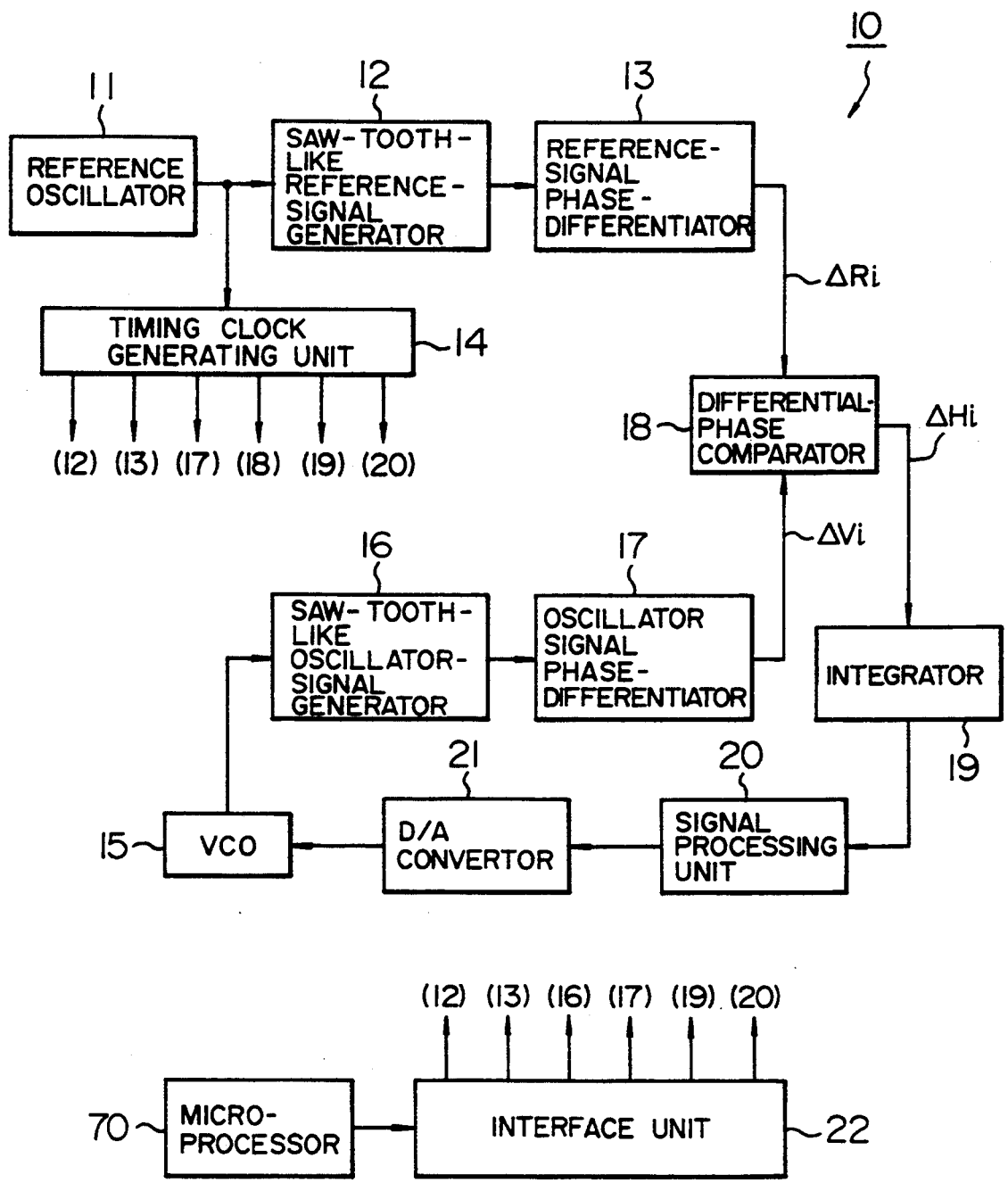
FIG. 5 is a block diagram showing the configuration of a frequency synthesizer according to the present invention.

FIG. 5 illustrates a block diagram of a differential phase frequency synthesizer which is an embodiment showing the basic principle of the present invention.

In FIG. 5, a differential phase frequency synthesizer 10 comprises a reference oscillator 11; a saw-tooth-like reference-signal generator 12; a reference-signal phase-differentiator 13; a timing clock generating unit 14; a VCO 15; a saw-tooth-like oscillator-signal generator 16; an oscillator-signal phase-differentiator 17; a differential-phase comparator 18; an integrator 19; a signal processing unit 20; a D/A convertor 21; and an interface unit 22.

The timing clock generating unit 14 generates a first clock having a frequency at $f_r1$ from an output signal of the reference oscillator 11; a second clock having a frequency at $f_r2$ ($=K \cdot f_r1$) which is K times the frequency $f_r1$ (K is a natural number); and a variety of timing clocks necessary for the operation of the respective constituents, and supplies the constituents 12, 13, 17, 18, 19 and 20 with necessary clock signals. The saw-tooth-like reference-signal generator 12 comprises a divider, a numerical control oscillator, or a combination of a divider and a numerical control oscillator, and generates a reference signal having a saw-tooth-like waveform at a repeating frequency of $f_r1$ from the output signal of the reference oscillator 11. The reference-signal phase-differentiator 13 generates differential phase information on the reference signal at the frequency $f_r2$.

The saw-tooth-like oscillator-signal generator 16 generates phase information on a saw-tooth-like waveform based on an oscillating signal which is the output to the VCO 15, while the oscillator-signal phase-differentiator 17 repetitively samples the phase information K times per period of the repeating frequency $f_r1$, calculates a difference value between two adjacent phase information values and outputs the same as differential phase information.

The differential-phase comparator 18 calculates a differential phase difference $\Delta Hi$ between reference differential-phase information $\Delta Ri$ and oscillator-signal differential phase information $\Delta Vi$. The integrator 19 integrates the differential phase difference $\Delta Hi$ to generate phase difference information on the reference signal and the saw-tooth-like signal. The signal processing unit 20, having a function of a digital filter, performs signal processing such as filtering of the phase differential information from the integrator 19, adding an initial value thereto, and so on. The D/A convertor 21 converts an output signal from the signal processing unit 20 to a voltage or current signal suitable for a frequency control of the VCO 15. The interface unit 22 receives, for example, the dividing number of the divider, the initial value and so on from a microprocessor 70 and delivers them to the respective constituents which require such information. The microprocessor 70 can instruct a number N for setting an oscillating frequency generated by the VCO 15, initial values, an oscillation step value for a numerical control oscillator of the saw-tooth-like reference signal generator 12, and so on through the interface unit 22.

In this embodiment, since the differential phase difference $\Delta Hi$ between the reference signal and the saw-tooth-like signal on the VCO side, i.e., frequency difference is calculated, and is then integrated to provide the phase difference information, the phase jump, which would otherwise occur when the phase difference between the reference signal and the saw-tooth-like signal is directly calculated, does not occur. In other words, the phase difference information provided by this embodiment is continuously leveled necessarily, so that rapid establishment of the phase locked loop can be achieved without the necessity of a continuous leveling circuit.

This embodiment uses a maximum value of the oscillating signal generated by the saw-tooth-like oscillator-signal generator 16 in one period T of the frequency $f_r1$ as reference differential phase information. Namely, this is equivalent to supposing a numerical control oscillator having a period T which is increased by the maximum value at the frequency $f_r2$, without configuring an actual circuit, and calculating a differential phase of an output signal of the supposed numerical control oscillator. In other words, if a numerical value as the reference differential phase information is set by an instruction from a CPU and input to the differential-phase comparator 18, the saw-tooth-like reference-signal generator 12 and the reference-differential phase-differentiator 13 are actually unnecessary, whereby the circuit configuration is simplified. Further, the normalization processing is also rendered unnecessary by using the difference between this reference differential phase information and the oscillator-signal differential phase information at the frequency $f_r2$ multiplied by a factor of K as the differential phase difference.

Figure 6A:
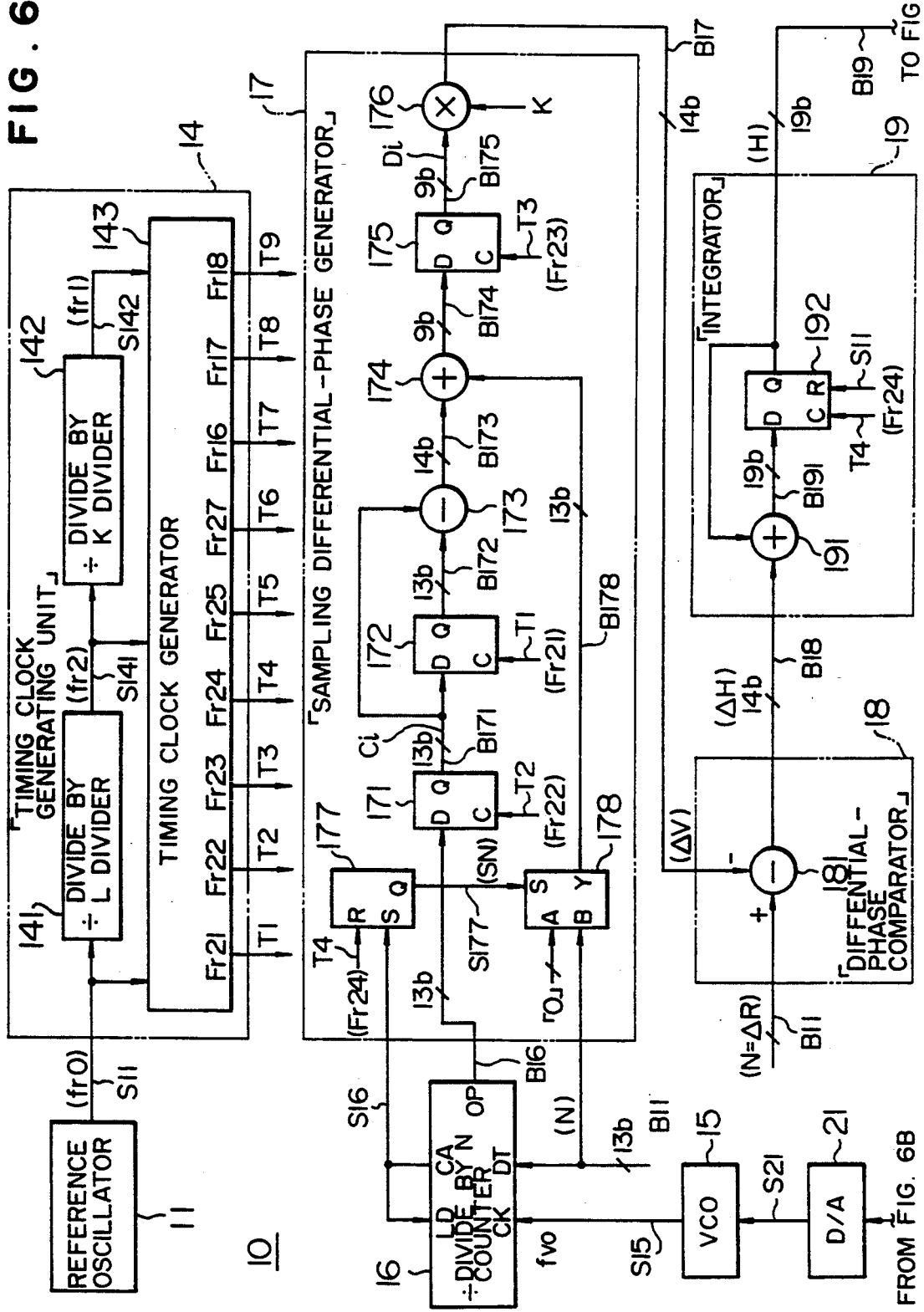
FIGS. 6A and 6B comprise a block diagram of an embodiment of the present invention.
Figure 6B:
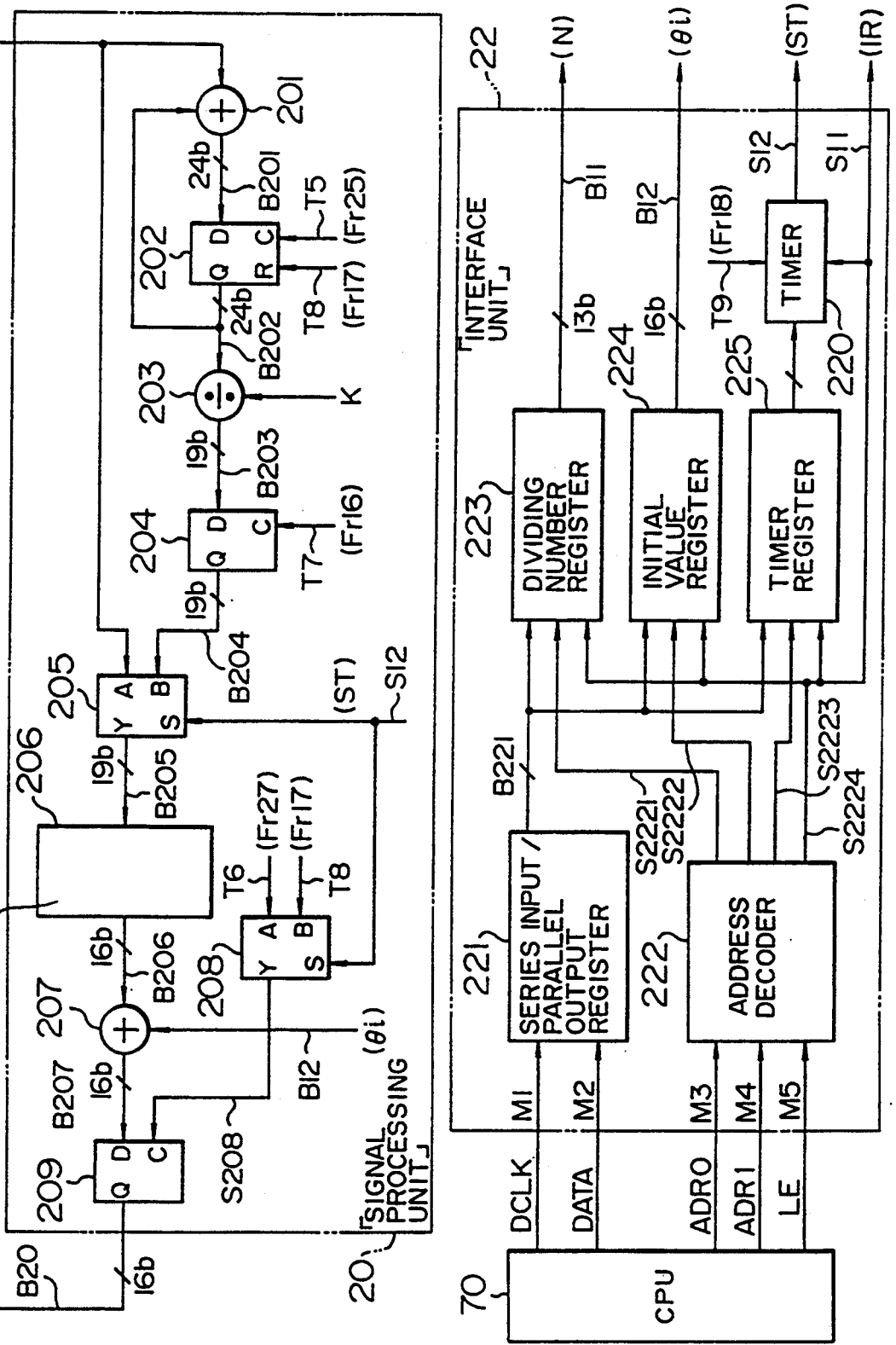

FIGS. 6A and 6B show a block diagram of a differential-phase comparating frequency synthesizer which presents a detailed embodiment of the present invention. Circuit blocks in FIGS. 6A and 6B having similar functions as those in FIG. 5 are designated by the same reference numerals. A differential-phase comparing frequency synthesizer 10 comprises a reference oscillator 11; a timing clock generating unit 14, a VCO 15; a modulo N counter 16 (corresponding to the saw-tooth-like oscillator-signal generator 16); a sampling and differential-phase generating circuit 17 (corresponding to the oscillator-signal phase-differentiator 17), a differential-phase comparator (subtractor) 18; an integrator 19; a signal processing unit (digital filter) 20; a D/A convertor 21; an interface unit 22; and a microprocessor 70.

In FIGS. 6A and 6B, the reference oscillator 11 is, for example, a crystal oscillator and outputs a clock signal at an oscillating frequency $f_r0$ onto a line S11. The timing clock generating circuit 14 comprises a divider 141 having a dividing number L; a divider 142 having a dividing number K; and a timing clock generator 143 for generating a variety of timing clocks. The timing clock generator 14 divides the output signal of the reference oscillator 11 by the dividing number L by means of the divider 141 to generate a second clock at the frequency $f_r2$, divides this second clock by the dividing number K by means of the divider 142 to generate a first clock at the frequency $F_r1$, and generates, from the three clocks respectively at frequencies $f_r0$, $f_r1$ and $f_r2$, a variety of clocks (T1–T9) required to operate other circuit blocks. Clocks fr21, Fr22, Fr23, Fr24, Fr25 and Fr27 having a frequency equal to the frequency $f_r2$, and clocks fr16, Fr17 and Fr18 having a frequency-equal to the frequency $f_r1$ are output from the clock generator 14 onto lines T1–T9, respectively. The timing relationship between these clocks will be described later with reference to FIG. 7.

The VCO 15 is a voltage controlled oscillator, the oscillating frequency of which is controlled by a voltage control signal, and outputs onto a line S15 a signal at an oscillating frequency fvo which is controlled by an output voltage of the D/A convertor 21. The modulo N counter 16 having a variable dividing number N (N is a natural number) counts the oscillating frequency of the VCO 15 and repeats a counting operation from 1 to N (or from N to 1). For changing the oscillating frequency of the VCO 15, the dividing number N may be changed. The dividing number N is specified by, for example, the microprocessor 70 through the interface unit 22, and set in the modulo N counter 16. The sampling and differential-phase generating circuit 17 samples the count contents of the modulo N counter 16 at every period expressed by $1/(K \cdot f_r1)$, calculates the difference between adjacent sampled values, multiplies the difference value by the dividing number K, and outputs the product onto a bus B17 as oscillator-signal differential-phase information $\Delta V$. It should be noted that when a carry is output from the modulo N counter 16, the sampled difference value is assumed to be calculated including the carry.

On the other hand, as reference differential-phase information $\Delta R$, the dividing number N itself is employed and set to an input terminal of the differential-phase comparator 18.

The sampling and differential-phase generating circuit 17, when sampling the contents of the modulo N counter 16 at every period expressed by $1/(mK \cdot f_r1)$, may calculate the difference between adjacent sampled values, multiply the difference value by a dividing number mK, and output the product as the oscillator-signal differential-phase information $\Delta V$ onto the bus B17.

The differential-phase comparator 18 subtracts the oscillator-signal differential-phase information $\Delta V$ from the reference differential-phase information $\Delta R$, and outputs the difference as differential-phase error $\Delta H$ onto a bus B18. The integrator 19 infinitely integrates the differential-phase error $\Delta H$ from the differential-phase comparator 18 and outputs a phase error signal H onto a bus B19. The signal processing unit 20 performs signal processing such as filtering for the phase error signal H to generate a phase error signal $\theta$, normalizes the signal $\theta$ by a predetermined value W within an input range of the subsequent D/A convertor 21, adds an initial value $\theta i$ to the normalized signal $\theta n$, and then outputs the addition value. The initial value $\theta i$ corresponds to the dividing number N and is specified by the microprocessor 70 through the interface unit 22. The value W used for the normalization processing is either a predetermined value in accordance with the number of input bits of the D/A convertor 21 or a value specified by the microprocessor 70. The D/A convertor 21 converts digital data output from the signal processing unit 20 to a corresponding analog value. Since the VCO 15 has its oscillating frequency controlled by a voltage control signal, the D/A convertor 21 converts output data from the signal processing unit 20 to an analog voltage which is applied to a frequency control terminal of the VCO 15. If a current controlled frequency variable oscillator is used in place of the VCO 15, an analog current may be output from the D/A convertor 21. The interface unit 22 informs the respective block portions constituting the phase locked loop of a dividing number, an initial value, the reference differential-phase information $\Delta R$, and so on, based on data and addresses specified by the microprocessor 70. The microprocessor 70 and the interface unit 22 may be adapted to this embodiment by configuring them using the prior art techniques. In this embodiment, the interface unit 22 receives the dividing number N, the initial value $\theta i$, the reference differential-phase information $\Delta R$, and a timer value T through five interface lines from the microprocessor 70 and supplies them to corresponding blocks. It should be noted that in FIGS. 6A and 6B multi-bit functional blocks are illustrated as one-bit functional blocks for simplicity.

The phase locked loop is configured by the above stated blocks. The oscillating frequency fvo of the VCO 15 after establishing synchronization is expressed as the product of the dividing number N and the reference signal frequency $f_r1$ by Equation 2:

$$Fvo = N \cdot f_r 1 \qquad \text{(Equation 2)}$$

The configuration and operation of the basic embodiment shown in FIGS. 6A and 6B will be described below in detail with several specific numerical value examples.

Assuming, for example, that the oscillating frequency $f_r0$ of the reference oscillator 11 is set to 12.8 MHz, and both the dividing numbers L and K to $2^5$ (=32), the output frequency of the divider 141 is 400 kHz, and the output frequency $f_r1$ of the divider 142 is 12.5 kHz. Assuming also that the oscillating frequency fvo of the VCO 15 is set to about 100 MHz, the dividing number N of the binary modulo N counter 16 is approximately 8,000 which requires a number of bits equal to 13 if expressed in binary code. A dividing number register 223 in the interface unit 22 outputs the binary dividing number N onto a 13-bits bus BI1. The counter 16 counts the frequency of clock signals from the VCO 15 applied to a clock terminal CK thereof. The counter 16 has a carry terminal CA connected with a load terminal LD thereof and a data input terminal DT connected to the bus BI1, and outputs the count contents thereof from an output terminal OP onto a 13-bit bus B16. For example, if the counter 16 is a down-counter, when a carry signal is output from the carry terminal CA, it is applied to the load terminal LD, and the dividing number N on the bus BI1 is set in the counter 16 in synchronism with the clock signal supplied to the terminal CK. Then, the counter 16 starts down counting from the dividing number N in synchronism with the clock signal and repetitively outputs a carry signal every time the count contents present "1". Conversely, if the counter 16 is an up-counter, a carry signal, when output from the carry terminal CA, is applied to the load terminal LD, and the count contents is set to "1" in synchronism with the clock signal supplied to the terminal CK. The counter 16 starts up counting from one in synchronism with the clock signal, and repetitively outputs a carry signal every time the count contents coincide with the dividing number N on the bus BI1.

The sampling and differential-phase generating circuit 17 has D-type flip-flops 171, 172 and 175; a subtractor 173; an adder 174; a multiplier 176; an RS flop-flop 177; and a selector 178. The 13-bit flip-flop 171 receives the count contents of the counter 16 at a D-terminal by way of the bus B16 and samples the count contents while establishing synchronization with a clock generated by dividing the output of the reference oscillator 11. In the flip-flop 171, an input signal supplied to the D-terminal is sampled by the clock Fr22 on the line T2 supplied to a C-terminal, and the sampled signal is output from a Q-terminal onto a 13-bit bus B171. In the 13-bit flip-flop 172, a signal supplied from the bus B171 to a D-terminal is sampled by the clock Fr21 on the line T1 supplied to a C-terminal, and the sampled signal is output from a Q-terminal to a 13-bit bus B172. The 13-bit subtractor 173 calculates the difference between the signal on the bus B171 and the signal on the bus B172 and outputs the difference onto a 14-bit bus B173. The count contents of the counter 16 sampled by the flip-flop 172 is equal to the count contents of the counter 16 which has been sampled by the flip-flop 171 in the preceding sampling operation. In other words, the subtractor 173 can calculate the difference between the count contents of the counter sampled by the flip-flop 171 and the count contents of the counter sampled by the flip-flop 172. The most significant bit of the bus B173 is a sign bit with which the subtractor 173 outputs the result of subtraction together with sign information (+ or −). The subtraction is performed such that the signal on the bus B172 is subtracted from the signal on the bus B171 when the counter 16 is a down-counter, while the signal on the bus B171 is subtracted from the signal on the bus B172 when the counter 16 is an up-counter. The adder 174 compensates for a signal on the bus B173 when a carry is output from the counter 16. The subtractor 173 performs subtraction between two adjacent sampled count values. When a carry is output, the value on the counter 16 is reset by the carry. The count contents of the counter 16 sampled by the flip-flop 172 is a count value before the carry has been outputted, so that the adder 174 is used to correct the sampled value when a carry is output. The RS flip-flop 177 is set by a carry on a line S16 supplied from the carry terminal CA of the counter 16 to an S-terminal, reset by the clock Fr24 on a line T4 supplied to an R-terminal, and outputs a selecting signal SN from a Q-terminal onto a line S177 in synchronism with a divided clock signal of the reference oscillator 11. The 13-bit selector 178 outputs 13-bit "0" input to an A-terminal from a Y-terminal when the selecting signal SN supplied to an S-terminal is "0" while outputs the dividing number N on the bus BI1 input to a B-terminal from the Y-terminal when the selecting signal SN is "1". The output signal from the Y-terminal is supplied to lower 13 bits of the adder 174 through a bus B178. The 14-bit adder 174 adds the signal on the bus B173 and the signal on the bus B178 and outputs the addition result onto a bus B174. In this embodiment, the number of bits of the bus B174 is approximately nine, including a sign bit because the subtractor 173 subtracts adjacent values of the sampled count contents of the counter, as described above, and nine bits are sufficient since the compensation is made by the adder 174 when a carry is output. Also, the number of bits of two signals compared by the differential-phase comparator 18 may be similar to this. The signal on the bus B174 is multiplied by K equal to $2^5$ by the multiplier 176 and thereafter supplied to the differential-phase comparator 18. In the 9-bit flip-flop 175, a signal input from the bus B174 to a D-terminal is sampled by the clock Fr23 on a line T3 supplied to a C-terminal, and the sampled signal is output from a Q-terminal onto a 9-bit bus B175. The multiplier 176 multiplies the signal on the bus B175 by K equal to $2^5$, and outputs the product onto a 14-bit bus B17. The function of the multiplier 176 can be realized, when $K=2^5$ as is in this embodiment, by shifting the signal on the bus B175 except for the sign bit by five bits toward the most significant bit and outputting the shifted signal onto the bus B17. The signal $\Delta V$ on the bus B17 (oscillator-signal differential-phase information) represents information corresponding to a differential phase of the VCO 15. The differential-phase comparator 18 only comprises a 14-bit subtractor 181 and subtracts the oscillator-signal differential-phase information $\Delta V$ on the bus B17 from the dividing number N on the bus BI1 corresponding to the reference differential-phase information $\Delta R$ and outputs the subtraction result $\Delta H$ onto a 14-bit bus B18. While the most significant bit of the bus B18 is assigned to a sign bit, if several bits subsequent to the sign bit do not change during operation, these bits may be omitted.

The integrator 19 has an adder 191 and a register 192. The 19-bit adder 191 receives the sign bit and the lower 13 bits of the differential-phase error $\Delta H$ on the bus B18 at a sign bit and lower 13 bits of an input terminal, respectively. An output signal of the adder 191 is supplied through a 19-bit bus B91 to a D-terminal of the 19-bit register 192. In the register 192, the input signal to the D-terminal is transmitted to a Q-terminal by the clock Fr24 on a line T4 which is supplied to a C-terminal, and output onto a 19-bit bus B19. The signal on the bus B19 is supplied to another input terminal of the adder 191. By the foregoing operation, the differential-phase error signal $\Delta H$ is integrated to produce a phase error signal H. The register 192 is reset by a reset signal on a line S11 which is supplied to R-terminal at every time a new dividing number N is supplied to the interface unit 22. When the adder 191 can overflow, an overflow detector may be provided such that the overflow detector resets the register 192 when it detects an output overflow of the adder 191.

The signal processing unit 20 has an adder 201; a register 202; a divider 203; a D-type flip-flop 204; a selector 205, a normalizer 206; an adder 207; a selector 208 and a D-type flip-flop 209. A sign bit and lower 18 bits of the phase error signal H on the bus B19 are supplied to a sign bit and lower 18 bit, respectively, of an input port of the 24-bit adder 201. An output signal of the adder 201 is supplied to a D-terminal of the 24-bit register 202-through a 24-bit bus B201. In the register 202, the input signal to the D-terminal is transmitted to a Q-terminal by the clock Fr25 on a line T5 which is supplied to a C-terminal, and output onto a 24-bit bus B202. The signal on the bus B202 is supplied to another input terminal of the adder 201. The divider 203 divides thee signal on the bus B202 by K equal to 32 and outputs the quotient onto a 19-bit bus B203. This dividing function may be realized by shifting the signal on the bus B202 by five bits toward the least significant bit and placing the shifted signal onto the bus B203. The signal on the bus B203 is supplied to a D-terminal of the flip-flop 204. In the 19-bit flip-flop 204, the input signal to the D-terminal is transmitted to a Q-terminal by the clock Fr16 on a line T7 which is supplied to a C-terminal, and output onto a 19-bit bus B204. The register 202 is reset by the clock Fr17 on a line T8. Since the frequency of the clock Fr25 is K times higher than the frequency of the clocks Fr16 and Fr17, the signal on the bus B204 corresponds to the phase error signal on the bus B202 averaged over a period $1/f_r1$. The signal on the bus B204 is supplied to a B-terminal of the selector 205. The selector 205 is supplied with the phase error signal on the bus B19 directly at an A-terminal. The 19-bit selector 205 outputs the signal input to the A-terminal from a Y-terminal onto a 19-bit bus B205 as a phase error signal 8 when the selecting signal ST on a line SI2, applied to an S-terminal, is "0" while outputs the signal inputted to the B-terminal from the Y-terminal onto the 19-bit bus B205 as the phase error signal $\theta$ when the selecting signal ST is "1". The signal processing performed from the bus B18 to the bus B205 is a kind of digital filtering. Therefore, this processing may be performed by any configuration other than this embodiment. The signal on the bus B205 is supplied to the normalizer 206. The action of this normalizer 206 is to perform four arithmetical operations for an input signal, accommodate its output signal within an input value range of the D/A convertor 21, and provide a necessary resolution. For example, the sign bit and the lower second to 16th bits are output onto a 16-bit bus B206. The signal on the bus B206 is supplied to one input terminal of the 16-bit adder 207. The adder 207 is also supplied at another input terminal with an appropriate initial value $\theta i$ corresponding to the dividing number N from the 16-bit bus BI2. The adder 207 outputs the addition result onto a 16-bit bus B207. The selector 208 is supplied at an A-input terminal with the clock Fr27 on a line T6 and at a B-input terminal with the clock Fr17 on the line T8. The selector 208 outputs the signal input to the A-terminal from a Y-terminal onto a line S208 when the selecting signal ST on the line SI2, supplied to an S-terminal thereof, is "0" while outputs the signal input to the B-terminal from the Y-terminal onto the line S208 when the selecting signal ST is "1". The 16-bit flip-flop 209 resamples a signal supplied thereto at a D-terminal from the bus B207 by a clock supplied to a C-terminal thereof from the line S208, and outputs the resampled signal from a Q-terminal onto a 16-bit bus B20.

The 16-bit D/A convertor 21 outputs on a line S21 an analog voltage corresponding to a digital value on the bus B20 supplied thereto. This voltage is applied to a frequency control terminal of the VCO 15. This voltage causes the VCO 15 to change its frequency, thereby forming a negative feedback loop such that the output of the differential phase comparator 18, when integrated over one period $1/f_r1$, results in zero.

The interface unit 22 has a series input/parallel output register 221; an address decoder 222; a dividing number register 223; an initial value register 224; a timer register 225; and a timer 226. The microprocessor 70 supplies the interface unit 22 with five signals, i.e., a clock DCLK, series data DATA, 2-bit addresses ADR0, ADR1, and a latch enable LE through lines M1, M2, M3, M4 and M5, respectively. The 16-bit series input/parallel output register 221 fetches the series data DATA at every time the clock DCLK is supplied thereto and outputs the same as parallel data onto a bus B221. The address decoder 222 decodes the address ADR0 as lower bits and ADR1 as upper bits, and outputs the latch enable LE on the line M5, as a start enable SE, onto a line S2221 when the address is "0"; onto a line S2222 when the address is "1"; onto a line 2223 when the address is "2"; or onto a line S2224 when the address is "3". The 13-bit dividing number register 223 fetches the parallel data on the bus B221 by the latch enable LE on the line S2221, converts the same to other parallel data, and thereafter outputs the other parallel data onto the bus BI1 by the start enable SE on the line S2224. The 16-bit initial value register 224 fetches data on the bus B221 by the latch enable LE on the line S2222, converts the same to parallel data, and thereafter outputs the parallel data onto the bus BI2 by the start enable SE on the line S2224. The timer register 225 fetches data on the bus B221 by the latch enable LE on the line S2223 and outputs the same onto a bus B225. The timer 226, after being reset by the start enable SE on the line S2224, starts counting the clock Fr18 on the line T9 and at this time outputs the selecting signal ST set at "0" onto the line SI2. When a count value of the timer 226 coincides with data on the bus B225, the timer 226 stops counting and keeps outputting the selecting signal ST at "1" until it is reset. The start enable SE on the line S2224 is outputted onto the line SI1 as an initial reset IR.

The operation of the embodiment shown in FIGS. 6A and 6B will hereinafter be explained again with reference to timing charts of FIG. 7. As numerical value examples, the oscillating frequency $f_r0$ of the reference oscillator 11 is selected to be 6.4 MHz, and the dividing numbers L, K and N to be 8, 8 and 1002, respectively for facilitating the illustration of FIG. 7. From these values, the output frequency $f_r2$ of the divider 12 is 800 kHz, the output frequency $f_r1$ of the divider 13 is 100 kHz, and the oscillating frequency fvo of the VCO 15 is 100.2 MHz. At this time, N/K is calculated to be 125.25 (N/K=1002/8=125.25). It should also be noted that the timing charts of FIG. 7 are illustrated on the assumption that an operational delay time of each circuit portion shown in FIGS. 6A and 6B are substantially zero. Timing charts (1), (2) and (3) of FIG. 7 represent signals at the frequencies $f_r0$, $f_r1$ and $f_r2$, respectively, which are the outputs of the reference oscillator 11 and the timing clock generating unit 14. In FIG. 7, each period is designated a period slot number from t0 to t13 based on the period of the frequency signal $f_r2$. Since one period of the frequency $f_r2$ includes eight pulses of the frequency $f_r0$, these eight pulses are designated sequential pulse numbers from p1 to p8 from the starting pulse in each period. Timing charts (4)–(9) of FIG. 7 represent the clocks Fr21, Fr22, Fr23, Fr24, Fr25 and Fr27 which are output signals from the timing clock generator 143. It is assumed that the frequency of these clocks is equal to $f_r2$, and a positive pulse width thereof is equal to a pulse width of the frequency signal $f_r0$. A letter "X" in a clock $f_r2X$ indicates that a pulse exists at a position in one period thereof equal to the position of the $X^{th}$ pulse of the frequency signal $f_r0$. Timing charts (10)–(12) of FIG. 7 represent the clocks Fr16, Fr17 and Fr18. It is assumed that these clocks have a frequency equal to $F_r1$, and a positive pulse width thereof is equal to a pulse width of the frequency signal $f_r0$. In FIG. 7, the clocks Fr16, Fr17 and Fr18 have pulses in periods having slot numbers t3 and t11. A letter "X" in a clock $f_r1X$ indicates that a pulse exists at a position in one period thereof equal to the position of the $X^{th}$ pulse of the frequency signal $f_r0$. In the foregoing manner, in principle, as a circuit block number (17–20) is larger, the value X is increased to sequentially delay the phases of the clocks, thereby ensuring stable operations.

Timing charts (13)-(18) of FIG. 7 show outputs of respective circuits in FIGS. 6A and 6B, when the phase lock loop of FIG. 5 is in synchronism, with waveforms or changing points. More specifically, the timing chart (13) shows the carry output CA of the up counter 16; the timing chart (14) shows the Q-output of the flip-flop 177; and the timing charts (15)-(18) show changing points of the Q-outputs of the flip-flops 171, 172 and 175 and the register 192, respectively. Supposing that the flip-flop 171 samples values S1-S8 of the counter 16 on the bus B16 in the time slots t1-t8 with the clock Fr22, the output of the flip-flop 172 for sampling the output thereof is represented as shown by the timing chart (16) of FIG. 7. The timing chart (17) of FIG. 7 shows values D1-D8 sampled by the flop-flop 175 with the clock Fr23. These values are derived by subtracting the output of the flip-flop 172 from the output of the flip-flop 171 by the subtractor 173 and subjecting the difference to a carry compensation performed by the adder 174. In this example, since the carry output CA is generated in the slots t4 and t12, the flip-flop 177 keeps outputting "1" until it is reset by the clock Fr24. During the "1" output, the selector 178 outputs a dividing number N equal to 1002, so that the outputs D4 and D12 of the flip-flop 175 in the time slots t4 and t12, respectively, are carry compensated values. The output of the subtractor 181 is a value derived by subtracting the output of the flip-flop 175 multiplied by K (=8) from the dividing number N (=1002). For example, this value is $\Delta Hi$ shown in Table 3. In Table 3, Ci designates an output value of the flip-flop 171; Di an output value of the flip-flop 175; and $\Delta Ri$, $\Delta Vi$, and $\Delta Hi$ input/output values of the differential phase comparator 18 (i=1, 2, 4, ..., n, ...).

phase error signal $\theta$, and the phase error signal on the bus B19 is output directly from the signal processing unit 20 without passing through the integrator. In this manner, the D/A convertor 21 is sequentially supplied with new error signals at a high speed, so that the oscillating frequency of the VCO 15 rapidly approaches a frequency corresponding to the new dividing number. When the output signal ST of the timer 226 becomes "1", the error signal on the bus B19 is integrated by the signal processing unit 20 and output therefrom, so that the frequency of the VCO 15 approaches a final frequency relatively slowly, and ends up in a stable state. Since the foregoing configuration does not include any analog filter, the establishment of the phase locked loop is essentially rapid. Further, by optimizing the filter configuration and operating time of the signal processing unit 20 analytically and experimentally from the phase looked loop gain, a stable and fast establishment of synchronization can be achieved.

Also, in the embodiment shown in FIGS. 6A and 6B, assume that an output value of the normalizer 206 is $\theta_0$ when phase synchronization is established, where an initial value $\theta_1$ on the bus BI2 is zero with a certain dividing number N. Next, when the dividing number is to be changed from an arbitrary value to the above-stated N, the value $\theta_0$ or an approximated value thereof is set as it is as the initial value $\theta_1$ simultaneously with the setting of the dividing number N, thereby allowing the synchronization to be more rapidly established.

In the embodiment shown in FIGS. 6A and 6B, when the counter 16, which is a variable divider, is formed by a cascade connection of a prescaler with a dividing number C and a modulo M counter with a variable dividing number M, a total dividing number Nt is given by Nt=C.M. Also in this case, if the variable dividing number M is employed as the reference differential

TABLE 3

| | | 2π:1000, K = 8, N = 1002 | | | | | | | |
|---|---|---|---|---|---|---|---|---|---|
| | | Sampling Step | | | | | | | |
| Signals | | 1 | 2 | 3 | 4 | 5 | 6 | 7 | 8 |
| Counter Output | Ci | 125 | 250 | 375 | 501 | 626 | 751 | 876 | 1002 |
| Increase of Sampling | Di | 125 | 125 | 125 | 126 | 125 | 125 | 125 | 125 |
| Differential Phase Value | ΔVi | 1000 | 1000 | 1000 | 1008 | 1000 | 1000 | 1000 | 1008 |
| Ref. Differential Phase | ΔRi | 1002 | 1002 | 1002 | 1002 | 1002 | 1002 | 1002 | 1002 |
| Differential Phase Error | ΔHi | −2 | −2 | −2 | +6 | −2 | −2 | −2 | +6 |
| Phase Error | Hi1 | 0 | −2 | −4 | +2 | 0 | −2 | −4 | +2 |
| Phase Error | Hi2 | +2 | 0 | −2 | +4 | +2 | 0 | −2 | +4 |
| Phase Error | Hi3 | +4 | +2 | 0 | +6 | +4 | +2 | 0 | +6 |
| Phase Error | Hi4 | −2 | −4 | −6 | 0 | −2 | −4 | −6 | 0 |

The register 192 outputs a value derived by integrating the output of the subtractor 181 at every time the clock Fr25 is generated. For example, immediately after the dividing number N changes from 900 to 1002, oscillating phase information becomes smaller, whereby a larger value is output from the differential-phase comparator 18, resulting in increasing the oscillating frequency of the VCO 15. As the oscillating frequency of the VCO 15 is higher, a smaller output value is delivered from the differential-phase comparator 18. These values are accumulatively added by the register 192 and the adder 191, and are fluctuated in the vicinity of certain values due to a quantization error, after the phase synchronization has been established.

In the embodiment shown in FIGS. 6A and 6B, when the dividing number N is set to a new value, the output signal ST of the timer 226 becomes "0", whereby the selector 205 outputs a signal input to the A-terminal from the Y-terminal onto the 19-bit bus B205 as the phase $\Delta R$, a value derived by multiplying the differential phase, which is the difference value between adjacent sampled values of the modulo M counter, by a factor of K, as in the embodiment, is set to the oscillator-signal differential phase $\Delta V$ to thereby achieve the object of the present invention.

It should be noted in the embodiment shown in FIGS. 6A and 6B that constituents thereof, except for the reference oscillator 11, the VCO 15 and the D/A convertor 21, may be easily implemented using general-purpose ECL, MOS and TTL logic IC. Alternatively, it is apparent that the functions of this embodiment may be realized by signal processing through software, partially using a signal processing unit. Furthermore, it is apparent that the recent semiconductor technology may be used to integrate all constituents except for the reference oscillator and a resonator element forming the VCO on a monolithic substrate as a one-chip.

Figure 8:
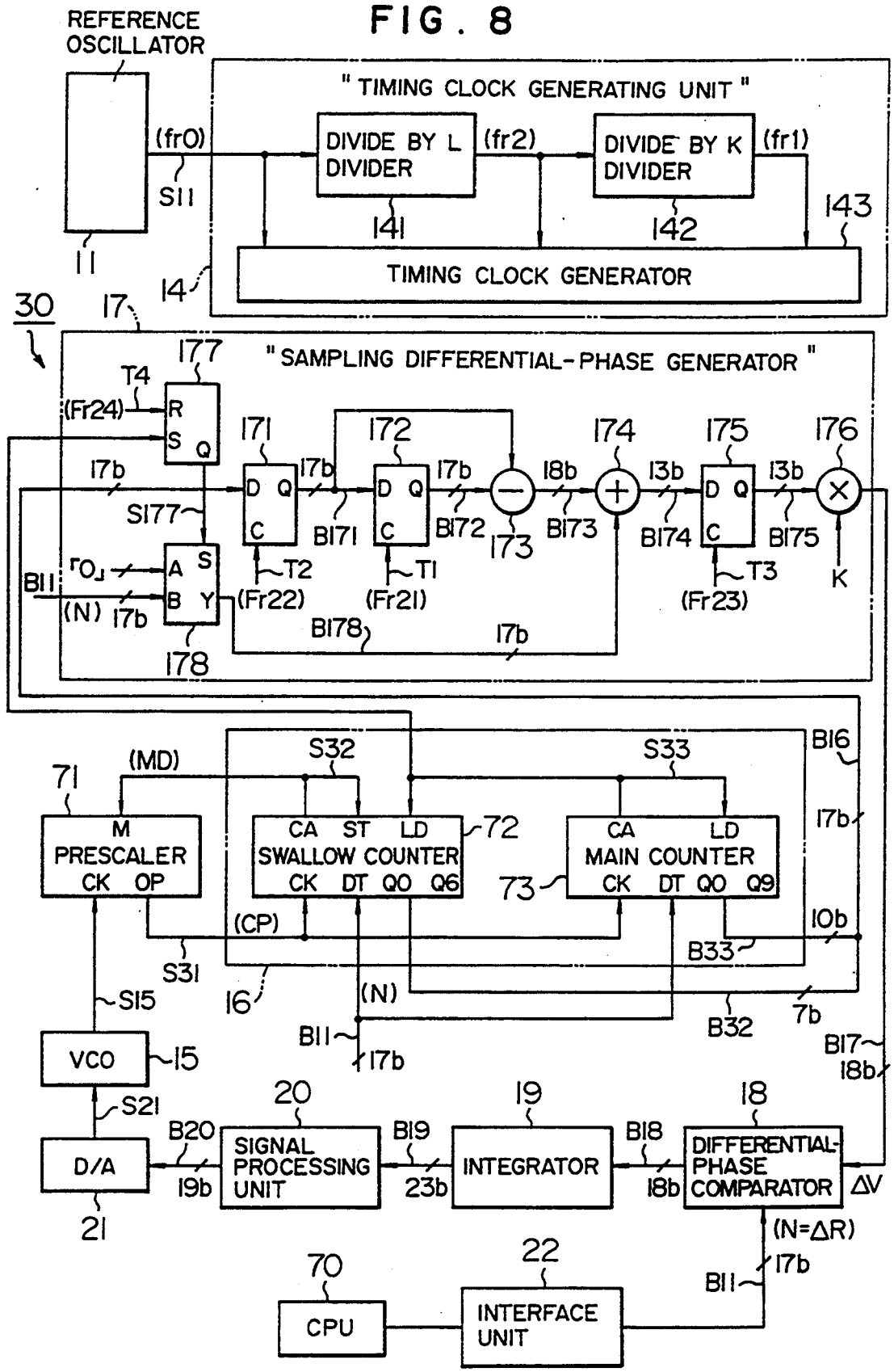
FIG. 8 is a block diagram showing an embodiment of the present invention which employs a 2-modulus prescaler.

FIG. 8 shows an embodiment which employs a two-modulus prescaler on the variable divider side as a prescaler. When the oscillating frequency of the VCO is high, a two-modulus prescaler having two dividing numbers P1, P2, a variable divider main counter having a dividing number M, a variable divider swallow counter having a dividing number S are generally employed. At this time, the oscillating frequency fvo of a VCO 15 is expressed by the following Equation 3 with a reference first clock frequency being represented by $f_r1$:

$$fvo = \{P2 \cdot S + P1 \cdot (M-S)\} \cdot f_r1 = N \cdot f_r1 \quad \text{(Equation 3)}$$

N is expressed by Equation 4:

$$N = P2 \cdot S + P1 \cdot (M-S) = C(PM + S) \quad \text{(Equation 4)}$$

Here, the relationship between P1 and P2 is expressed by:

$$P1 = C \cdot P, \ P2 = C \cdot (P+1) \quad \text{(Equation 5)}$$

In many cases, P is set to two to the $p^{th}$ ($2^p$) power or ten to the $p^{th}$ power ($10^p$), and C is set to one in either binary or decimal number corresponding to P. The oscillating frequency may be changed by altering at least one of the dividing numbers M and S. In this embodiment, P1 is set to 128; P2 to 129; and C to 1.

A frequency synthesizer 30 has a reference oscillator 11; a timing clock generating unit 14; the VCO 15; a prescaler 71; a swallow counter 72; a main counter 73; a sampling and differential phase generator 17; a differential-phase comparator 18; an integrator 19; a signal processing unit 20; and a D/A convertor 21. Parts performing the same functions as those in the embodiment shown in FIGS. 6A and 6B are designated by the same reference numerals even if the bit width is different. It is also assumed that the frequencies of various clocks generated by the reference oscillator 11 and the timing clock generating unit 14 are the same as those of FIGS. 6A and 6B. An output signal of the VCO 15 is supplied to a CK terminal of the prescaler 71. The prescaler 71 has the two dividing numbers P1 and P2, one of which is selected by a signal supplied to an M-terminal thereof. The prescaler 71 divides an input signal supplied to the CK terminal by the selected dividing number and outputs a divided clock CP onto a line S31. The divided clock CK on the line S31 is supplied to the swallow counter 71 and the main counter 73 at respective CK terminals. For example, assuming in FIG. 8 that fvo is equal to about 1 GHz; $f_r0$ to 12.8 MHz; L to 32; and K to 32, the dividing number N in the foregoing Equation 3 is approximately 80,000. Since P1 has been set to 128, the number of bits of the counters 72, 73 are seven and ten, respectively. The lower seven bits (S) of the dividing number N on a bus BI1 are supplied to the swallow counter 72 through a DT terminal, while the upper ten bits (M) of the same are supplied to the main counter 73 through a DT terminal. The counter 72 sets the dividing number of the prescaler 71 to P2 by a dividing number selecting signal MD output from a CA terminal onto a line S32 until the counting of the dividing number S is finished. Meanwhile, the counter 73 is also counting simultaneously. When the counter 72 finishes counting, the selecting signal MD on the line S32 selects P1 as the dividing number of the prescaler 71, and thereafter the counter 73 alone keeps counting. When the counter 73 finishes counting with the dividing number M, the dividing numbers S, M are again supplied to the counter 72, 73 through the respective DT terminals by a carry signal output from the CA terminal onto a line S33. Together with this operation, the dividing number of the prescaler 71 is selected to be P2, and the counters 72 and 73 newly start counting. The count contents of the counter 72 are output from terminals Q1–Q9 onto a bus B32. The count contents of the counter 73 are output from terminal Q0–Q9 onto a bus B31. On a bus B16, data on the bus B32 and data on the bus B33 are integrated to form 17-bit data, where the former constitutes lower bits and the latter upper bits. The 17-bit data is supplied to a 17-bit D-type flip-flop 171 at a D-terminal thereof in the sampling and differential-phase generator 17. The carry signal on the line S33 is supplied to a flip-flop 177 at an S-terminal to cause it to generate a selecting signal SN. Except for the variable divider just mentioned, constituents of the frequency synthesizer 30 are the same as those of the embodiment shown in FIGS. 6A and 6B. However, since the number of bits of the dividing number N is four bits more in this embodiment than the embodiment of FIGS. 6A and 6B, multiple bit circuit elements in the circuit blocks 17–19 and circuit elements 201–205 in the circuit block 20, and the respective buses interconnecting these elements have their number of bits increased by four bits. The number of bits of the D/A convertor 21 is determined in accordance with an applied system, and is set to 19 bits in this embodiment. Incidentally, if N in Equation 4 is used as the reference differential phase ΔR, a constant set in the multiplier 176 of the sampling and differential-phase generator 17 is CK. Alternatively, if N/C derived from Equation 4 is used as the reference differential phase ΔR, a constant set in the multiplier 176 of the sampling and differential-phase generator 17 is K. The basic operation of this frequency synthesizer 30 in the present invention is similar to that of the embodiment shown in FIGS. 6A and 6B except that the contents of the counters 72, 73 are sampled by the sampling and differential-phase generator 17. It can therefore be understood that the frequency synthesizer of this embodiment achieves the object of the present invention.

Figure 9:
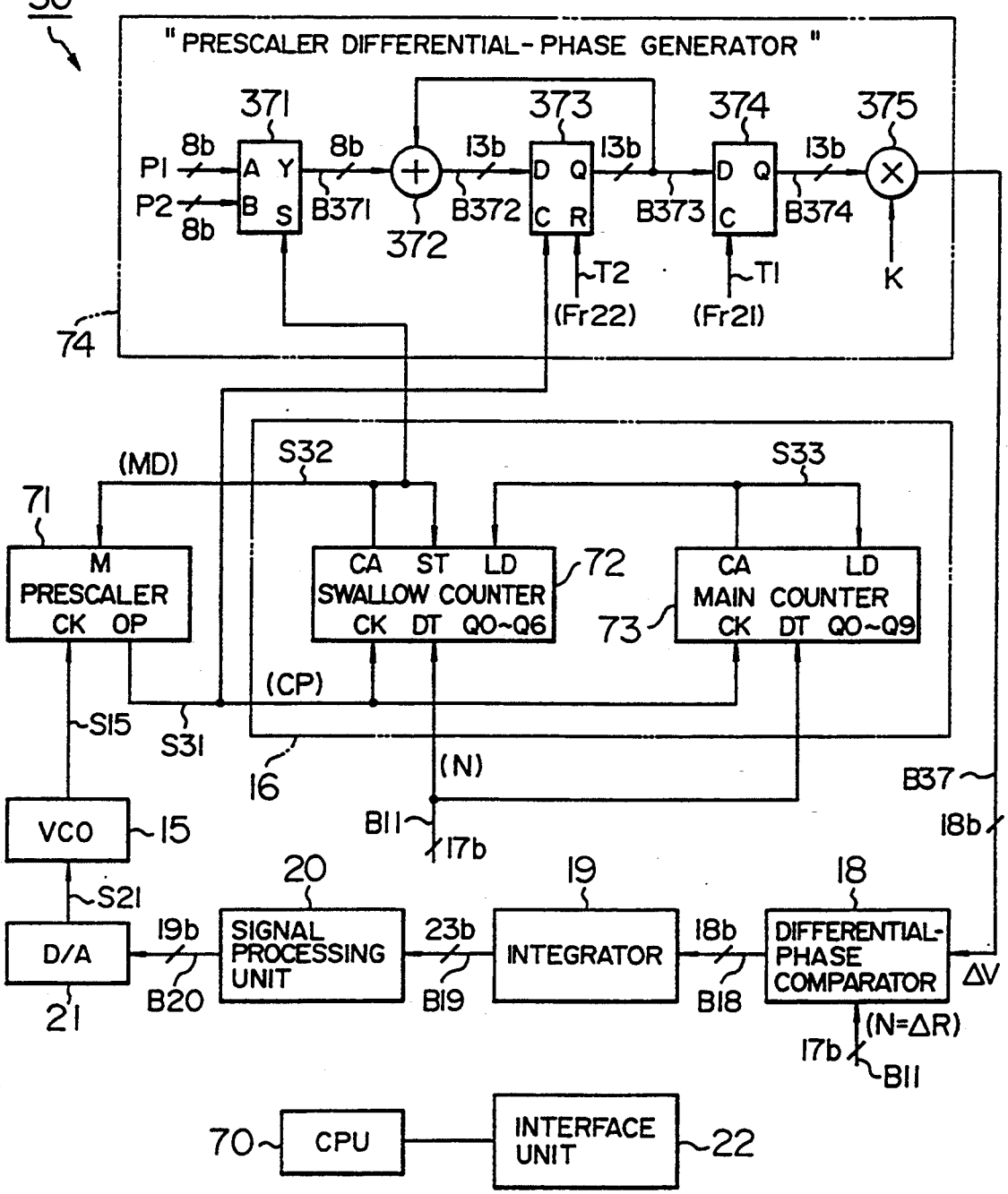
FIG. 9 is a block diagram showing another embodiment of the present invention which employs a 2-modulus prescaler.

FIG. 9 shows another embodiment which employs a two-modulus prescaler on the variable divider side. A frequency synthesizer 30 has a reference oscillator 11; a timing clock generating unit 14; a VCO 15; a two-modulus prescaler 71; a swallow counter 72; a main counter 73; a prescaler differential-phase generator 74 corresponding to the differential-phase generator 17 of FIG. 5; a differential-phase comparator 18; an integrator 19; a signal processing unit 20; and a D/A convertor 21. The whole configuration of this embodiment is the same as that shown in FIG. 8 except that the prescaler differential-phase generator 74 is employed instead of the sampling and differential-phase generator 17 in the embodiment shown in FIG. 8. Also, it is assumed that the frequencies of various clocks generated by the reference oscillator 11 and the timing clock generating unit 14 are the same as those generated by the corresponding constituents of FIGS. 6A and 6B. The prescaler differential-phase generator 74 has a selector 371; an adder 372; a register 373; a flip-flop 374; and a multiplier 375. The 8-bit selector 371 is supplied with a dividing number P1 at an A-input terminal; a dividing number P2 at a B-input terminal; and a dividing number selecting signal MD at an S-terminal, respectively. The selector 371 outputs, from a Y-output terminal, a dividing number corresponding to a dividing number of the two-modulus prescaler selected by the dividing number selecting signal MD onto an 8-bit bus B371. The signal on the bus B371 is supplied to lower eight bits of the 13-bit adder 372. The addition output of the adder 372 is supplied to a D-input terminal of the 13-bit register 373 through a 13-bit bus B372. The signal at the D-input terminal of the register 373 is transmitted to a Q-terminal by a clock CP on a line S31 supplied to a C-terminal and then outputted from the Q-terminal onto a 13-bit bus B373. The signal on the bus B373 is supplied to another input terminal of the adder 372. The signal on the bus B373 is also supplied to a D-terminal of a flip-flop 374, transmitted to a Q-terminal by a clock Fr21 on a line T1 supplied to a C-terminal, and outputted onto a 13-bit bus B374. After this clock Fr21 has been supplied to the flip-flop 374, the selector 373 is reset by a clock Fr22 on a line T2 supplied to an R-terminal thereof. As a result, the signal on the bus B374 is equal to a value derived by accumulating a signal on the bus B371 for a period $1/f_r2$ by the clock CP. In this embodiment, the frequency of the clock CP is selected to be less than 8 MHz, while the frequency $f_r2$ is 400 kHz, so that the number of bits required to the adder 372 and the register 373 is 13. The multiplier 375 multiplies a signal on the bus B374 by a factor of K ($=2^5$) and outputs the product onto a bus B37. This function of the multiplier 375 is realized by shifting the signal on the bus B374 by five bits toward the most significant bit and outputting the shifted signal onto the bus B37. Oscillator-signal differential phase information $\Delta V$ on the bus B37 is supplied to the differential-phase comparator 18.

In this embodiment, the dividing number N shown in Equation 4 is employed as the reference differential phase $\Delta R$. If P1/C, P2/C are employed instead of P1, P2 supplied to the A-terminal and the B-terminal of the selector 371, N/C derived by Equation 4 is employed as the reference differential phase $\Delta R$, or a multiplier of the multiplier 375 is selected to be CK.

The effect of the prescaler differential-phase generator 74 shown in FIG. 9 is that the circuit size is reduced as compared with the sampling *and differential-phase generator 17 in the embodiment shown in FIG. 8. More specifically, a portion for performing the carry compensation after calculating a sampling difference in the sampling and differential-phase generator 17 in the embodiment of FIG. 8 is formed only by an accumulator including the adder 372 and the register 373, where, additionally, the number of bits processed by the circuit is decreased. This results in producing effects of reducing the circuit size and power consumption of an LSI circuit implementing the frequency synthesizer of the invention.

In the foregoing embodiments shown in FIGS. 6A, 6B, 8 and 9, the relationship between the oscillating frequency fvo and the frequency $f_r1$ of the reference first clock is expressed by:

$$fvo=(N/K)\cdot K\cdot f_r1$$

which has been shown as Equation 1. Although (N/K) is not an integer in general, a truncation error due to sampling is not accumulated by calculating the difference between these frequencies, i.e., the differential phase. As a result, the output of the integrator 19 which integrates the output of the differential-phase comparator 18 for an arbitrary period $1/f_r1$ is zero as shown in Table 3. That is, the second object of the present invention can be achieved.

Figure 10:
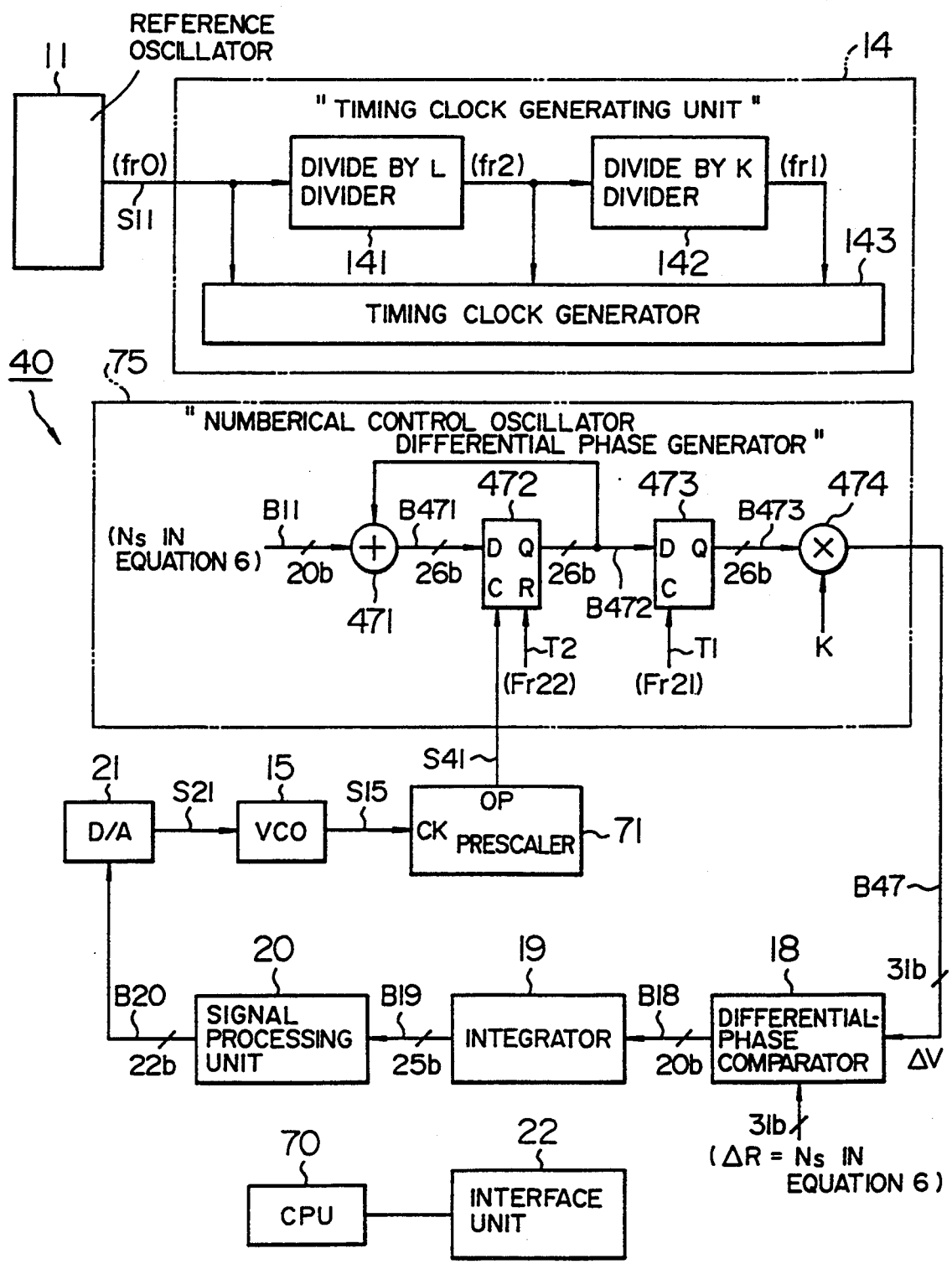
FIG. 10 is a block diagram showing an embodiment of the present invention which employs a numerical control oscillator.

FIG. 10 illustrates an embodiment which employs a numerical control oscillator having a variable step number Ns as the saw-tooth-like oscillator-signal generator 16 shown in FIG. 5. A frequency synthesizer 40 has a reference oscillator 11; a timing clock generating unit 14; a VCO 15; a prescaler 71; a numerical control oscillator differential-phase generator 75; a differential-phase comparator 18; an integrator 19; a signal processing unit 20; and a D/A convertor 21. This embodiment has the same configuration as the embodiment of FIGS. 6A and 6B except for the prescaler 71 and the numerical control oscillator differential-phase generator 75. The frequencies of various clocks generated by the reference oscillator 11 and the timing clock generating unit 14 are assumed to be the same as those of FIGS. 6A and 6B. The prescaler 71 having a dividing number C divides an output signal of the VCO 15 having a frequency fvo and outputs a divided clock CP onto a line S41.

The numerical control oscillator repeats the operation of accumulating the step number Ns for one period $1/f_r1$ by the divided clock CP. If a maximum accumulated value is represented by N, the step number Ns is given by Equation 6:

$$Ns=N/[(fvo/C)(1/f_r1)] \qquad \text{(Equation 6)}$$

Thus, the oscillating frequency fvo of the VCO 15 may be changed by altering the step number Ns with the above-stated N being constant. Assuming herein that the frequency fvo is 1 GHz, the dividing number C is 64, and the frequency $f_r1$ is 2.5 kHz, the value of the denominator shown in Equation 6 is calculated to be 1,250. For example, with N equal to $1,250\times2^{20}$, Ns is $2^{20}$. By sampling the accumulated contents of this numerical control oscillator at frequency equal to $K\cdot f_r1$, the differential phase can be derived by a circuit equivalent to the sampling and differential-phase generator 17 in the embodiment shown in FIGS. 6A and 6B. However, the embodiment shown in FIG. 10 derives the differential phase by the numerical control oscillator differential-phase generator 75 similar to the prescaler differential-phase generator 74 in the embodiment shown in FIG. 9.

The numerical control oscillator differential-phase generator 75 has an adder 471; a register 472; a flip-flop 473; and a multiplier 474. A 20-bit value Ns on a bus BI1 from an interface unit 22 is supplied to the lower 20 bits of the 26-bit adder 471. The addition output of the adder 471 is supplied to a D-input terminal of the register 472 through a 26-bit bus B471. The signal at the D-input terminal of the 26-bit register 472 is transmitted to a Q-terminal by the clock CP on the line S41 supplied to a C-terminal, and output therefrom onto a 26-bit bus B472. The signal on the bus B472 is supplied to another input terminal of the adder 471. The signal on the bus B462 is also supplied to a D-terminal of the 26-bit flip-flop 473, transmitted to a Q-terminal by a clock Fr21 on a line T1 supplied to a C-terminal, and output therefrom onto a 26-bit bus B473. After this clock Fr21 is supplied to the flip-flop 473, the selector 472 is reset by a clock Fr22 on a line T2 supplied to an R-terminal thereof. As a result, the signal on the bus B473 is equal to a value derived by accumulating the value Ns for a period $1/f_r2$ by the clock CP. In this embodiment, since the frequency of the clock CP is less than 16 MHz, and the frequency $f_r2$ is 400 kHz, the number of bits required to the adder 471 and the register 472 is 26. The multiplier 474 multiplies the signal on the bus B473 by a factor K equal to $2^5$, and outputs the product on a 31-bit bus B47. The function of the multiplier 474 may be realized by shifting the signal on the bus B473 by five bits toward the most significant bit and outputting the shifted signal onto the bus B47. The oscillator-signal differential-phase information $\Delta V$ on the bus B47 is supplied to the differential-phase comparator 18.

In this embodiment, the dividing number N calculated from Equation 4, i.e., $N = 1,250 \times 2^{20}$ is employed as the reference differential phase $\Delta R$. If $N/K = 1,250 \times 2^{15}$ is employed as the reference differential phase $\Delta R$, the multiplier 474 in the embodiment may be omitted. Also, if the comparison result output from the differential-phase comparator 18 has the upper five bits unchanged in an application system, these five upper bits may be omitted. Further, some of lower bits may be omitted in accordance with variations in the frequency of the synthesizer based on quantization errors which are tolerated in the system. On consideration of these results, the number of bits of the bus B18, for example, was selected to be 20 in this embodiment.

In the embodiment shown in FIG. 10, even with C being equal to one, meaning that the prescaler 71 is bypassed, if the frequency fvo takes one of various possible values of $n \cdot f_r 1$ (here, n is a natural number), the step number Ns calculated by Equation 6 is not an integer in general, so that it is not expressed by a finite word length. However, the embodiment shown in FIG. 10 can achieve the first and second objects of the present invention in the same manner as the embodiments shown in FIGS. 6A, 6B, 8 and 9.

In the foregoing embodiments, the numbers of bits required for constituent circuits, for example, those of counters, and D/A convertors should be determined depending on a system in which the frequency synthesizer of the present invention is applied. It should therefore be understood that the numbers of bits selected in the embodiments are mere examples. Also, although the embodiments perform binary operations, it is apparent that the present invention is effective also for operations where an arbitrary number is selected as a base. It is also apparent that the configuration of respective circuit portions may be modified without departing from the inventive spirit of the present invention.

Figure 11:
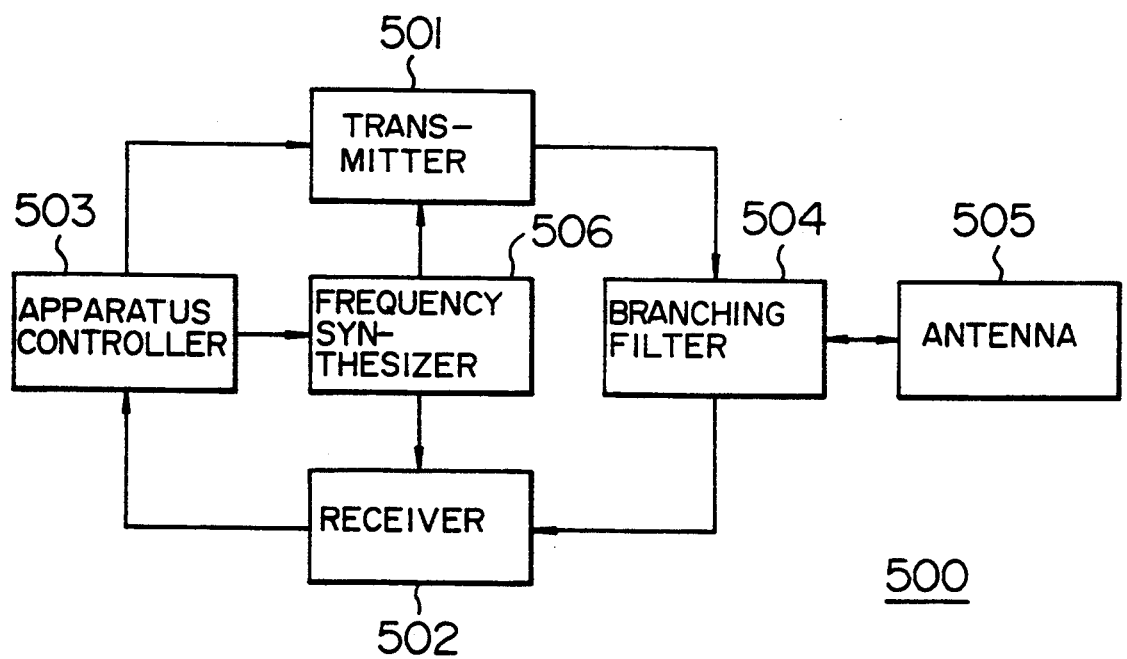
FIG. 11 is a block diagram showing mobile communication equipment which employs the frequency synthesizer according to the present invention.

Next, the configuration of a communication apparatus using a frequency synthesizer of the present invention is shown in FIG. 11.

A communication apparatus 500 shown in FIG. 11 comprises a transmitter 501 for transmitting information based on oscillating signals generated by frequency synthesizer 506 which has been set forth in connection with FIGS. 4-10 and 12-28; a receiver 502 for receiving information based on oscillating signals from the frequency synthesizer 506; and an apparatus controller 503 for controlling communications of information between the transmitter 501 and the receiver 502 as well as for controlling the frequency synthesizer 506. The apparatus 500 further comprises an antenna 505 used for transmission and reception, and a branching filter 504 for branching transmission signals and reception signals. The apparatus controller 503 includes the aforementioned microprocessor and can provide the frequency synthesizer 506 with a dividing number N and an initial value $\theta i$ for changing the oscillating frequency. The apparatus controller 503 can also control the transmitter 501 and the receiver 502 as required and further includes a man-machine interface. The transmitter 501 and the receiver 502 can respectively perform transmission or reception in accordance with the oscillating signals from the frequency synthesizer 506.

The frequency synthesizer according to the present invention is suitable for mobile communication equipment which requires fast frequency switching. The present invention enables such fast frequency switching and produces an effect of realizing a smaller apparatus than an apparatus which is provided with two slower frequency switching frequency synthesizers coupled in parallel and alternately operates them for achieving the fast switching.

It will be obvious that the frequency synthesizer according to the present invention may be applied to a variety of apparatuses such as a measuring apparatus.

Further according to the present invention, a major part of the frequency synthesizer is implemented by digital circuits so that the entirety or portions except for the VCO may be integrated in an LSI chip. For example, part or all of the circuits except for the VCO may be formed as a digital signal processing unit (DSP) which commonly utilizes a single processing unit for performing signal processing. The present invention thus produces an effect of realizing a smaller frequency synthesizer and a smaller apparatus employing the same.

FIG. 12 shows another embodiment of the present invention. A frequency synthesizer of FIG. 12 is further improved from the one shown in FIG. 5, and such improvements will be explained below.

Drawback to be Improved (1)

Referring to FIG. 5, the saw-tooth-like wave generated from the reference signal and that generated by the VCO are not synchronized with each other, so that these two saw-tooth-like waves cannot be made completely in phase even if a reset signal is supplied simultaneously. As a result, the output of the signal processing unit 20 does not become zero. For this reason, when an initial value, approximated from the oscillating frequency of the frequency synthesizer, is to be added directly to an input signal to the D/A convertor to further reduce a settling time, the input signal to the D/A convertor having a phase difference as described above causes the oscillating frequency of the frequency synthesizer to displace from the oscillating frequency given as an initial value, resulting in failing to generate an initial oscillating frequency as expected.

Drawback to be Improved (2)

In a settling process of the oscillating frequency of the frequency synthesizer, supposing that a closed loop gain of the synthesizer is made larger to increase a settling speed at an initial stage, and is further made smaller to suppress variations in the oscillating frequency at a settlement finishing stage, when the closed loop gain is to be changed, the input to the VCO depends on the phase difference between the two saw-tooth-like waves, i.e., the output of the differential-phase comparator 18, so that the oscillating frequency of the VCO 15 also changes simultaneously even if a multiplier having a factor of $\frac{1}{2}$ or $\frac{1}{4}$, for example, is merely provided prior to the D/A convertor 21, whereby the oscillating frequency suddenly changes to cause discontinuity thereof.

Drawback to be Improved (3)

A settling point of the frequency synthesizer of the type stated above is found at a location where the phase relationship between the two saw-tooth-like waves presents a constant value. For this reason, if a phase difference originally exists between the two saw-tooth-like waves and an oscillating frequency of the frequency synthesizer is deviated from a normal oscillating frequency, the oscillating frequency of the frequency synthesizer presents a value deviated from a set frequency until the phase difference between the two saw-tooth-like waves becomes correct. Therefore, the phase difference between the two saw-tooth-like waves must be displaced in accordance with the frequency deviation. For this reason, since the frequency difference (error) exists until a correct phase difference is obtained corresponding to an input signal to the D/A convertor, whereby the settlement is delayed.

The embodiment of FIG. 12 solves the drawbacks (1), (2) and (3) in the following manner.

To attend to the drawback (1), the closed loop is released while the initial value is being given, and the output of the D/A convertor is fixed to an initial value which is provided from the outside. After a phase difference is detected by a phase difference detector 77 while the closed loop is released, the externally provided initial value is corrected by a gain controller 78.

As to the drawback (2), an input value to the D/A convertor which has been controlling the VCO immediately before the gain was switched is stored, a difference value between this stored value and a newly derived output of the signal processing unit 20 is provided with a gain by a multiplier, and the stored value is inputted to an integrator in the gain controller 78 as an initial value and is used as a new input value to the D/A convertor.

As to the drawback (3), a frequency error compensator 76 is provided. In this frequency error compensator 76, frequency difference components of the VCO oscillating frequency are first detected with respect to a reference frequency. Then, if the frequency difference is larger than a predetermined value, the frequency error compensator 76 again detects the frequency difference components, which is the gradient of the output of the differential phase comparator 18, irrespective of the phase difference between the two saw-tooth-like waves, adds the same to the output of the signal processing unit 20, D/A converts the addition value, and directly controls the VCO. However, since a signal processing error is large compared with the frequency difference, the circuit configuration is made such that the frequency difference components serve as a feedback signal to the VCO only when the frequency difference between the oscillating frequency of the VCO and the reference signal is larger than a predetermined value. In this manner, when a current oscillating frequency of the frequency synthesizer has a larger difference with respect to a frequency to be oscillated than a predetermined value, the frequency difference is directly D/A converted to be used as a frequency control signal for the VCO. Conversely, when a current oscillating frequency of the frequency synthesizer has a smaller frequency difference with respect to a frequency to be oscillated than the predetermined value, the phase difference between the saw-tooth-like waves is D/A converted, as is conventionally performed, and is used as the frequency control signal for the VCO.

Each of the phase difference detector 77, the gain controller 78 and the frequency error compensator 76 may be individually adapted to the frequency synthesizer.

In the following explanation, a saw-tooth-like wave generator 12 corresponds to the saw-tooth-like reference-signal generator 12; a saw-tooth-like wave generator 16 to the saw-tooth-like oscillator-signal generator 16; a subtract circuit 13 to the reference-signal phase-differentiator 13; a circuit comprising a combination of a subtract circuit 97, a synchronizer 81 and a summing circuit 82 to the oscillator-signal phase-differentiator 17; a subtractor 18 to the differential-phase comparator 18; and a digital filter 20 to the signal processing unit 20.

The synthesizer 81 is a circuit for synchronizing two differential phase signals with each other using a reference signal fr. In the foregoing embodiments, the function corresponding to the synchronizer is incorporated in the differential-phase generators 17, 74 and 75. The summing circuit 82 sums the output of the synchronizer 81 for a constant period.

In the configuration of FIG. 12, the following elements are different from those in FIG. 5: the frequency error compensator 76 for generating a frequency error compensating signal from an output (Fsa) of the subtractor 18; an adder 79 for adding an output of the frequency error compensator 76 to an output (Dout) of the digital filter 20; the phase difference detector 77 for detecting an initial phase difference between outputs of the two saw-tooth-like wave generators 12, 16 from the output (Dout) of the digital filter 20; the gain controller 78 for setting an initial value and changing a loop gain from an output (DAGC) of the adder 79, an output of the phase difference detector 77, an externally provided initial value (Init), and a control signal of a control signal generator 80; a two-modulus prescaler 71 for dividing the output of the VCO 15 by a dividing ratio equal to P or P+1; and the control signal generator 80 for generating a control signal from the reference signal fr, an externally provided dividing number N, and peak signals of the respective saw-tooth-like wave generator 12, 16.

Figure 4:
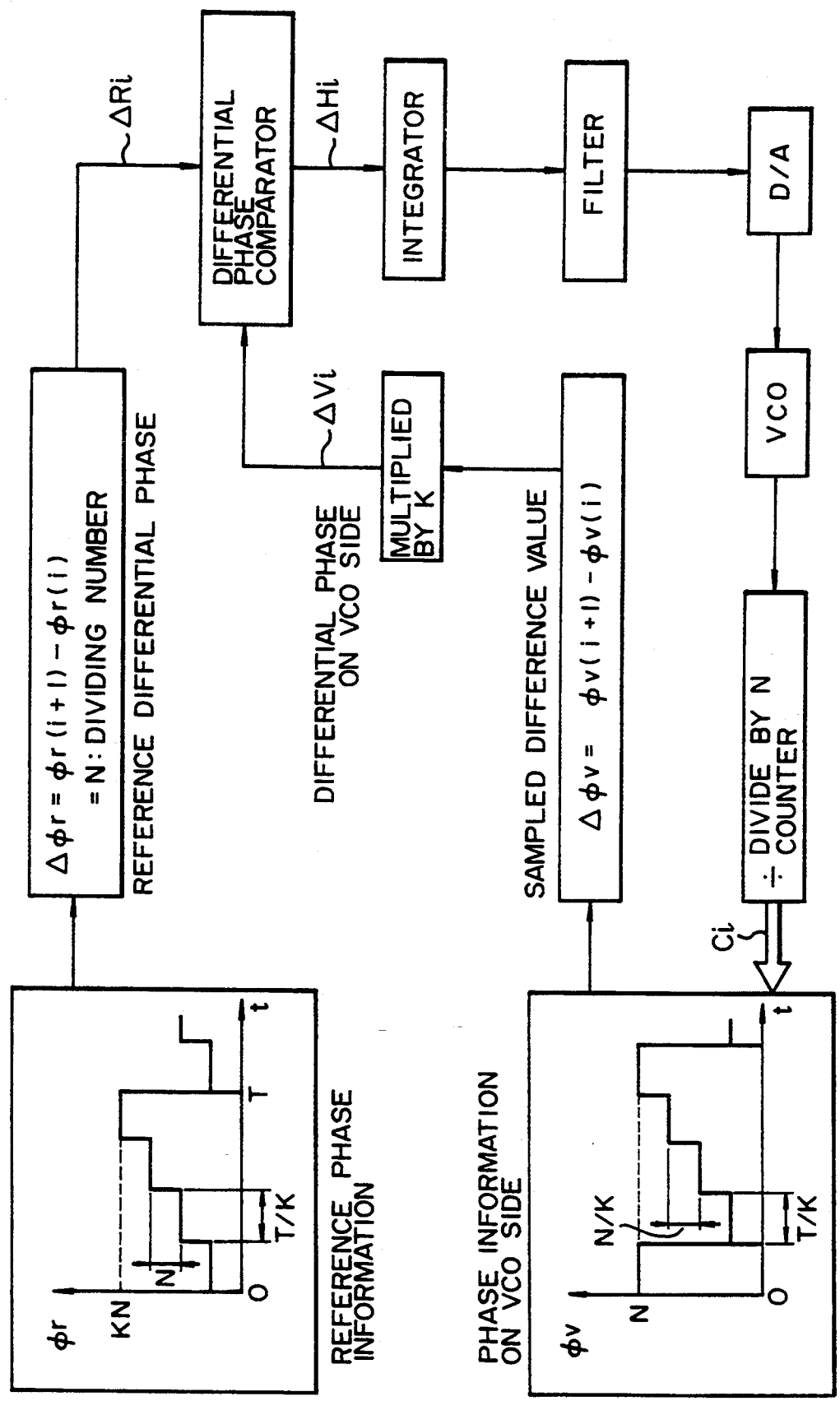
FIG. 4 is a diagram used for explaining the principle of the present invention.

Next, the operation of this embodiment will be explained. Although described herein is the case where the reference frequency fr is selected to be 12.8 MHz; the prescaler dividing ratio P to be 128; and the dividing number N to be 38,000 for the sake of explanation, it is understood that these parameters are not limited to these values, and this embodiment is operable with these parameters set to arbitrary values. This embodiment will be explained in a manner that "K" in FIG. 4 is replaced by "R2".

The saw-tooth-like wave generator 12 generates a saw-tooth-like wave having an increasing ratio, i.e., a gradient equal to the dividing number N externally given thereto at every rising edge of a clock CLKR1 which is generated by dividing the reference frequency fr by a dividing number $R_1$. The current output of the saw-tooth-like wave generator 12 is subtracted from the output of the saw-tooth-like wave generator 12 at the preceding timing by the subtract circuit 13. Therefore, the subtract circuit 13 outputs the constant value N every time the clock CLKR1 is generated. Here, a maximum value M of the saw-tooth-like wave generators 12, 16 is given by Equation 7:

$$M = N \times R_2 \qquad \text{(Equation 7)}$$

The period T of each saw-tooth-like wave is expressed by Equation 8:

$$T = R_1 \times R_2 \div fr \qquad \text{(Equation 8)}$$

In Equations 7 and 8, the dividing numbers R1 (corresponding to the dividing number of the divider 141 in FIG. 9) and R2 (corresponding to the dividing number of the divider 142 in FIG. 9) are arbitrary integers.

When the subtract circuit 13 is operated, a value N-M is generated at the output of the subtract circuit 13 at a time immediately after the output of the saw-tooth-like wave generator 12 exceeds the maximum value M. In this embodiment, M is set to zero at this timing such that the constant value N is output. In this manner, a phase jump over ±M which would be otherwise included in the phase comparison result can be prevented. Also in the saw-tooth-like wave generator 16 and the subtract circuit 97, P or P+1, which is a modulus signal (MOD) of the prescaler, is output at every rising edge of an output CLKP of the prescaler 71, similar to the operation performed by the saw-tooth-like wave generator 12 and the subtract circuit 13. Since the output of the subtract circuit 97 is not synchronized with the reference signal fr, it is converted to be synchronized therewith by the synchronizer 81 in a manner explained below.

Figure 13:
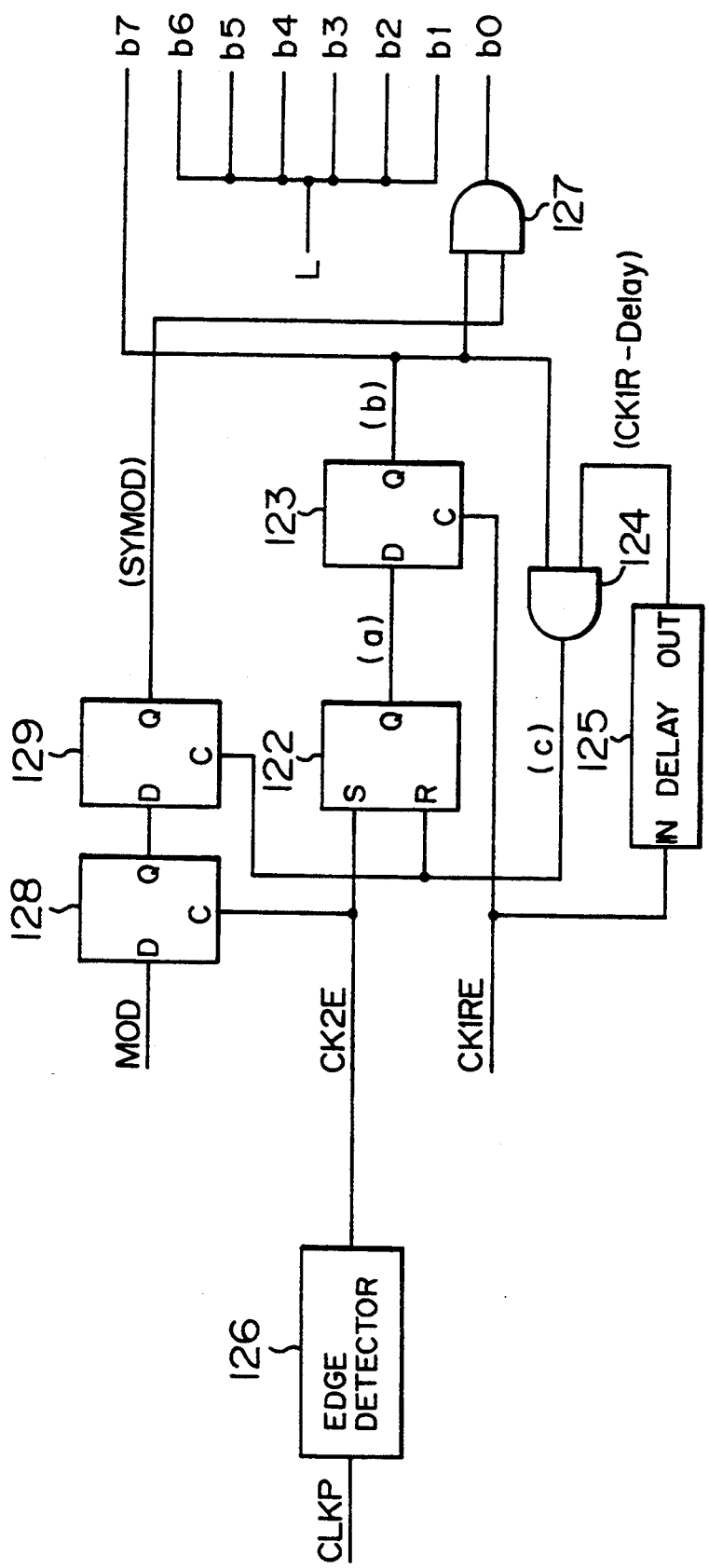
FIG. 13 is a logic circuit diagram showing a synchronizer of FIG. 12.
Figure 14:
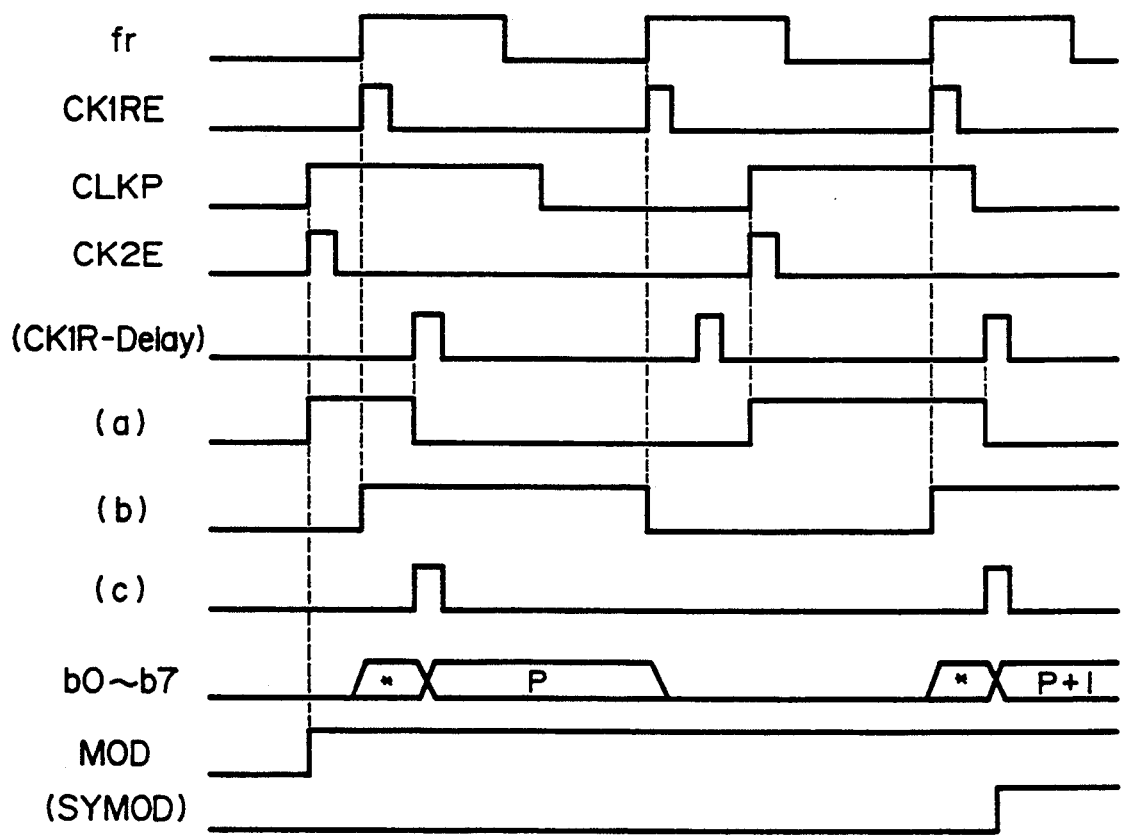
FIG. 14 shows operation timing of the synchronizer shown in FIG. 13 on its respective signal lines.

FIG. 13 is a block diagram showing the configuration of the synchronizer 81 of FIG. 12, and FIG. 14 shows timing charts for explaining the operation of the synchronizer 81.

The synchronizer 81 comprises a flip-flop 122 set by an edge signal CK2E generated by an edge detector 126 in synchronism with a rising edge of the output CLKP of the prescaler 71; a register 123 for outputting an output of the flip-flop 122 to a Q-output thereof at a rising edge CK1RE of the reference signal fr; a delay circuit 125 for delaying the edge signal CK1RE for a constant delay time; an AND circuit 124 for ANDing an output CK1R-Delay of the delay circuit 125 and an output (b) of the register 123; a register 128 for fetching a modulus signal MOD at a timing of CK2E; a register 129 for fetching an output of the register 128 at a timing of an output (c) of the AND circuit 124; and an AND circuit 127 for ANDing an output SYMOD of the register 129 and the output of the register 123. The output of the synchronizer 81 includes the most significant bit which is output from the AND circuit 127; the least significant bit which is output from the Q-output of the register 123; and other bits set at a constant value L.

The timing charts shown in FIG. 14 show CK1RE, CK2E, MOD, which are input signals to the synchronizer 81; CK1R-Delay, SYMOD, (a), (b), (C), which are internal signals thereof; and output signals b0-b7. For comparing signal positions, the reference signal fr and the output CLKP of the prescaler 71 are also shown.

CK1RE is a signal synchronized with a rising edge of the reference signal fr; CK2E is a signal synchronized with a rising edge of CLKP; and CK1R-Delay is equal to CK2E delayed by a constant time. This constant delay time may be arbitrary as long as it is larger than a delay time of the register 122. The modulus signal MOD, which varies in synchronism with the output CLKP of the prescaler 71, indicates that the dividing number of the prescaler is P when MOD is at "L" (low level) and that the dividing number of the prescaler is P+1 when MOD is at "H" (high level).

At a rising timing of CK2E, the output Q of the flip-flop 122 becomes. "H". Since the fetching clock CK1RE of the register 123 to which the output Q of the flip-flop 122 is connected is a signal synchronized with the reference signal fr, the Q-output (a) of the flip-flop 122 is fetched and delivered to the Q-output (b) of the register 123 at a frequency of 12.8 MHz in this embodiment. If a rising edge of CK1RE occurs with the output (a) of the flip-flop 122 being at "H", the Q-output (b) of the register 123 becomes "H". Next, when the Q-output (b) of the register 123 is at "H", the output (c) of the AND circuit 124 becomes "L" since the delay signal CK1R-Delay is output to cause the Q-output (a) of the flip-flop 122 to be reset.

Conversely, if a rising edge of CK1RE occurs with the output (a) of the flip-flop 122 being at "L", the Q-output (b) of the register 123 becomes "L", and the output (c) of the AND circuit 124 and the Q-output (a) of the flip-flop 122 remain at "L". A condition for a rising edge of CK1RE to occur when the output (a) of the flip-flop 122 is at "L" is that no rising edge of CLKP has occurred from the preceding rising edge to the current rising edge of CK1RE.

The operation of the synchronizer 81 is such that the Q-output of the register 123 becomes "L" when no rising edge of CLKP has occurred from the preceding rising edge to the next rising edge of CK1RE and becomes "H" when a rising edge of CLKP has occurred in that period. As a result, CLKP, which is originally asynchronous with the reference signal fr, is converted to a signal synchronized with the same.

Next, the output of the synchronizer 81 is supplied to the summing circuit 82. The summing circuit 82 sums the output of the synchronizer 81 for a constant period. The constant period, herein indicated, is assumed to be $R_1$ in order to coincide the output of the synchronizer 81 with the output timing of the subtract circuit 13. Therefore, a transfer function of this summing circuit 82 is given by Equation 9:

$$S(z) = \sum_{i=1}^{R_1} z^{-i} \qquad \text{(Equation 9)}$$

The output of the summing circuit 82 is supplied to the subtractor 18 to calculate the difference of the same with the output of the subtract circuit 13. The output of the subtractor 18 indicates the difference in gradient between the two saw-tooth-like waves outputted from the saw-tooth-like wave generators 12, 16, respectively. That is, if the output of the subtractor 18 is differentiated, a value proportional to a frequency difference from the reference signal fr is derived.

Next, the output (Fsa) of the subtractor 18 is supplied to the integrator 19 and the frequency error compensator 76.

The signal supplied to the integrator 19 will be explained first. Since the integrator 19 functions to integrate frequency error components, an output of the integrator 19 indicates phase difference components between the two saw-tooth-like waves. A transfer function of the integrator 19 is expressed by Equation 10:

$$T(z) = \frac{z^{-1}}{1 - z^{-1}} \qquad \text{(Equation 10)}$$

Next, the output of the integrator 19 is supplied to the digital filter 20. The digital filter is provided for limiting a bandwidth of the phase difference components outputted from the integrator 19. Although the configuration of the digital filter is not particularly specified, an optimal selection should be made in consideration of the relationship between phase jitter components included in the synthesizer output signal (SYN) and the settling speed of the synthesizer. In this embodiment, a moving average configuration was selected because of its easy implementation. Equation 11 represents a transfer function of the digital filter 20. A range for calculating a moving average is selected to be equal to the period T of the saw-tooth-like wave generators 12, 16.

$$U(z) = \sum_{i=1}^{R_2} z^{-i}$$ (Equation 11)

where $R_2$ is expressed by Equation 12:

$$R_2 = \frac{T}{f_r \times R_1}$$ (Equation 12)

The output (Dout) of the digital filter 20 is added to the output of the frequency error compensator 76 in the adder 79, and the sum is supplied to the gain controller 78.

Figure 15:
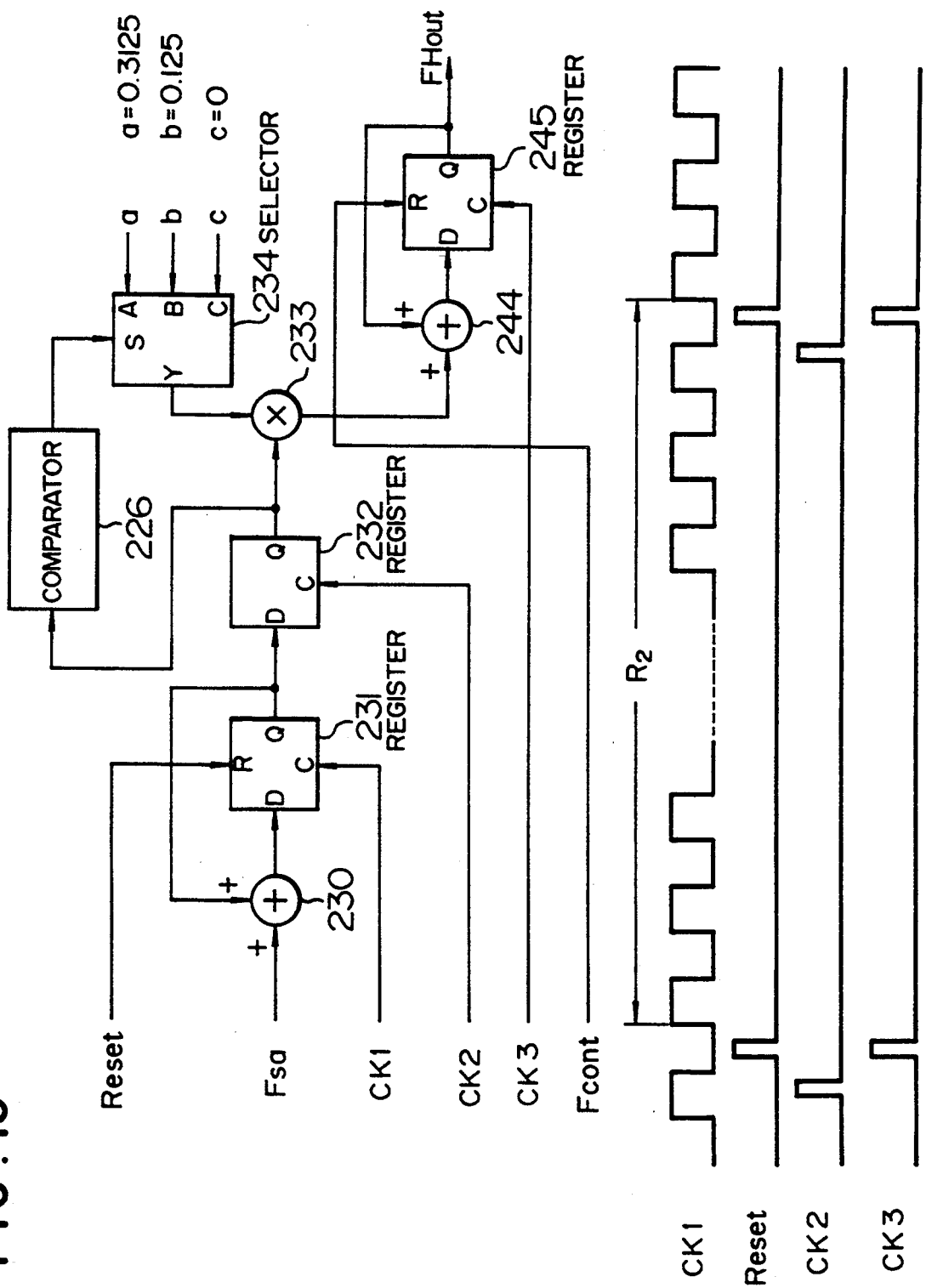
FIG. 15 shows the configuration of a frequency error compensator and operation timing of signals on its respective signal lines.

FIG. 15 shows a block diagram of the configuration of the frequency error compensator 76 in FIG. 12 and timing charts for explaining the operation thereof.

One of branched outputs Fsa of the subtractor 18 is supplied to the frequency error compensator 76. The frequency error compensator 76 comprises an adder 230 and a register 231 for accumulating the output Fsa; a register 232 for fetching a Q-output of the register 231; a comparator 226 supplied with a Q-output of the register 232 for selecting a multiplying factor to be multiplied by the Q-output of the register 232; a selector 234 for selecting a desired factor in accordance with an output of the comparator 226; a multiplier 233 for multiplying an output of the selector 234 by the Q-output of the register 232; and an adder 244 and a register 245 for integrating an output of the multiplier 233. Although four operation clocks Reset, CK1, CK2, CK3 shown in FIG. 15 are omitted in FIG. 12, they are all supplied from the timing clock generating unit 14. Also, a control signal Fcont is supplied from the outside for controlling the operation of the frequency error compensator 76.

Next, the operation of the frequency error compensator 76 will be explained.

The signal Fsa supplied to the frequency error compensator 76 and the Q-output of the register 231 are added by the adder 230. An output of the adder 230 is again fetched into the register 231 at a timing of CK1. Since register 231 is reset by the clock RESET, a number of additions equal to the number of CK1 included between two adjacent clocks RESET are performed. Also, the Q-output of the register 231 is fetched into the register 232 at a timing of CK2 before the register 231 is reset. Thus, the register 231 accumulates a value proportional to frequency error components for a constant period. While the constant period is not particularly restricted, a period coincident to the period T of the saw-tooth-like wave is selected therefor and the "number of additions is selected to be $R_2$ expressed by Equation 12 in this embodiment.

The Q-output of the register 232 is supplied to the multiplier 233 as well as to the comparator 226. The relationship between a frequency error $\Delta f$ and a value X in the register 232 is expressed by Equation 13:

$$\Delta f = \frac{X}{T \times R_1 \times R_2}$$ (Equation 13)

The comparator 226 is constructed to vary an addition ratio of a compensating value in accordance with the magnitude of the frequency error $\Delta f$. This embodiment shows an example where threshold values for the frequency error $\Delta f$ are set at ±300 kHz and ±150 kHz. Using Equation 13, values to be compared are ±24,576 and ±12,288. The comparator 226 is constructed to express these values in binary code and only compare the upper eight bits thereof.

FIG. 16 shows a truth table of the comparator 226 shown in FIG. 15. A coefficient A is selected when X<−24,576 or X>+24,576, while a coefficient b is selected when −24,576<X<−12,288 or 12,288<X-<24,576. Also, a coefficient c is selected when −12,288<X<12,288.

The value of a selected coefficient depends on a realized settling speed and is not particularly restricted.

A selecting signal is outputted from the comparator 226, and a coefficient is selected by the selector 234 and supplied to one input to the multiplier 33. An output of the multiplier 233 is supplied to the adder 244. The adder 244 and the register 245 constitute an integrator which stores a frequency compensating value. Also, the register 245 is reset by the control signal Fcont.

The output FHout of the frequency error compensator 76 is added to the output of the digital filter 20 by the adder 79 and supplied to the gain controller 78.

Figure 17:
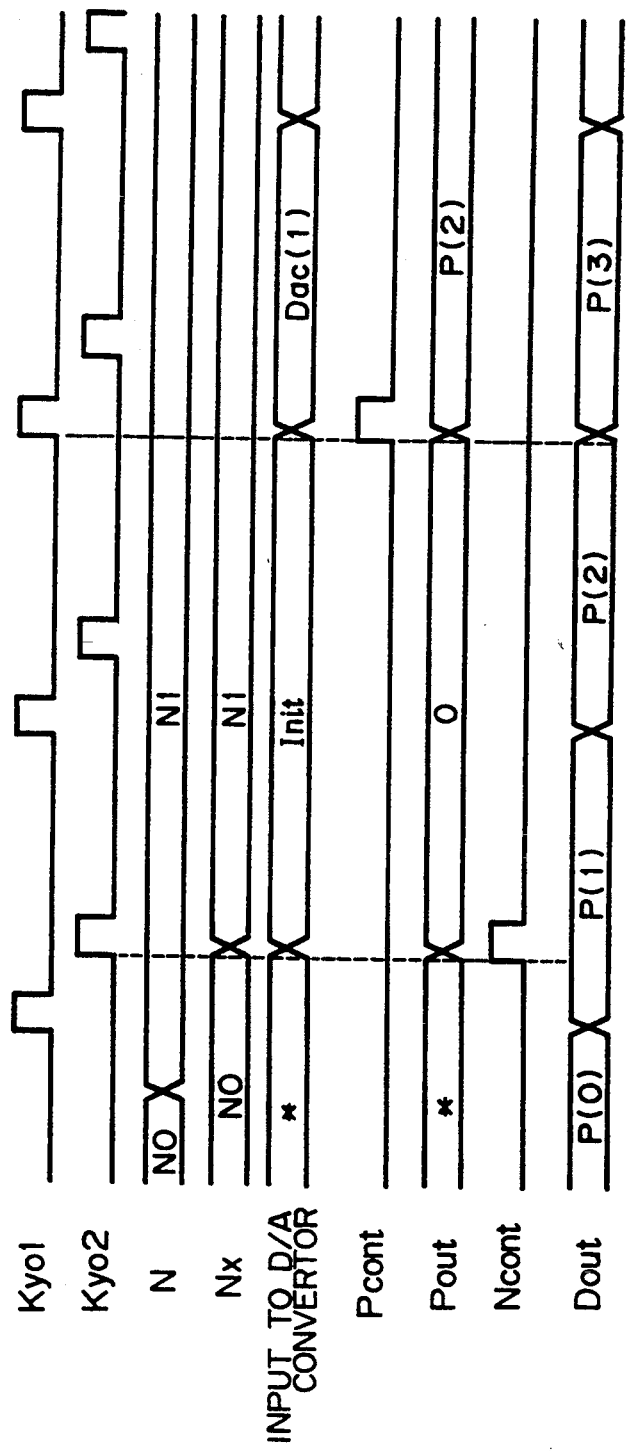
FIG. 17 shows operation timing of signals related to a phase difference detector of FIG. 12.

FIG. 17 shows a procedure of detecting a phase difference in the outputs of the saw-tooth-like wave generators 12, 16 in FIG. 12. Specifically, FIG. 17 illustrates timing charts of a clock $K_{yo1}$ indicative of peak timings of the saw-tooth-like wave generator 12; a clock $K_{yo2}$ indicative of peak timings of the saw-tooth-like wave generator 16; the externally provided dividing number N; an internal dividing number Nx of the saw-tooth-like wave generator 16; the input to the D/A convertor 21; a phase difference detecting signal Pcont; a phase difference detecting output Pout; a dividing number control signal Ncont; and the output Dout of the digital filter 20.

The period of the clock $K_{yo2}$ indicative of peak timings of the saw-tooth-like wave generator 16 is substantially equal to the period T of the clock $K_{yo1}$ indicative of peak timings of the saw-tooth-like wave generator 12, but these two clocks are asynchronous with each other. For this reason, when the externally provided dividing number N is switched from N0 to N1 as shown in FIG. 17, the gradient of the saw-tooth-like wave changes in the middle of the saw-tooth-like wave, thus incurring a problem of discontinuous operation. To avoid this problem, the dividing number control signal Ncont is generated at the timing of the clock $K_{yo2}$, immediately after the dividing number is switched, to update the internal dividing number Nx of the saw-tooth-like wave generator 16. Simultaneously with this update timing, the input to the D/A convertor 21 is switched to the externally provided initial value Init, and the output Pout of the phase difference detector 77 is reset. After two pulses of the clock $K_{yo1}$ from this state, the phase difference detecting signal Pcont is generated. The input to the D/A convertor 21 during this time is fixed to the externally provided initial value Init. In this manner, the phase difference can be detected for at least one period of the saw-tooth-like wave. Since the phase difference between the two saw-tooth-like waves is output from the digital filter 20 in synchronism with the clock $K_{yo1}$, this value is held in the phase difference detector 77 using the phase difference detecting signal Pcont. Therefore, if a sequence of the outputs Dout of the digital filter 20 are designated P(0), P(1), P(2), . . . . from the point at which the externally provided dividing number N is switched, P(2) is stored in the phase difference detector 77. This output Pout of the phase difference detector 77 is used to compensate for the input to the D/A convertor 21. A compensating value is determined by the gain controller 78.

FIG. 18 is a block diagram showing the configuration of the gain controller 78 of FIG. 12, and FIG. 19 shows timing charts for explaining a loop gain control operation.

The gain controller 78 has two functions: a function of setting the initial value Init compensated by the output Pout of the phase difference detector 77 and a function of changing a loop gain by an externally provided gain control signal Gain.

The gain controller 78 comprises a gain specifying circuit 235 for specifying a gain in accordance with the gain control signal Gain; a multiplier 238 for multiplying an input signal DAGC to the gain control circuit 235 by a gain specified by the gain specifying circuit 235; an adder 239 for adding an output of the multiplier 238 and an output of a compensating value storing circuit 236; a multiplier 237 for multiplying an output of the multiplier 238 by a constant $\beta$; an adder 240 for adding an output of the multiplier 237 and an output of the compensating value storing circuit 236; a multiplier 246 for multiplying the output Pout of the phase difference detector 78 by an output of the gain specifying circuit 235; a subtractor 41 for calculating the difference between the externally provided initial value Init and an output of the multiplier 246; a selector 242 for switching an output of the subtractor 241 and an output of the adder 240; the compensating value storing circuit 236 for preserving an output of the selector 242; and an OR circuit 243 for generating a timing signal for fetching an input to the compensating value storing circuit 236 from the gain control signal Gain, a phase compensation control signal Pget and the dividing number control signal Ncont.

The operation of the gain controller 78 will now be explained with reference to the timing charts of FIG. 19. The gain control signal Gain is a signal indicative of a timing for switching the loop gain. The gain control signal Gain is supplied to the gain specifying circuit 235 to update an output of the gain controller 78 in accordance with a predetermined gain switching width $\alpha$ at a rising edge of the gain control signal Gain. Although the gain switching width $\alpha$ need not be fixed to a particular value, it is set to 0.5 in this embodiment.

The gain specifying circuit 235 is first reset by the dividing number control signal Ncont, which results in outputting zero, whereby the output of the multiplier 238 also becomes zero. The externally provided initial value Init is supplied to the compensating value storing circuit 236 through the adder 241 and the selector 242 since the output of the phase difference detector 77 is zero, and a phase/gain control signal PGcont is at "H" at a timing of the dividing number control signal Ncont. Here, suppose that the selector 242 selects a signal supplied to a B-input terminal to be output to a Y-output terminal when a signal at an S-input terminal is at "H", and a signal supplied to an A-terminal when the signal at the S-input is at "L". The foregoing operation causes the gain controller 78 to output the externally provided initial value Init.

A value $H_{OS}(0)$ stored in the compensating value storing circuit in this event is given by Equation 14:

$$H_{OS}(0) = I_{nit} \qquad \text{(Equation 14)}$$

Next, when the phase difference detection ends, the phase difference detecting signal Pcont of FIG. 17 is generated. This phase difference detecting signal Pcont is a timing indicative of the completion of a phase difference detection. Simultaneously with this timing of establishing the phase difference, the output of the gain specifying circuit 235 is changed to a predetermined value. Since this value depends on the settling speed, it is not particularly specified. However, it is set to "1" in this embodiment for simplicity. Next, the output Pout of the phase difference detector 77 is multiplied by the predetermined value from the gain specifying circuit 235 in the multiplier 246. Then, the subtractor 241 subtracts the initial value Init from the output of the multiplier 246. An output of the subtractor 241 is supplied to the compensating value storing circuit 236 through the selector 242 and held in the compensating value storing circuit 236 by the phase compensation control signal Pget which has provided a delay to the phase difference detecting signal Pcont.

As a result of the operation described above, a value $H_{OS}(1)$ held in the compensating value storing circuit 236 is a value calculated by subtracting the output of the phase difference detector Pout from the initial value Init, as expressed by Equation 15:

$$H_{OS}(1) = I_{nit} - P_{out} \qquad \text{(Equation 15)}$$

On the other hand, since the phase difference between the two saw-tooth-like waves generated by the saw-tooth-like wave generators 12, 16 do not abruptly vary, the value held in the compensating value storing circuit 236 is added to the next sample input DAGC by the adder 239 to cancel the phase difference value, whereby a settling operation is started on the basis of the externally provided initial value Init.

Next, the first gain switching will be explained.

First, the phase/gain control signal PGcont changes from "H" to "L" to cause the selector 242 to select a signal at the A-terminal to be delivered to the Y-output. A timing at which the phase/gain control signal PGcont changes may be any time as long as it is after the generation of the phase compensation control signal Pget which acts to store the phase difference detecting result in the compensating value storing circuit. Next, the output of the multiplier 238 is multiplied by a constant $\beta$ in the multiplier 237. The constant $\beta$ is given by $\beta = 1 - \alpha$. Since this embodiment is explained for the case where $\alpha$ is set to 0.5, $\beta$ is also 0.5. The output of the multiplier 237 is added to the output of the compensating value storing circuit 236 in the adder 240. When the gain control signal is supplied, the output of the selector 242 is fetched into the compensating value storing circuit 236 at a rising edge thereof, and simultaneously the output of the gain specifying circuit 235 is updated to be $\alpha$ times as much as the previous value. Then, the updated output of the gain specifying circuit 235 is multiplied by the input to the gain specifying circuit 78 in the multiplier 238. The output of the multiplier 238 is added to the output of the compensating value storing circuit 236, and the addition value is supplied to the D/A convertor 21.

The above described operation processes will be explained using the following equations. Assume that the result of comparing the two saw-tooth-like waves before switching the gain is represented by DAGC(0); the result of comparing the two saw-tooth-like waves after switching the gain by DAGC(1); a compensated initial value before switching the gain by $H_{OS}(1)$; and the compensated value after-switching the gain by $H_{OS}(2)$.

The output G of the multiplier 238 at this time is expressed by Equation 16 using the input DAGC(1) of the gain specifying circuit 78:

$$G = DAGC(1) \times \alpha \quad \text{(Equation 16)}$$

A feedback signal $D_{ac}(0)$ before switching the gain is expressed by Equation 17:

$$D_{ac} = H_{OS}(1) + DAGC(0) \quad \text{(Equation 17)}$$

At this time, the compensating value $H_{OS}(1)$ is changed as shown in Equation 18, due to the operation performed by the multiplier 237 and the adder 240, to calculate a new compensating value $H_{OS}(2)$:

$$H_{OS}(2) = H_{OS}(1) + (1-\alpha) \times DAGC(0) \quad \text{(Equation 18)}$$

Next, the output G of the multiplier 238 after switching the gain shown by Equation 16 and the compensating value $H_{OS}(2)$ after switching the gain are added by the adder 239 to derive a feedback signal $D_{ac}(1)$ after switching the gain, as shown in Equation 19:

$$\begin{aligned} D_{ac}(1) &= G + H_{os}(2) \\ &= H_{os}(1) + DAGC(0) + \alpha \times (DAGC(0) - DAGC(1)) \\ &= D_{ac}(0) + \alpha \times (DAGC(0) - DAGC(1)) \end{aligned} \quad \text{(Equation 19)}$$

Thus, it will be understood from Equation 19 that feedback signals subsequent to $D_{ac}(1)$ maintains the continuity with the value before switching the gain, and the loop gain can be multiplied by $\alpha$.

The gain switching is similarly performed subsequent to the second time, where the continuity with values before switching the gain can be maintained. The gain can therefore be switched in the form of 1, $\alpha$, $\alpha^2$, $\alpha 3$, . . . .

The output of the gain controller 78 having a loop gain set therein is converted to an analog signal by the D/A convertor 21, and supplied to a frequency control terminal of the VCO 15 as a control signal. The output of the VCO 15 is branched such that one is output as the output (SYN) of the frequency synthesizer while the other is supplied to the prescaler 71. The prescaler 71 performs a frequency division by a predetermined dividing number (P or P+1) by the modulus signal (MOD) provided from the saw-tooth-like wave generator 16. The output of the prescaler 71 is supplied to the saw-tooth-like wave generator 16. This sequence of the feedback loop enables the frequency synthesizer to generate an oscillating signal at a predetermined oscillating frequency.

While this embodiment has been explained for the case where the prescaler 71 has two dividing numbers, the present invention is not limited to this and may be applicable to a prescaler having a constant dividing number. Such an embodiment is shown in FIG. 20. The configuration of FIG. 20 differs from that of FIG. 12 in that no control signal is supplied from the saw-tooth-like wave generator 16 to the prescaler 71, and a value B reciprocally proportional to a dividing number is provided to the saw-tooth-like wave generator 16 from the outside. The rest of the configuration is the same so that explanation thereof will be omitted. It should be noted that the prescaler is required when signals at frequencies of more than several hundreds MHz are oscillated, and may be omitted if signals at lower frequencies are to be oscillated.

FIG. 21 shows an embodiment in which the present invention is applied to a conventional frequency synthesizer. In this embodiment, the subtract circuits 13, 97 and the integrator 19 of FIG. 12 are removed, and a compensating circuit 83 and a subtract circuit 84 are newly provided. The compensating circuit 83 is inserted between the output of a subtractor 18 and a digital filter 20, while the subtract circuit 84 is inserted between the output of the subtractor 18 and a frequency error compensator 76. The compensating circuit 83 has a function of compensating for a phase jump over $\pm M$ caused by the phase difference between outputs of saw-tooth-like wave generators 12, 16. This function can be easily realized by utilizing an overflow if the value M is selected as two to the $n^{th}$ power.

FIG. 22 shows another embodiment of the present invention which includes a bit number reducing circuit. Portions performing the same functions as constituents of FIG. 12 are designated the same reference numerals and explanation thereof will be omitted. Hereinafter, explanation will be given of portions different from the circuit configuration of FIG. 12.

An output of a synchronizer 81 is supplied to a subtractor 18 which calculates the difference between this output and an output of a subtract circuit 13. An output of the subtractor 18 indicates the difference in gradient between two saw-tooth-like waves from two saw-tooth-like wave generators 12, 16. In other words, differentiating the output of the subtractor 18, a value proportional to a frequency difference relative to the reference frequency fr is derived.

Next, the output Fsa of the subtractor 18 is supplied to an integrator 19 and a frequency error compensator 76.

Explanation will be first given of how the signal Fsa supplied to the integrator 19 is processed therein. Since the integrator 19 is provided for integrating frequency error components, it outputs phase difference components in the two saw-tooth-like waves. A transfer function of the integrator 19 is given by Equation 20:

$$T(z) = \frac{z^{-1}}{1 - z^{-1}} \quad \text{(Equation 20)}$$

The output of the integrator 19 is supplied to a decimeter 62. The decimeter 62 is a filter having a transfer function given by Equation 21 for reducing the sampling rate:

$$S(z) = \sum_{i=1}^{R_1} z^{-i} \quad \text{(Equation 21)}$$

An output of the decimeter 62 is supplied to the digital filter 20. The function of the digital filter 20 is the same as that shown in FIG. 12.

Next, explanation will be given of the reason for which the bit reducing circuit is provided.

When a VCO is controlled using a D/A converter, the resolution of the D/A converter is a factor for determining the frequency setting accuracy of a frequency synthesizer. For example, with a VCO having a variable control range of frequency extending over 40 MHz, if a setting accuracy of 100 Hz or less is to be achieved, a D/A convertor requires 19 bits or more. Since reduction of size and power consumption is a critical problem for mobile communication equipments, there is a demand for integrating a frequency synthesizer on a semiconductor substrate. However, since it is difficult to realize a D/A convertor with 19 bits or more due to a limit of the element accuracy in semiconductors, the number of bits subjected to D/A conversion has conventionally been divided in an appropriate manner. For example, 19 bits are divided into 12 bits and 7 bits which are respectively processed by a 12-bit D/A convertor and a 7-bit D/A convertor, the outputs of which are added to produce a final analog converted value. In this manner, the number of bits of each D/A convertor is reduced. However, the addition causes discontinuity to occur in the quantization level, which hinders a desired frequency setting accuracy when such separate D/A convertors are used in a frequency synthesizer.

To solve the above problem, in this embodiment, a bit number reducing circuit for converting an input signal having a data word length of a constant number of bits to a signal with a smaller number of bits is formed by a first quantizer for quantizing an input signal; a noise shaping circuit receiving the difference between an output of the first quantizer and the input signal; a delay circuit for delaying the output of the first quantizer; and an adder for adding an output of the delay circuit and an output of the noise shaping circuit. More specifically, the first quantizer is used to reduce an effective number of bits. The difference between the output of the first quantizer and the input signal is supplied to the noise shaping circuit. Then, a second quantizer is used to reduce the number of bits to the same number as the first quantizer. Thereafter, the output of the first quantizer is compensated by the noise shaping circuit to thereby reduce the bit number.

The principle of this bit reduction may be explained in the following manner.

Assume first that an input signal to the bit number reducing circuit is represented by x; an output of the first quantizer by y; the output of the noise shaping circuit by e; and an output of the bit number reducing circuit by DA.

In the first quantizer, the input signal x has its lower bits removed. An error (b) in this event is expressed by Equation 22:

$$b = x - y \quad \text{(Equation 22)}$$

The error b is supplied to the noise shaping circuit. A transfer function of the noise shaping circuit is expressed by Equation 23:

$$e = bz^{-i} + (1-z^{-1})^i Nq \quad \text{(Equation 23)}$$

where Nq represents quantization noise caused by the second quantizer disposed in the noise shaping circuit; and i an order number of the noise shaping circuit, which is equal to one (i=1) when the noise shaping circuit is of the first order, and two (i=2) when it is of the second order. This corresponds to the number of integrators in the circuit configuration.

The output y of the first quantizer is given an amount of delay corresponding to the order number of the noise shaping circuit in order to coincide an amount of delay in the output y with that in the output e of the noise shaping circuit.

Since the delayed output y and the output e of the noise shaping circuit are added, the output DA of the bit number reducing circuit is given by Equation 24:

$$\begin{aligned} DA &= yz^{-i} + e \\ &= xz^{-i} + (1-z^{-1})^i Nq \end{aligned} \quad \text{(Equation 24)}$$

It will be appreciated from Equation 24 that the output DA of the bit number reducing circuit is a signal which includes the delayed input x and the quantization noise (Nq), generated in the second quantizer, multiplied by a noise-shaped frequency characteristic. Next, an analog signal converted from the output DA may pass through a low pass filter having a desired low pass characteristic to suppress the quantization noise. It is therefore possible to create a circuit which can effectively reduce quantization noise in a desired frequency band. Here, the quantization noise multiplied by the noise-shaped frequency characteristic is distributed so as to have a peak at a frequency half the sampling frequency.

The technique of utilizing a noise shaping effect to a D/A convertor is described in Yasuyuki Matsuya, "A 17-bit Oversampling D-to-A Conversion Technology Using Multistage Noise Shaping", IEEE Journal of Solid-State Circuit, vol. 24, No. 4, Aug. 1989, and Kuniharu Uchimura, "Oversampling A-to-D and D-to-A convertors with Multistage Noise Shaping Modulators", IEEE Transaction on Acoustics, Speech, and Signal Processing, Vol. 36, No. 12, Dec. 1988.

Therefore, when the thus configured bit number reducing circuit utilizing the noise shaping effect is used to convert frequency data with a fine resolution, which would otherwise require a D/A convertor of 19 bits or more, to a digital signal with a reduced number of bit, and a low pass filter is used after the bit reduced digital signal is D/A converted, quantization noise converted to a high frequency range by the noise shaping is suppressed by the low pass filter, whereby even if a D/A convertor with a reduced number of bits is used in a frequency synthesizer, an effectively improved resolution is realized in the frequency synthesizer.

In the frequency synthesizer of FIG. 22, a circuit for controlling an oscillating frequency of the VCO 15 comprises a bit number reducing circuit 53; a D/A convertor 21 for converting an output of the bit number reducing circuit 53 to an analog signal; and a low pass filter 54 receiving an output of the D/A convertor 21.

FIG. 23 is a block diagram illustrating the configuration of an embodiment of the bit number reducing circuit 53 shown in FIG. 22.

The embodiment shown in FIG. 23 enables a 19-bit input signal, for example, to be represented with 12 bits. The bit number reducing circuit 53 is constructed to regard lower seven bits (b) of a 19-bit input signal (DAC) as an error, express the lower seven bits with one bit (e) by a noise shaping circuit, add the one-bit signal to the upper 12 bit signal (y), and supply this to a D/A convertor 21.

The bit number reducing circuit 53 performs the bit number reduction while maintaining an effective accuracy of the output of a gain controller 78 in which a loop gain has been set.

The bit number reducing circuit of FIG. 23, employing a first-order Δ-Σ type oversample noise shaping circuit, comprises an adder 65 for adding a periodically varying dither Qn to the output DAC of the gain controller 78; a first quantizer 55 coupled to receive an output of the adder 65 for removing a predetermined number of lower bits; a delay circuit 56 for giving an output of the quantizer 55 a predetermined amount of delay; a subtractor 57 for subtracting the output of the quantizer 55 from the output DAC of the gain controller 78; another subtractor 59 for subtracting an output of a second quantizer 61 from an output (b) of the subtractor 57; an integrator 60 for integrating an output of the subtractor 59; the second quantizer for quantizing an output of the integrator 60; and an adder for adding an output (e) of the quantizer 61 and an output of the delay circuit 56.

Next, the operation of the bit number reducing circuit 53 will be explained. While an operation speed of the bit number reducing circuit 53 is not particularly specified, it is set, in this embodiment, to fr/4, which is sufficiently shorter than the period of saw-tooth-like waves generated by the saw-tooth-like wave generators 12, 16.

The periodically varying wave Qn is called "dither" and serves to enhance the noise shaping effect. Since the dither is added if necessary, it will not cause any problem when it is not utilized. The magnitude of the dither may be arbitrary as long as it does not adversely affect signal components. Here, it is set to a quarter of a number of bits truncated by the quantizer 55. Next, the output of the adder 65 is subjected to removal of a number of lower bits by the quantizer 55. The number of bits required to the signal DAC is 19 or more for achieving a resolution of 100 Hz or less, supposing that a frequency varying range of the VCO extends over 40 MHz. While the number of bits removed by the quantizer 55 is not particularly limited, it is restricted by the performance of the low pass filter 54 for suppressing high frequency noise with its low pass characteristic. Here, the cut-off frequency of the low pass filter 54 is set to 10 kHz and a number of bits to be removed to seven such that deviated frequency due to this high frequency noise will not exceed 30 Hz. While there are some bit removing methods such as round-off, truncation and so on, any method may be employed for this case.

The difference between the signal (y) having lower bits removed by the quantizer 55 and the output DAC is calculated by the subtractor 57. The output (b) of the subtractor 57 represents a quantization error caused by the quantizer 55. Next, the output (b) is supplied to a first-order Δ-Σ oversample noise shaping circuit formed by the subtractor 59, the integrator 60 and the quantizer 61. The output (e) of the first-order Δ-Σ oversample noise shaping circuit is given by the Equation 25 with i being one:

$$e = bz^{-1} + (1-z^{-1})Nq \qquad \text{(Equation 25)}$$

where Nq represents quantization noise generated by the quantizer 61, and $z^{-1}$ a sampling period.

On the other hand, the output (y) of the first quantizer 55 is given a delay corresponding to the sampling period by the delay circuit 56. Since the output (e) is added to the output (y) of the first quantizer 55 delayed by one sample period by the adder 58, the output DA of the bit number reducing circuit 53 is given by the Equation 26 with i being one:

$$\begin{aligned} DA &= yz^{-1} + e \\ &= xz^{-1} + (1-z^{-1})Nq \end{aligned} \qquad \text{(Equation 26)}$$

The quantization noise Nq generated by the quantizer 61 is uniformly distributed over a zone half the sampling period.

The output of the bit number reducing circuit 53 is converted to an analog signal by the D/A convertor 21. The analog output of the D/A convertor 21 is supplied to the low pass filter 54. Thus, as indicated by Equation 24, the quantization noise is shaped to move to a higher frequency region by the frequency characteristic of $(1-z^{-1})$, so that such high frequency noise components can be suppressed by the low pass filter having a cut-off frequency sufficiently lower than the sampling period.

FIG. 24 is a block diagram showing the configuration of another embodiment of the bit number reducing circuit 53 in FIG. 22. This embodiment employs a second-order Δ-Σ oversampling noise shaping circuit. This bit number reducing circuit using the second-order Δ-Σ oversampling noise shaping circuit comprises an adder 65 for adding a periodically varying dither Qn to an output DAC of a gain controller 78; a first quantizer 55 coupled to receive an output of the adder 65 for removing a predetermined number of lower bits from the output; a delay circuit 56 for delaying an output of the quantizer 55 by a predetermined delay amount; a subtractor 57 for subtracting the output of the quantizer 55 from the output DAC of the gain controller 78; a subtractor 59 for subtracting an output of a second quantizer 61 from an output of the subtractor 57; a first integrator 60 for integrating an output of the subtractor 59; a subtractor 64 for subtracting an output of a double-gain circuit 63 from an output of the subtractor 64; a second integrator 62 for integrating an output of the second quantizer 61; the second quantizer 61 for quantizing an output of the integrator 62; the double-gain circuit 63 for doubling the gain of the output of the quantizer 61; and an adder 58 for adding the output of the quantizer 61 and an output of the delay circuit 56.

Similarly to the bit number reducing circuit of FIG. 23, the periodically varying wave Qn is added to the input signal DAC by the adder 65. The output of the adder 65 is supplied to the quantizer 55 to remove lower bits thereof. The difference between the signal (y) having lower bits removed by the quantizer 55 and the input signal DAC is calculated by the subtractor 57. The output (b) of the subtractor 57 represents quantization error caused by the quantizer 55. Next, the output (b) is supplied to the second-order Δ-Σ oversampling noise shaping circuit formed by the subtractor 59; the first integrator 60; the subtractor 64; the second integrator 62; the second quantizer 61; and the gain circuit 63. The output (e) of the second-order Δ-Σ oversampling noise shaping circuit is given by Equation 27:

$$e = bz^{-2} + (1-z^{-1})^2 Nq \qquad \text{(Equation 27)}$$

On the other hand, the output (y) of the first quantizer 55 is given a delay corresponding to double the sampling frequency by the delay circuit 56. The output (e) of the second-order Δ-Σ oversampling noise shaping circuit is next added to the output (y) of the quantizer 55 delayed by two sample periods by the adder 58, so that the output DA of the bit number reducing circuit 53 is given by Equation 28:

$$DA = yz^{-2} + e \qquad \text{(Equation 28)}$$
$$= xz^{-2} + (1 - z^{-1})^2 Nq$$

When the second-order Δ-Σ oversampling noise shaping circuit is used, the quantization noise Nq generated by the quantizer 61 is multiplied by a second-order frequency characteristic as indicated by Equation 28, so that the low pass characteristic required to the low pass filter 54 can be eased.

Further, the output of the low pass filter 54 is supplied to a frequency control terminal of the VCO 15 as a control signal therefor. The output of the VCO 15 is branched, where one is output as the frequency synthesizer output SYN, while the other is supplied to the prescaler 71. The prescaler 71 divides the input from the VCO by a predetermined dividing number (P or P+1) using a modulus signal MOD provided from the saw-tooth-like wave generator 16. The output of the prescaler 71 is supplied to the saw-tooth-like wave generator 16. This sequence of a feedback loop constitutes the frequency synthesizer which can generate an oscillating signal at a predetermined oscillating frequency.

While this embodiment has been explained for the case where the prescaler 71 has two dividing numbers, the present invention is not limited to this, and may be applied to the case where a prescaler has a constant dividing number.

FIG. 25 is a block diagram showing the configuration of another embodiment in which the present invention is applied to a conventional frequency synthesizer. The configuration shown in FIG. 25 differs from the embodiment shown in FIG. 22 in that no control signal is supplied from the saw-tooth-like wave generator 16 to the prescaler 71 in FIG. 22, and instead a value B reciprocally proportional to the dividing number is provided from the outside. The rest of the configuration is the same so that explanation of the operation thereof will be omitted.

FIG. 26 is a block diagram showing the configuration of another embodiment in which the present invention is applied to a conventional frequency synthesizer. Similarly to FIG. 21, the subtract circuits 13, 97 and the integrator 19 in FIG. 22 are removed, and instead a compensating circuit 83 and a subtract circuit 84 are added. The compensating circuit 83 is inserted between the output of a subtractor 18 and a digital filter 20, while the subtract circuit 84 is inserted between the output of the subtractor 18 and a frequency error compensator 76. The compensating circuit 83 has a function of compensating for a phase jump over ±M generated due to the phase difference between the outputs of saw-tooth-like wave generators 12, 16. This function can be easily realized by utilizing an overflow if the value M is selected as a 2's power.

While several examples of individually processing signals in each block have been shown in the embodiments of the frequency synthesizers as described above, the present invention is not limited to such embodiments. Alternatively, the frequency synthesizer may be constructed such that part or all of the constituents thereof, i.e., the saw-tooth-like wave generators 12, 16; the subtract circuits 13, 97; the integrator 19; the digital filter 20; the gain controller 78; the phase difference detector 77; the frequency compensator 76; the subtract circuit 84; the compensating circuit 83; the synchronizer 81; the integrating circuit 82; and the control signal generator 80 may be implemented in the form of DSP (digital signal processing unit) which utilizes a common processing unit to perform signal processing of the above constituents.

FIGS. 27 and 28 are block diagrams each showing an embodiment of an initial value setting frequency synthesizer according to the present invention which is capable of setting an initial value.

More specifically, FIG. 27 shows the configuration of an initial value setting frequency synthesizer which has a memory circuit for storing a preceding settling value of the frequency synthesizer such that the stored settling value is used as an initial value when the frequency synthesizer next sets the oscillating frequency. This initial value setting frequency synthesizer comprises a frequency synthesizer 50, as described in the respective embodiments, and a memory circuit 48 for storing a settling result DAC of the frequency synthesizer 50 at an address indicated by a dividing number N, and outputting, as an initial value, an oscillating frequency to be next generated by the frequency synthesizer corresponding to the dividing number N.

Since the contents stored in the memory circuit 48 are values held as initial states which are not related at all to reset or the oscillating frequency of the frequency synthesizer, all possible dividing numbers N to be used are automatically set, and settling results DAC of the frequency synthesizer 50 are written for the respective dividing numbers N at power-on or when a long time has elapsed. While slow variations such as that of temperature exist in the relationship between the frequency control signal for the VCO and the oscillating frequency, such fluctuations proceed relatively slowly, i.e., over several hours, so that if the contents of the memory circuit 48 are once defined, a stored value can be used as an initial value to be in the frequency synthesizer at the next time. The above initial value is supplied to an Init terminal of the frequency synthesizer 50.

FIG. 28 shows an embodiment which employs a processing unit for processing the relationship between the frequency control signal for the VCO and the oscillating frequency as a function. The second initial value setting frequency synthesizer comprises a frequency synthesizer identical to that of each embodiment; a memory circuit 48 for storing a signal DAC indicative of settling results of the frequency synthesizer at an address indicated by a dividing number N; and a processing unit 49 for calculating an initial value for the next oscillating frequency of the frequency synthesizer based on the dividing number N and the output of the memory circuit 48.

When the oscillating frequency exhibits a good linearity for the frequency control signal for the VCO, the relationship between the frequency control signal for the VCO and the oscillating frequency may be approximated by a first-order function. Thus, from settling values of the frequency synthesizer 50 for at least two dividing numbers stored in the memory circuit 48, two parameters (gradient and offset value) can be calculated for the function of the oscillating frequency to the frequency control signal for the VCO. The output of the processing unit 49 after performing the calculation is set at an input terminal Init of the frequency synthesizer 50 as an initial value at the next time.

Here, the approximate function of the oscillating frequency to the frequency control signal for the VCO is not necessarily limited to a first-order function. Alternatively, a higher-order approximation, i.e., second-order or more or a calculating method using a correlation value of the oscillating frequency to the dividing number N may also be employed in accordance with whether the oscillating frequency presents good or bad linearity to the frequency control signal for the VCO.

In the other embodiments, part or all of the circuits constituting the frequency synthesizer of the present invention may be implemented in a semiconductor integrated circuit.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

We claim:

1. A frequency synthesizer comprising:
   an oscillator having its oscillating frequency controlled by a voltage or a current;
   first differential phase generating means for outputting a value corresponding to a differential phase of a reference signal at a predetermined frequency as a first differential phase;
   second differential phase generating means for extracting phase information from an oscillating signal corresponding to an output of said oscillator and for outputting the phase information as a second differential phase;
   comparing means for calculating the difference between said first and second differential phases;
   signal processing means for integrating an output of said comparing means; and
   means for converting an output of said signal processing means to a voltage or a current to control said oscillator.

2. A frequency synthesizer according to claim 1, wherein said second differential phase generating means includes:
   means for sampling said oscillating signal K times per period of a repeating frequency $f_r$ ($f_r$ is an arbitrary frequency) to repetitively generate phase information of said oscillating signal in the form of saw-tooth-like wave; and
   means for calculating the difference in phase information between adjacent ones of said sampled oscillating signal and for outputting the difference as said second differential phase.

3. A frequency synthesizer according to claim 1, wherein said first differential phase generating means includes:
   reference signal generating means for generating the reference signal at a predetermined frequency; and
   means for extracting phase information from said reference signal and for outputting the phase information as a first differential phase.

4. A frequency synthesizer according to claim 3, wherein said first differential phase generating means further includes:
   means for sampling said reference signal K times per period of a repeating frequency $f_r$ ($f_r$ is an arbitrary frequency) to repetitively generate phase information of said reference signal in the form of saw-tooth-like wave; and
   means for calculating the difference in phase information between adjacent ones of said sampled reference signal and for outputting this difference as said second differential phase.

5. A frequency synthesizer according to claim 4, wherein said second differential phase generating means includes:
   means for sampling said oscillating signal K times per period of said repeating frequency $f_r$ to repetitively generate phase information of said oscillating signal in the form of saw-tooth-like wave; and
   means for calculating the difference in phase information between adjacent ones of said sampled oscillating signal and for outputting this difference as said second differential phase.

6. A frequency synthesizer according to claim 2, wherein said second differential phase generating means further includes:
   frequency dividing means for dividing the output of said oscillator by a dividing number N;
   means for sampling an output signal from said frequency dividing means at every period of a frequency $f_r 2$ (=$K \cdot f_r 1$) to derive a differential phase, wherein the value $f_r 1$ satisfies $f_v = N \cdot f_r 1$ where $f_v$ represents an oscillating frequency of said oscillator; and K and N are natural numbers; and
   means for multiplying said derived differential phase by K and for outputting the product as said second differential phase, and
   wherein said first differential phase generating means includes means for setting N at an input of said comparing means as a first differential phase value.

7. A frequency synthesizer according to claim 2, wherein said second differential phase generating means further includes:
   a prescaler type variable divider comprising a prescaler with a dividing number C and a modulo $N_d$ counter for further dividing an output of said prescaler by a variable dividing number $N_d$ ($N_d$ is a natural number) for dividing the output of said oscillator by a total dividing number N equal to $C \cdot N_d$;
   means for accumulating and dividing number C for one period of a frequency $f_r 2$ equal to $K \cdot f_r 1$ with an output signal of said prescaler type variable frequency used as a clock,
   wherein the value $f_r 1$ satisfies $f_v = N \cdot f_r 1$ where $f_v$ represents an oscillating frequency of said oscillator; and K and N are natural numbers; and
   means for multiplying said accumulated value by K and for outputting the product as said second differential phase; and
   wherein said first differential phase generating means includes means for setting N at an input of said comparing means as a first differential phase value.

8. A frequency synthesizer according to claim 2, wherein said second differential phase generating means further includes:
   a pulse swallow type variable divider comprising a 2-modules prescaler having a dividing number P1 equal to CP (P is a natural number) and a dividing number P2 equal to C(P+1);
   a main counter with a variable dividing number M; and
   a swallow counter with a variable dividing number S, for dividing the output of said oscillator by a total dividing number N equal to $P2 \cdot S + P1 \cdot (M-S) = C(PM+S) = C \cdot N_d$, where $N_d = (PM+S)$;

means for accumulating said dividing number P1 or P2 in accordance with a dividing number selecting signal fed back from said swallow counter to said 2-modules prescaler for one period of said frequency $f_r2 = K \cdot f_r1$, with an output signal of said 2-modules prescaler used as a clock, where the value $f_r1$ satisfies $f_v = N \cdot f_r1$ where $f_v$ represents an oscillating frequency of said oscillator, wherein K and N are natural numbers; and means for multiplying said accumulated value by K and for outputting the product as said second differential phase; and wherein said first differential phase generating means includes means for setting N at an input of said comparing means as a first differential phase value.

9. A frequency synthesizer according to claim 2, wherein said second differential phase generating means further includes means for outputting a predetermined value Ns as a value corresponding to phase information of said oscillating signal.

10. A frequency synthesizer according to claim 9, wherein said second differential phase generating means further comprises:

a prescaler for dividing the output of said oscillator by a dividing number C;

means for accumulating a variable step number Ns with a signal divided by said prescaler used as a clock, and for sampling said variable step number Ns every period of a frequency $f_r2$ equal to $K \cdot f_r1$ to derive a differential phase, wherein the value $f_r1$ satisfies $f_v = N \cdot f_r1$, where $f_v$ represents an oscillating frequency of said oscillator, K and N are natural numbers, and Ns is expressed by $Ns = C \cdot N \cdot f_r1/f_v$; and means for multiplying said derived differential phase by K and for outputting the product as said second differential phase; and wherein said first differential phase generating means includes means for setting Ns at an input of said comparing means as a first differential phase value.

11. A frequency synthesizer according to claim 9, wherein said second differential phase generating means further includes:

means for accumulating a dividing number Ns for one period of a frequency $f_r2$ equal to $K \cdot f_r1$ with the output of said oscillator used as a clock, wherein the value $f_r1$ satisfies $f_v = N \cdot f_r1$ where, $f_v$ represents an oscillating frequency of said oscillator, K and N are natural numbers, and $N_S$ is expressed by $N_S = N \cdot f_r1/f_v$; and means for multiplying said derived differential phase by K and for outputting the product as said second differential phase; and wherein said first differential phase generating means includes means for setting Ns at an input of said comparing means as a first differential phase value.

12. A frequency synthesizer according to claim 1, wherein said signal processing means includes means for filtering an integrated value.

13. a frequency synthesizer according to claim 1, wherein said signal processing means includes means for adding a predetermined value to an integrated value.

14. A frequency synthesizer comprising:

an oscillator having its oscillating frequency controlled by a voltage or a current;

first differential phase generating means for outputting a value corresponding to a differential phase of a reference signal at a predetermined frequency as a first differential phase;

second differential phase generating means for extracting phase information from an oscillating signal corresponding to an output of said oscillator and for outputting the phase information as a second differential phase;

comparing means for calculating the difference between said first and second differential phases;

signal processing means for integrating an output of said comparing means;

means for converting an output of said signal processing means to a voltage or a current to control said oscillator;

control signal generating means for detecting changes in a dividing number N; and phase difference detecting means for detecting a phase difference between an output of said first differential phase generating means and an output of said second differential phase generating means on the basis of an output of said control signal generating means, and for compensating for an initial value previously given as a control value for said voltage controlled oscillator on the basis of said phase difference.

15. A frequency synthesizer comprising:

an oscillator having its oscillating frequency controlled by a voltage or a current;

first differential phase generating means for outputting a value corresponding to a differential phase of a reference signal at a predetermined frequency as a first differential phase;

second differential phase generating means for extracting phase information from an oscillating signal corresponding to an output of said oscillator and for outputting the phase information as a second differential phase;

comparing means for calculating the difference between said first and second differential phases;

signal processing means for integrating an output of said comparing means;

means for converting an output of said signal processing means to a voltage or a current to control said oscillator; and gain control means for changing a closed loop gain of said frequency synthesizer corresponding to an externally inputted gain control signal.

16. A frequency synthesizer comprising:

an oscillator having its oscillating frequency controlled by a voltage or a current;

first differential phase generating means for outputting a value corresponding to a differential phase of a reference signal at a predetermined frequency as a first differential phase;

second differential phase generating means for extracting phase information from an oscillating signal corresponding to an output of said oscillator and for outputting the phase information as a second differential phase;

comparing means for calculating the difference between said first and second differential phases;

signal processing means for integrating an output of said comparing means;

means for converting an output of said signal processing means to control said oscillator; and frequency error compensating means for deriving a changing amount (differential value) of an output signal from said comparing means for a constant period to compensate for a control signal for said oscillator on the basis of said changing amount.

17. A frequency synthesizer comprising:

an oscillator having its oscillating frequency controlled by a voltage or a current;

first differential phase generating means for outputting a value corresponding to a differential phase of a reference signal at a predetermined frequency as a first differential phase;

second differential phase generating means for extracting phase information from an oscillating signal corresponding to an output of said oscillator and for outputting the phase information as a second differential phase;

comparing means for calculating the difference between said first and second differential phases;

signal processing means for integrating an output of said comparing means;

means for converting an output of said signal processing means to a voltage or a current to control said oscillator;

control signal generating means for detecting changes in a dividing number N;

phase difference detecting means for detecting a phase difference between an output of said first differential phase generating means and an output of said second differential phase generating means on the basis of an output of said control signal generating means, and for compensating for an initial value previously given as a control value for said voltage controlled oscillator on the basis of said phase difference;

gain control means for changing a closed loop gain of said frequency synthesizer corresponding to an externally inputted gain control signal; and frequency error compensating means for deriving a changing amount (differential value) of the output of said comparing means for a constant period to compensate for a control signal for said oscillator on the basis of said changing amount.

18. A frequency synthesizer comprising:

first saw-tooth-like wave generating means for generating a saw-tooth-like wave based on a reference signal supplied from a reference oscillator;

second saw-tooth-like wave generating means for generating a saw-tooth-like wave based on a previously specified dividing number N and an output of a voltage controlled oscillator;

means for calculating the difference between outputs of said first saw-tooth-like wave generating means and outputs of said second saw-tooth-like wave generating means and for outputting a difference signal;

means for performing signal processing for said difference signal to output said processed difference signal as an oscillation control signal for said voltage controlled oscillator;

control signal generating means for detecting changes in said dividing number N; and phase difference detecting means for detecting a phase difference between the output of said first saw-tooth-like wave generating means and the output of said second saw-tooth-like wave generating means on the basis of an output of said control signal generating means and for compensating for an initial value previously given as a control value for an oscillating frequency of said voltage controlled oscillator on the basis of said phase difference.

19. A frequency synthesizer comprising:

first saw-tooth-like wave generating means for generating a saw-tooth-like wave based on a reference signal supplied from a reference oscillator;

second saw-tooth-like wave generating means for generating a saw-tooth-like wave based on a previously specified dividing number N and an output of a voltage controlled oscillator;

means for calculating the difference between outputs of said first saw-tooth-like wave generating means and outputs of said second saw-tooth-like wave generating means and for outputting a difference signal;

means for performing signal processing for said difference signal to output said processed difference signal as an oscillation control signal for said voltage controlled oscillator; and gain control means for changing a closed loop gain of said frequency synthesizer corresponding to an externally inputted gain control signal.

20. A frequency synthesizer comprising:

first saw-tooth-like wave generating means for generating a saw-tooth-like wave based on a reference signal supplied from a reference oscillator;

second saw-tooth-like wave generating means for generating a saw-tooth-like wave based on a previously specified dividing number N and an output of a voltage controlled oscillator;

means for calculating the difference between outputs of said first saw-tooth-like wave generating means and outputs of said second saw-tooth-like wave generating means and for outputting a difference signal;

means for performing signal processing for said difference signal to output said processed difference signal as an oscillation control signal for said voltage controlled oscillator; and frequency error compensating means for deriving a changing amount (differential value) of said difference signal for a constant period to compensate for said oscillation control signal on the basis of said changing amount.

21. A frequency synthesizer comprising:

first saw-tooth-like wave generating means for generating a saw-tooth-like wave based on a reference signal supplied from a reference oscillator;

second saw-tooth-like wave generating means for generating a saw-tooth-like wave based on a previously specified dividing number N and an output of a voltage controlled oscillator;

means for calculating the difference between outputs of said first saw-tooth-like wave generating means and outputs of said second saw-tooth-like wave generating means and for outputting a difference signal;

means for performing signal processing for said difference signal to output said processed difference signal as an oscillation control signal for said voltage controlled oscillator;

control signal generating means for detecting changes in said dividing number N;

phase difference detecting means for detecting a phase difference between the output of said first saw-tooth-like wave generating means and the output of said second saw-tooth-like wave generating means on the basis of an output of said control signal generating means and for compensating for an initial value previously given as a control value for an oscillating frequency of said voltage controlled oscillator on the basis of said phase difference;

gain control means for changing a closed loop gain of said frequency synthesizer corresponding to an externally inputted gain control signal; and frequency error compensating means for deriving a changing amount (differential value) of said difference signal for a constant period to compensate for said oscillation control signal on the basis of said changing amount.

22. A frequency synthesizer according to claim 18, wherein said means for outputting a difference signal includes:

a first subtract circuit for calculating the difference at different time intervals of the outputs of said first saw-tooth-like wave generating means;

a second subtract circuit for calculating the difference at different time intervals of the outputs of said second saw-tooth-like wave generating means; and subtract means for calculating the difference between an output of said first subtract circuit and an output of said second subtract circuit.

23. A frequency synthesizer according to claim 19, wherein said means for outputting a difference signal includes:

a first subtract circuit for calculating the difference of different time intervals of the outputs of said first saw-tooth-like wave generating means;

a second subtract circuit for calculating the difference at different time intervals of the outputs of said second saw-tooth-like wave generating means; and subtract means for calculating the difference between an output of said first subtract circuit and an output of said second subtract circuit.

24. A frequency synthesizer according to claim 20, wherein said means for outputting a difference signal includes:

a first subtract circuit for calculating the difference at different time intervals of the outputs of said first saw-tooth-like-wave generating means;

a second subtract circuit for calculating the difference at different time intervals of the outputs of said second saw-tooth-like wave generating means; and subtract means for calculating the difference between an output of said first subtract circuit and an output of said second subtract circuit.

25. A frequency synthesizer according to claim 21, wherein said means for outputting a difference signal includes:

a first subtract circuit for calculating the difference at different time intervals of the outputs of said first saw-tooth-like wave generating means;

a second subtract circuit for calculating the difference at different time intervals of the outputs of said second saw-tooth-like wave generating means; and subtract means for calculating the difference between an output of said first subtract circuit and an output of said second subtract circuit.

26. A frequency synthesizer according to any one of claims 22 to 25, wherein said subtract means includes:

synchronizing means for converting the output of said second subtract circuit to a signal synchronized to said reference signal; and means for calculating the difference between an output of said synchronizing means and the output of said first saw-tooth-like wave generating means.

27. A frequency synthesizer according to any one of claims 18 to 25, wherein said second saw-tooth-like wave generating means includes:

a prescaler having one or a plurality of dividing numbers; and means for controlling an increase ratio of the output of said second saw-tooth-like wave generating means to a value corresponding to a dividing number of said prescaler selected on the basis of a control signal for controlling the dividing number of said prescaler.

28. A frequency synthesizer according to any one of claims 18 to 25, wherein said second saw-tooth-like wave generating means includes:

a prescaler having a dividing number P; and means for setting an increase ratio of the output of said second saw-tooth-like wave generating means to a value B expressed by the following equation:

$$B = (M \times P)/(N \times f1 \times T)$$

wherein M represents a peak value of the output of the second saw-tooth-wave generating means, f1 the frequency of said reference signal, and T a period.

29. A frequency synthesizer according to claim 18 or 22, wherein said means for detecting a phase difference includes:

means for fixing a control value for said voltage controlled oscillator to said initial value for at least a duration equal to or more than one period of the output of said first saw-tooth-like wave generating means, and for detecting said phase difference during the duration;

compensating value storing means for holding said initial value which has been compensated for based on said phase difference; and adding means for adding said oscillation control signal to a difference value between the output of said first saw-tooth-like wave generating means and the output of said second saw-tooth-like wave generating means after said duration for which said control value is fixed to said initial value, and for outputting the addition value as said oscillation control signal for said voltage controlled oscillator.

30. A frequency synthesizer according to claim 19 or 23, wherein said gain control means includes:

a gain controller for specifying said closed loop gain;

a first multiplier for multiplying an output of said gain controller by a difference value between the output of said first saw-tooth-like wave generating means and the output of said second saw-tooth-wave generating means;

a second multiplier for multiplying an output of said first multiplier by a constant $\beta = (1-\alpha)$, where $\alpha$ represents a changing width of said closed loop gain which changes corresponding to said gain control signal;

an adder for adding an output of said second multiplier and a compensating value for an initial value which has been previously given as a control value for said voltage controlled oscillator; and a compensating value storing circuit for holding an output of said adder.

31. A frequency synthesizer according to claim 20 or 24, wherein said frequency error compensating means includes:

means for varying a weight of a compensating ratio in accordance with said changing amount; and a multiplier for multiplying said changing amount by a set weight amount.

32. A frequency synthesizer according to claim 21 or 25, wherein said means for detecting a phase difference includes:

means for fixing a control value for said voltage controlled oscillator to said initial value for at least a duration equal to or more than one period of the output of said first saw-tooth-like wave generating means, and for detecting said phase difference during the duration;

compensating value storing means for holding said initial value which has been compensated for based on said phase difference; and adding means for adding said oscillation control signal to a difference value between the output of said first saw-tooth-like wave generating means and the output of said second saw-tooth-like wave generating means after said duration for which said control value is fixed to said initial value, and for outputting the addition value as said oscillation control signal for said voltage controlled oscillator, wherein said gain control means includes:

a gain controller for specifying said closed loop gain, a first multiplier for multiplying an output of said gain controller by a difference value between the output of said first saw-tooth-like wave generating means and the output of said second saw-tooth-wave generating means, a second multiplier for multiplying an output of said first multiplier by a constant $\beta=(1-\alpha)$, where $\alpha$ represents a changing width of said closed loop gain which changes corresponding to said gain control signal, and an adder for adding an output of said second multiplier and an output of said compensating value storing means; and wherein said frequency error compensating means includes:

means for varying a weight of a compensating ratio in accordance with said changing amount, and a multiplier for multiplying said changing amount by a set weight amount.

33. A frequency synthesizer according to claim 18, further comprising a digital signal processing unit (DSP) having a processing unit which is shared for executing part or all of signal processing of said first saw-tooth-like wave generating means; said second saw-tooth-like wave generating means; said means for outputting a difference signal; said means for performing signal processing for said difference signal to output said processed difference signal as an oscillation control signal for said voltage controlled oscillator; said control signal generating means for detecting changes in said dividing number N; and said phase difference detecting means.

34. A frequency synthesizer according to claim 19, further comprising a digital signal processing unit (DSP) having a processing unit which is shared for executing part or all of signal processing of said first saw-tooth-like wave generating means, said second saw-tooth-like wave generating means, said means for outputting a difference signal, said means for performing signal processing for said difference signal to output said processed difference signal as an oscillation control signal for said voltage controlled oscillator, and said gain control means.

35. A frequency synthesizer according to claim 20, further comprising a digital signal processing unit (DSP) having a processing unit which is shared for executing part or all of signal processing of said first saw-tooth-like wave generating means, said second saw-tooth-like wave generating means, said means for outputting a difference signal, said performing signal processing for said difference signal to output said processing difference signal as an oscillation control signal for said voltage controlled oscillator, and said frequency error compensating means.

36. A frequency synthesizer according to claim 21, further comprising a digital signal processing unit (DSP) having a processing unit which is shared for executing part or all of signal processing of said first saw-tooth-like wave generating means, said second saw-tooth-like wave generating means, said means for outputting a difference signal, said means for performing signal processing for said difference signal to output said processed difference signal as an oscillation control signal for said voltage controlled oscillator; said control signal generating means for detecting changes in said dividing number N, said phase difference detecting means, said gain control means, and said frequency error compensating means.

37. A frequency synthesizer according to claim 22, further comprising a digital signal processing unit (DSP) having a processing unit which is shared for executing part or all of signal processing of said first saw-tooth-like wave generating means, said second saw-tooth-like wave generating means, said means for outputting a difference signal, said means for performing signal processing for said difference signal to output said processing difference signal as an oscillation control signal for said voltage controlled oscillator, said control signal generating means for detecting changes in said dividing number N, said phase difference detecting means, said first subtract circuit, said second subtract circuit, and said means for calculating the difference between inputs of said first and second subtract means.

38. A frequency synthesizer according to claim 23, further comprising a digital signal processing unit (DSP) having a processing unit which is shared for executing part or all of signal processing of said first saw-tooth-like wave generating means, said second saw-tooth-like wave generating means, said means for outputting a difference signal, said means for performing signal processing for said difference signal to output said processed difference signal as an oscillation control signal for said voltage controlled oscillator, said gain control means, said first subtract circuit, said second subtract circuit, and said means for calculating the difference between inputs of said first and second subtract means.

39. A frequency synthesizer according to claim 24, further comprising a digital signal processing unit (DSP) having a processing unit which is shared for executing part or all of signal processing of said first saw-tooth-like wave generating means, said second saw-tooth-like wave generating means, said means for outputting a difference signal, said means for performing signal processing for said difference signal to output said processed difference signal as an oscillation control signal for said voltage controlled oscillator, said frequency error compensating means, said first subtract circuit, said second subtract circuit, and said means for calculating the difference between inputs of said first and second subtract means.

40. A frequency synthesizer according to claim 25, further comprising a digital signal processing unit (DSP) having a processing unit which is shared for executing part or all of signal processing of said first saw-tooth-like wave generating means, said second saw-tooth-like wave generating means, said means for outputting a difference signal, said means for performing signal processing for said difference signal to output said processed difference signal as an oscillation control signal for said voltage controlled oscillator, said control signal generating means for detecting changes in said dividing number N, said phase difference detecting means, said gain control means, said frequency error compensating means, said first subtract circuit, said second subtract circuit, and said means for calculating the difference between inputs of said first and second subtract means.

41. A frequency synthesizer according to any one of claims 18 to 25, further comprising:
  a memory circuit for storing an input value to a D/A convertor for generating a frequency control signal for said voltage controlled oscillator corresponding to an oscillating frequency of said frequency synthesizer or the dividing number N; and
  means, operable when said frequency synthesizer is to set the same oscillating frequency at a next timing for reading a value relevant thereto from said memory circuit and setting the read value as an initial value for said frequency synthesizer.

42. A frequency synthesizer according to any one of claims 18 to 25, further comprising:
  processing means for deriving a relational equation between the value of the frequency control signal for said voltage controlled oscillator and the oscillating frequency;
  a memory circuit for storing an input value to a D/A convertor for generating the frequency control signal for said voltage controlled oscillator corresponding to the oscillating frequency of said frequency synthesizer or the dividing number N;
  a compensating circuit for compensating for coefficients in said relational equation based on a value in said memory circuit; and
  means, operable when said frequency synthesizer is to set a next oscillating frequency, for outputting a value relevant thereto from said memory circuit as an initial value for said frequency synthesizer.

43. A frequency synthesizer comprising:
  first saw-tooth-like wave generating means for generating a saw-tooth-like wave based on a reference signal supplied from a reference oscillator;
  second saw-tooth-like wave generating means for generating a saw-tooth-wave based on a previously specified dividing number N and an output of a voltage controlled oscillator;
  means for calculating the difference between an output of said first-saw-tooth-like wave generating means and an output of said second saw-tooth-like wave generating means to output a difference signal;
  bit number reducing means for converting a data word length of an input signal to a shorter data word length, said bit number reducing means comprising:
  a first quantizer for quantizing said difference signal;
  a first subtractor for calculating the difference between an output of said first quantizer and an input signal for said first quantizer;
  a noise shaping circuit receiving an output of said first subtractor as an input;
  a delay circuit for delaying the output of said first quantizer;
  an adder circuit for adding an output of said delay circuit and an output of said noise shaping circuit;
  a D/A convertor for converting an output of said adder circuit to an analog signal; and
  filter means for filtering an output of said D/A convertor to supply the filtered output to said voltage controlled oscillator as an input signal.

44. A frequency synthesizer according to claim 43, further comprising:
  control signal generating means for detecting changes in said dividing number N; and
  phase difference detecting means for detecting a phase difference between the output of said first saw-tooth-like wave generating means and the output of said second saw-tooth-like wave generating means on the basis of an output of said control signal generating means and for compensating for an initial value previously given as a control value for an oscillating frequency of said voltage controlled oscillator on the basis of said phase difference.

45. A frequency synthesizer according to claim 43, further comprising gain control means for changing a closed loop gain of said frequency synthesizer corresponding to an externally inputted gain control signal.

46. A frequency synthesizer according to claim 43, further comprising frequency error compensating means for deriving an changing amount (differential value) of said difference signal for a constant period to compensate for said oscillation control signal based on said changing amount.

47. A frequency synthesizer according to claim 43, further comprising:
  control signal generating means for detecting changes in said dividing number N;
  phase difference detecting means for detecting a phase difference between the output of said first saw-tooth-like wave generating means and the output of said second saw-tooth-like wave generating means on the basis of an output of said control signal generating means and compensating for an initial value previously given as a control value for an oscillating frequency of said voltage controlled oscillator on the basis of said phase difference;
  gain control means for changing a closed loop gain of said frequency synthesizer corresponding to an externally inputted gain control signal; and
  frequency error compensating means for deriving an changing amount (differential value) of said difference signal for a constant period to compensate for said oscillation control signal based on said changing amount.

48. A frequency synthesizer according to any one of claims 43 to 47, wherein said means for outputting a difference signal includes:
- a first subtracting circuit for calculating the difference in outputs of said first saw-tooth-like wave generating means;
- a second subtracting circuit for calculating the difference in outputs of said second saw-tooth-like wave generating means; and
- subtracting means for calculating the difference between an output of said first subtract circuit and an output of said second subtract circuit.

49. A frequency synthesizer according to claim 48, wherein said subtracting means includes:
- synchronizing means for converting an output of said second subtract circuit to a signal synchronized to said reference signal; and
- means for calculating the difference between an output of said synchronizing means and the output of said first saw-tooth-wave generating means.

50. A frequency synthesizer comprising:
- an oscillator having its oscillating frequency controlled by a voltage or a current;
- first differential phase generating means for outputting a value corresponding to a differential phase of a reference signal at a predetermined frequency as a first differential phase;
- second differential phase generating means for extracting phase information from an oscillating signal corresponding to an output of said oscillator and for deriving a second differential phase;
- comparing means for calculating the difference between said first and second differential phases;
- signal processing means for integrating an output of said comparing means;
- a first quantizer for quantizing an output signal of said signal processing means;
- a first subtractor for calculating the difference between an output of said first quantizer and the output signal of said signal processing means;
- a noise shaping circuit receiving an output of said first subtractor as an input;
- a delay circuit for delaying the output of said first quantizer;
- an adder circuit for adding an output of said delay circuit and an output of said noise shaping circuit;
- a D/A convertor for converting an output of said adder circuit to an analog signal; and
- filter means for filtering an output of said D/A convertor to supply the filtered output to said voltage controlled oscillator as an input signal.

51. A frequency synthesizer according to claim 50, wherein said second differential phase generating means includes:
- means for sampling said oscillating signal K times per period of a repeating frequency $f_r$ ($f_r$ is an arbitrary frequency) to repetitively generate phase information of said oscillating signal in the form of saw-tooth-like wave; and
- means for calculating the difference in phase information between adjacent ones of said sampled oscillating signal and for outputting this difference as said second differential phase.

52. A frequency synthesizer according to claim 43, further comprising a digital signal processing unit (DSP) having a processing unit which is shared for executing part or all of signal processing said first saw-tooth-like wave generating means, said second saw-tooth-like wave generating means, said means for outputting a difference signal, said first quantizer; said first subtractor, said noise shaping circuit; said delay circuit, said adder circuit, and said filter means.

53. A frequency synthesizer according to claim 50, further comprising a digital signal processing unit (DSP) having a processing unit which is shared for executing part or all of signal processing of said first differential phase generating means, said second differential phase generating means, said comparing means, said signal processing means, said first quantizer; and first subtractor, said noise shaping circuit, said delay circuit, said adder circuit; and said filter means.

54. A frequency synthesizer according to any one of claims 43 to 47, further comprising:
- a memory circuit for storing an input value to said first quantizer, upon settling of said voltage controlled oscillator, at an address corresponding to said dividing number; and
- means, operable when the oscillating frequency of said voltage controlled oscillator is newly set, for reading a stored value from said memory circuit and for setting the read value as an initial value for the oscillating frequency of said voltage controlled oscillator.

55. A frequency synthesizer according to claim 48, further comprising:
- a memory circuit for storing an input value to said first quantizer, upon settling of said voltage controlled oscillator, at an address corresponding to said dividing number; and
- means, operable when the oscillating frequency of said voltage controlled oscillator is newly set, for reading a stored value from said memory circuit and for setting the read value as an initial value for the oscillating frequency of said voltage controlled oscillator.

56. A frequency synthesizer according to claim 50, further comprising:
- a memory circuit for storing an input value to said first quantizer, upon settling of said voltage controlled oscillator, at an address corresponding to said dividing number; and
- means, operable when the oscillating frequency of said voltage controlled oscillator is newly set, for reading a stored value from said memory circuit and for setting the read value as an initial value for the oscillating frequency of said voltage controlled oscillator.

57. A frequency synthesizer according to any one of claims 43 to 47, further comprising:
- a memory circuit for storing an input value to said first quantizer, upon settling of said voltage controlled oscillator, at an address corresponding to said dividing number; and
- processing means for calculating and outputting an initial value for the oscillating frequency of said voltage controlled oscillator based on a newly set dividing number and a value stored in said memory circuit.

58. A frequency synthesizer according to claim 48, further comprising:
- a memory circuit for storing an input value to said first quantizer, upon settling of said voltage controlled oscillator, at an address corresponding to said dividing number; and
- processing means for calculating and outputting an initial value for the oscillating frequency of said voltage controlled oscillator based on a newly set dividing number and a value stored in said memory circuit.

59. A frequency synthesizer according to claim 50, further comprising:
a memory circuit for storing an input value to said first quantizer, upon settling of said voltage controlled oscillator, at an address corresponding to said dividing number; and
processing means for calculating and outputting an initial value for the oscillating frequency of said voltage controlled oscillator based on a newly set dividing number and a value stored in said memory circuit.

60. A frequency synthesizer according to any one of claims 1 to 25, wherein said frequency synthesizer includes a semiconductor integrated circuit.

61. A frequency synthesizer according to claim 26, wherein said frequency synthesizer includes a semiconductor integrated circuit.

62. A frequency synthesizer according to claim 27, wherein said frequency synthesizer includes a semiconductor integrated circuit.

63. A frequency synthesizer according to claim 28, wherein said frequency synthesizer includes a semiconductor integrated circuit.

64. A frequency synthesizer according to claim 29, wherein said frequency synthesizer includes a semiconductor integrated circuit.

65. A frequency synthesizer according to claim 30, wherein said frequency synthesizer includes a semiconductor integrated circuit.

66. A frequency synthesizer according to claim 31, wherein said frequency synthesizer includes a semiconductor integrated circuit.

67. A frequency synthesizer according to claim 32, wherein said frequency synthesizer includes a semiconductor integrated circuit.

68. A frequency synthesizer according to any one of claims 33 to 40, wherein said frequency synthesizer includes a semiconductor integrated circuit.

69. A frequency synthesizer according to claim 41, wherein said frequency synthesizer includes a semiconductor integrated circuit.

70. A frequency synthesizer according to claim 42, wherein said frequency synthesizer includes a semiconductor integrated circuit.

71. A frequency synthesizer according to any one of claims 45 to 49, wherein said frequency synthesizer includes a semiconductor integrated circuit.

72. A frequency synthesizer according to claim 48, wherein said frequency synthesizer includes a semiconductor integrated circuit 73. A frequency synthesizer according to claim 49, wherein said frequency synthesizer includes a semiconductor integrated circuit.

74. A frequency synthesizer according to any one of claims 50 to 53, wherein said frequency synthesizer includes a semiconductor integrated circuit.

75. A frequency synthesizer according to claim 54, wherein said frequency synthesizer includes a semiconductor integrated circuit.

76. A frequency synthesizer according to claim 55 or 58, wherein said frequency synthesizer includes a semiconductor integrated circuit.

77. A frequency synthesizer according to claim 57, wherein said frequency synthesizer includes a semiconductor integrated circuit.

78. A frequency synthesizer according to claim 58 or 61, wherein said frequency synthesizer includes a semiconductor integrated circuit.

79. A communication apparatus comprising:
a frequency synthesizer according to any one of claims 1 to 25;
a transmitter for transmitting information on the basis of an oscillating signal from said frequency synthesizer; and
a receiver for receiving information on the basis of the oscillating signal from said frequency synthesizer.

80. A communication apparatus comprising:
the frequency synthesizer according to claim 26;
a transmitter for transmitting information on the basis of an oscillating signal from said frequency synthesizer; and
a receiver for receiving information on the basis of the oscillating signal from said frequency synthesizer.

81. A communication apparatus comprising:
the frequency synthesizer according to claim 27;
a transmitter for transmitting information on the basis of an oscillating signal from said frequency synthesizer; and
a receiver for receiving information on the basis of the oscillating signal from said frequency synthesizer.

82. A communication apparatus comprising:
the frequency synthesizer according to claim 28;
a transmitter for transmitting information on the basis of an oscillating signal from said frequency synthesizer; and
a receiver for receiving information on the basis of the oscillating signal from said frequency synthesizer.

83. A communication apparatus comprising:
the frequency synthesizer according to claim 29;
a transmitter for transmitting information on the basis of an oscillating signal from said frequency synthesizer; and
a receiver for receiving information on the basis of the oscillating signal from said frequency synthesizer.

84. A communication apparatus comprising:
the frequency synthesizer according to claim 30;
a transmitter for transmitting information on the basis of an oscillating signal from said frequency synthesizer; and
a receiver for receiving information on the basis of the oscillating signal from said frequency synthesizer.

85. A communication apparatus comprising:
the frequency synthesizer according to claim 31;
a transmitter for transmitting information on the basis of an oscillating signal from said frequency synthesizer; and
a receiver for receiving information on the basis of the oscillating signal from said frequency synthesizer.

86. A communication apparatus comprising:
the frequency synthesizer according to claim 32;
a transmitter for transmitting information on the basis of an oscillating signal from said frequency synthesizer; and
a receiver for receiving information on the basis of the oscillating signal from said frequency synthesizer.

87. A communication apparatus comprising:
a frequency synthesizer according to any one of claims 33 to 40;
a transmitter for transmitting information on the basis of an oscillating signal from said frequency synthesizer; and
a receiver for receiving information on the basis of the oscillating signal from said frequency synthesizer.

88. A communication apparatus comprising:
the frequency synthesizer according to claim 41;
a transmitter for transmitting information on the basis of an oscillating signal from said frequency synthesizer; and
a receiver for receiving information on the basis of the oscillating signal from said frequency synthesizer.

89. A communication apparatus comprising:
the frequency synthesizer according to claim 42;
a transmitter for transmitting information on the basis of an oscillating signal from said frequency synthesizer; and
a receiver for receiving information on the basis of the oscillating signal from said frequency synthesizer.

90. A communication apparatus comprising:
a frequency synthesizer according to any one of claims 43 to 47;
a transmitter for transmitting information on the basis of an oscillating signal from said frequency synthesizer; and
a receiver for receiving information on the basis of the oscillating signal from said frequency synthesizer.

91. A communication apparatus comprising:
the frequency synthesizer according to claim 48;
a transmitter for transmitting information on the basis of an oscillating signal from said frequency synthesizer; and
a receiver for receiving information on the basis of the oscillating signal from said frequency synthesizer.

92. A communication apparatus comprising:
the frequency synthesizer according to claim 49;
a transmitter for transmitting information on the basis of an oscillating signal from said frequency synthesizer; and
a receiver for receiving information on the basis of the oscillating signal from said frequency synthesizer.

93. A communication apparatus comprising:
a frequency synthesizer according to any one of claims 50 to 53;
a transmitter for transmitting information on the basis of an oscillating signal from said frequency synthesizer; and
a receiver for receiving information on the basis of the oscillating signal from said frequency synthesizer.

94. A communication apparatus comprising:
the frequency synthesizer according to claim 54;
a transmitter-for transmitting information on the basis of an oscillating signal from said frequency synthesizer; and
a receiver for receiving information on the basis of the oscillating signal from said frequency synthesizer.

95. A communication apparatus comprising:
a frequency synthesizer according to claim 55 or 56;
a transmitter for transmitting information on the basis of an oscillating signal from said frequency synthesizer; and
a receiver for receiving information on the basis of the oscillating signal from said frequency synthesizer.

96. A communication apparatus comprising:
the frequency synthesizer according to claim 57;
a transmitter for transmitting information on the basis of an oscillating signal from said frequency synthesizer; and
a receiver for receiving information on the basis of the oscillating signal from said frequency synthesizer.

97. A communication apparatus comprising:
a frequency synthesizer according to claim 58 or 59;
a transmitter for transmitting information on the basis of an oscillating signal from said frequency synthesizer; and
a receiver for receiving information on the basis of the oscillating signal from said frequency synthesizer.

* * * * *